United States Patent
Huang et al.

(10) Patent No.: US 11,764,220 B2
(45) Date of Patent: Sep. 19, 2023

(54) METHOD OF MANUFACTURING A SEMICONDUCTOR DEVICE BY PATTERNING A SERPENTINE CUT PATTERN

(71) Applicant: Taiwan Semiconductor Manufacturing Co., Ltd., Hsinchu (TW)

(72) Inventors: Yu-Lien Huang, Jhubei (TW); Chuan-Hui Lu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 101 days.

(21) Appl. No.: 17/078,274

(22) Filed: Oct. 23, 2020

(65) Prior Publication Data

US 2021/0335787 A1   Oct. 28, 2021

Related U.S. Application Data

(60) Provisional application No. 63/015,953, filed on Apr. 27, 2020.

(51) Int. Cl.
*H01L 21/8234* (2006.01)
*H01L 29/66* (2006.01)
(Continued)

(52) U.S. Cl.
CPC ...... *H01L 27/0924* (2013.01); *H01L 21/0334* (2013.01); *H01L 21/31144* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 7,667,271 B2   2/2010   Yu et al.
7,910,453 B2   3/2011   Xu et al.
(Continued)

FOREIGN PATENT DOCUMENTS

KR   20180078126 A   7/2018
KR   20190112910 A   10/2019
TW     201926703 A    7/2019

OTHER PUBLICATIONS

Yu et al. "FinFET Scaling to 10nm Gate Length", IEEE (Year: 2002).*

*Primary Examiner* — Younes Boulghassoul
(74) *Attorney, Agent, or Firm* — Slater Matsil, LLP

(57) ABSTRACT

A method includes forming fins extending over a semiconductor substrate; forming a photoresist structure over the fins; patterning a serpentine cut pattern in the photoresist structure to form a cut mask, wherein the serpentine cut pattern extends over the fins, wherein the serpentine cut pattern includes alternating bridge regions and cut regions, wherein each cut region extends in a first direction, wherein each bridge region extends between adjacent cut regions in
(Continued)

a second direction, wherein the second direction is within 30° of being orthogonal to the first direction; and performing an etching process using the cut mask as an etching mask.

20 Claims, 73 Drawing Sheets

(51) Int. Cl.
  *H01L 21/311* (2006.01)
  *H01L 21/033* (2006.01)
  *H01L 21/768* (2006.01)
  *H01L 27/092* (2006.01)
  *H01L 29/06* (2006.01)
  *H01L 29/78* (2006.01)

(52) U.S. Cl.
  CPC .. *H01L 21/76816* (2013.01); *H01L 21/76897* (2013.01); *H01L 21/823431* (2013.01); *H01L 21/823475* (2013.01); *H01L 29/0653* (2013.01); *H01L 29/66795* (2013.01); *H01L 29/7851* (2013.01)

(58) Field of Classification Search
  CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 21/31144; H01L 21/027–0338; H01L 21/308–3088; H01L 21/823475; H01L 21/823871; H01L 21/76802; H01L 21/76804; H01L 21/76816; H01L 21/76877; H01L 21/76897
  See application file for complete search history.

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,881,834 B1* | 1/2018 | Sun ................. H01L 21/31144 |
| 2009/0195282 A1 | 8/2009 | Tatsumi |
| 2014/0001574 A1 | 1/2014 | Chen et al. |
| 2014/0110755 A1 | 4/2014 | Colinge |
| 2014/0151812 A1 | 6/2014 | Liaw |
| 2016/0163532 A1* | 6/2016 | Lu ..................... H01L 21/02186 438/695 |
| 2016/0351575 A1* | 12/2016 | Hung ................. H01L 27/0922 |
| 2016/0372567 A1 | 12/2016 | Tak et al. |
| 2017/0278752 A1* | 9/2017 | Ryckaert ........... H01L 21/76802 |
| 2018/0190504 A1 | 7/2018 | Lee et al. |
| 2019/0164759 A1* | 5/2019 | Huang ............ H01L 21/823431 |
| 2019/0305099 A1 | 10/2019 | Jo et al. |
| 2020/0043795 A1* | 2/2020 | Chang ............... H01L 21/31144 |
| 2020/0105767 A1* | 4/2020 | Huang ............. H01L 29/66795 |
| 2021/0082757 A1* | 3/2021 | Lee ................... H01L 21/76892 |

* cited by examiner

METHOD OF MANUFACTURING A SEMICONDUCTOR DEVICE BY PATTERNING A SERPENTINE CUT PATTERN

PRIORITY CLAIM AND CROSS-REFERENCE

This application claims the benefits of U.S. Provisional Application No. 63/015,953, filed on Apr. 27, 2020, which application is hereby incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
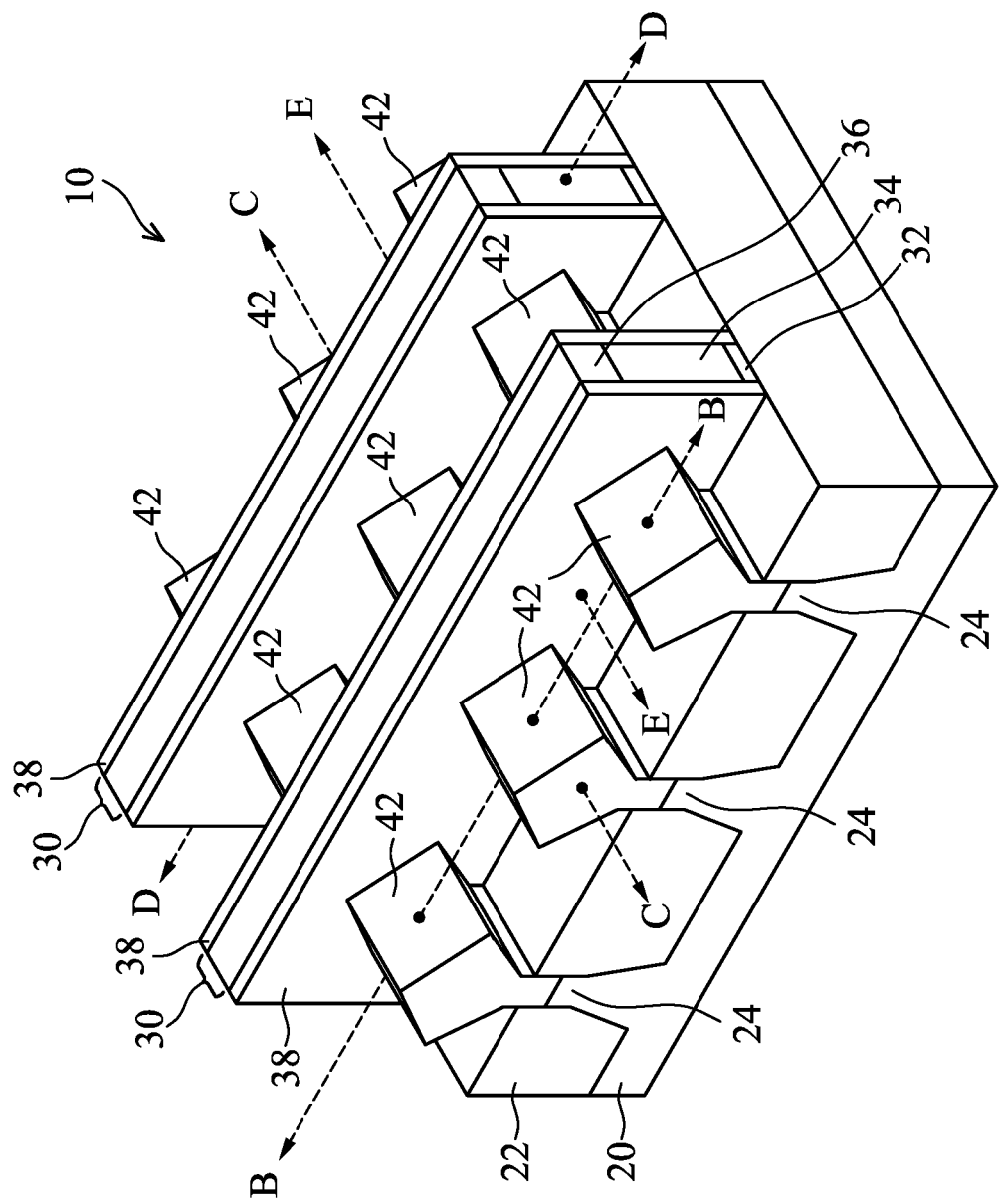
FIGS. 1A, 1B, 2A, 2B, 2C, and 2D illustrate perspective views and cross-sectional views of intermediate stages in the formation of a Fin Field-Effect Transistors (FinFET) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices and methods of forming the same are provided in accordance with various embodiments. In particular, cuts between source/drain contacts of FinFET devices are formed using a serpentine cut mask. The serpentine cut mask includes straight cut sections that are connected by straight bridge sections, with the cut sections and the bridge sections being substantially perpendicular to each other. By having straight sections that are substantially perpendicular, the effects of rounding during photolithographic steps can be reduced, which can reduce the size of the cut regions. Reducing the size of the cut regions in this manner can allow for source/drain contacts of larger size, which can improve conductivity and contact resistance of the source/drain contacts. The use of a serpentine cut mask as described herein can also allow for a larger overlap window during processing, which can allow for a smaller minimum spacing between cut regions without increased risk of bridging or other process defects.

Throughout the various views and illustrative embodiments, like reference numbers are used to designate like elements. In some illustrated embodiments, the formation of Fin Field-Effect Transistors (FinFETs) is used as an example to explain the concept of the present disclosure. The illustrated FinFETs may be electrically coupled in a manner to operate as, for example, one transistor or multiple transistors, such as two or more transistors. Other types of transistors such as planar transistors, Gate-All-Around (GAA) transistors, or the like may also adopt the embodiments of the present disclosure. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order. Some embodiments discussed herein are discussed in the context of FinFETs formed using a gate-last process. In other embodiments, a gate-first process may be used. Also, some embodiments contemplate aspects used in planar devices, such as planar FETs.

FIG. 1A illustrates a three-dimensional view of an intermediate step in the formation of a FinFET structure, in accordance with some embodiments. FIG. 1A further illustrates reference cross-sections that are used in later figures. Cross-section C-C is along a longitudinal axis of a fin 24 and in a direction of, for example, a current flow between the source/drain regions 42 of a FinFET. Cross-section D-D is perpendicular to cross-section C-C and is along a longitudinal axis of a dummy gate stack 30. Cross-section D-D is in a direction, for example, perpendicular to the direction of current flow between the source/drain regions 42 of a FinFET. Cross-section B-B is parallel to cross-section D-D and extends through source/drain regions 42 of a FinFET. Cross-section E-E is parallel to cross-section C-C and is located between adjacent source/drain regions 42 of a FinFET. Subsequent figures refer to these reference cross-sections for clarity. The fins 24, the source/drain regions 42, and the dummy gate stack 30 are described in greater detail below.

The structure illustrated in FIG. 1A includes a wafer 10, which further includes a substrate 20. The substrate 20 may be a semiconductor substrate, such as a bulk semiconductor, a semiconductor-on-insulator (SOI) substrate, or the like, which may be doped (e.g., with a p-type or an n-type dopant) or undoped. The substrate 20 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 20 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In FIG. 1A, fins 24 are shown formed in the substrate 20. The fins 24 are semiconductor strips, and may also be referred to as "semiconductor fins 24," "semiconductor strips 24," or "strips 24." In accordance with some embodiments of the present disclosure, the fins 24 are parts of the original substrate 20, and hence the material of the fins 24 is the same as that of the substrate 20. In some embodiments, the fins 24 are formed by etching the portions of the substrate 20 to form recesses. The etching may be any acceptable etch process, such as a reactive ion etch (RIE), neutral beam etch (NBE), the like, or a combination thereof. The etch may be anisotropic. The fins 24 may be patterned by any suitable method. For example, the fins 24 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 24. In some embodiments, the mask (or other layer) may remain on the fins 24. In some embodiments, the fins 24 may be separated by a width W2 (see FIG. 2D) that is between about 20 nm and about 60 nm, though other widths are possible.

In some embodiments, the fins 24 may be formed by an epitaxial growth process. For example, a dielectric layer can be formed over a top surface of the substrate 20, and trenches can be etched through the dielectric layer to expose the underlying substrate 20. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 24. For example, the fins 24 in FIG. 1A can be recessed, and a material different from the fins 24 may be epitaxially grown over the recessed fins 24. In such embodiments, the fins 24 comprise the recessed material as well as the epitaxially grown material disposed over the recessed material. Accordingly, the fins 24 may be formed of a semiconductor material different from that of the substrate 20. In accordance with some embodiments, the fins 24 are formed of silicon; germanium; a compound semiconductor including silicon phosphide, silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In an even further embodiment, a dielectric layer can be formed over a top surface of the substrate 20, and trenches can be etched through the dielectric layer. Heteroepitaxial structures can then be epitaxially grown in the trenches using a material different from the substrate 20, and the dielectric layer can be recessed such that the heteroepitaxial structures protrude from the dielectric layer to form the fins 24. In some embodiments where homoepitaxial or heteroepitaxial structures are epitaxially grown, the epitaxially grown materials may be in situ doped during growth, which may obviate prior and subsequent implantations although in situ and implantation doping may be used together.

In the above-illustrated embodiments, the fins may be patterned by any suitable method. For example, the fins may be patterned using one or more photolithography processes, including double-patterning or multi-patterning processes.

Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

As shown in FIG. 1A, Shallow Trench Isolation (STI) regions 22 may be formed between the fins 24. The STI regions 22 may comprise a material such as an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other materials formed by any acceptable process may be used. An anneal process may be performed once the material is formed. Although the STI regions 22 are illustrated as a single layer, some embodiments may utilize multiple layers. For example, in some embodiments a liner (not shown) may first be formed along surfaces of the substrate 20 and the fins 24. Thereafter, a fill material, such as those discussed above, may be formed over the liner.

After forming the material of the STI regions 22, a planarization process may be performed to remove material of the STI regions 22 and expose the fins 24. The planarization process may be, for example, a chemical mechanical polish (CMP), an etch-back process, combinations thereof, or the like. The planarization process may expose the fins 24 such that top surfaces of the fins 24 and the STI regions 22 are level after the planarization process is complete. In embodiments in which a mask remains on the fins 24, the planarization process may expose the mask or remove the mask such that top surfaces of the mask or the fins 24, respectively, and the STI regions 22 are level after the planarization process is complete.

The STI regions 22 may be recessed such that top portions of the fins 24 protrude higher than the remaining portions of STI regions 22. The top surfaces of the STI regions 22 may have a flat surface as illustrated, a convex surface, a concave surface (such as dishing), or a combination thereof. The STI regions 22 may be recessed using an acceptable etching process, such as one that is selective to the material of the STI regions 22 (e.g., etches the material of the STI regions 22 at a faster rate than the material of the fins 24). The etching may be performed, for example, using a dry etching process, such as a process in which $NF_3$ and $NH_3$ are used as the etching gases. In accordance with alternative embodiments of the present disclosure, the recessing of the STI regions 22 is performed using a wet etch process. For example, an oxide removal using dilute hydrofluoric (dHF) acid may be used.

Further referring to FIG. 1A, dummy gate stacks 30 are formed on the top surfaces and the sidewalls of the fins 24. Each dummy gate stack 30 may include a dummy gate dielectric 32 and a dummy gate electrode 34 formed over the dummy gate dielectric 32. Each of the dummy gate stacks 30 may also include a mask layer 36 over the dummy gate electrode 34. The mask layer 36 may comprise one or more layers. Dummy gate stacks 30 may cross over a single one or a plurality of the fins 24 and/or STI regions 22. Dummy gate stacks 30 also have lengthwise directions perpendicular to the lengthwise directions of the fins 24.

The dummy gate dielectric 32 may comprise, for example, silicon oxide, silicon nitride, a combination thereof, or the like, and may be deposited or thermally grown according to acceptable techniques. The dummy gate electrode 34 may be deposited over the dummy gate dielectric 32 and then planarized, such as by a CMP. The mask layer 36 may be deposited over the dummy gate electrodes 34. The dummy gate electrode 34 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate electrode 34 may be deposited by physical vapor deposition (PVD), CVD, sputter deposition, or other techniques known and used in the art for depositing the selected material. The dummy gate electrode 34 may be made of other materials that have a high etching selectivity from the etching of isolation regions. The mask layer 36 may include, for example, silicon oxide, silicon nitride, silicon oxynitride, silicon carbonitride, the like, or combinations thereof. It is noted that the dummy gate dielectric 32 is shown covering the fins 24 and the STI regions 22, but in other embodiments, the dummy gate dielectric 32 may deposited such that the dummy gate dielectric 32 does not extend on surfaces of the STI regions 22.

Next, gate spacers 38 are formed on the sidewalls of the dummy gate stacks 30. In some embodiments, a thermal oxidation or a deposition followed by an anisotropic etch may form the gate spacers 38. In accordance with some embodiments of the present disclosure, the gate spacers 38 are formed of a dielectric material such as silicon nitride, silicon oxide, silicon carbonitride, silicon oxynitride, silicon oxycarbonitride, or the like, and may be a single-layer structure or a multi-layer structure including multiple dielectric layers. After the formation of the gate spacers 38, implants for lightly doped source/drain (LDD) regions (not explicitly illustrated) may be performed. In some embodiments, one or more layers of the gate spacers 38 are formed after implantation of the LDD regions.

Still referring to FIG. 1A, epitaxial source/drain regions 42 are formed in the fins 24, in accordance with some embodiments. An etching step (referred to as source/drain recessing hereinafter) may be performed to etch the portions of the fins 24 that are not covered by the dummy gate stack 30 and the gate spacers 38. The recessing may be anisotropic etching process that does not etch the portions of the fins 24 directly underlying the dummy gate stacks 30 and the gate spacers 38. The top surfaces of the recessed fins 24 may be lower than the top surfaces of the STI regions 22, as shown in FIG. 1A. For example, the fins 24 may be etched using a selective etch such as $NF_3$ and $NH_3$, HF and $NH_3$, or the like. In other embodiments, the fins 24 are not recessed prior to formation of the epitaxial source/drain regions 42.

Epitaxial source/drain regions 42 are then formed on the recessed portions of the fins 24, in accordance with some embodiments. The epitaxial source/drain regions 42 may be formed, for example, by selectively growing semiconductor material(s) from the recessed portions of the fins 24, resulting in the structure shown in FIG. 1A. In accordance with some embodiments, the epitaxial source/drain regions 42 include silicon germanium, silicon, silicon carbon, germanium, the like, or combinations thereof. Depending on whether the resulting FinFET is a p-type FinFET or an n-type FinFET, a p-type or an n-type impurity may be in-situ doped during the epitaxial growth process. For example, when the resulting FinFET is a p-type FinFET, silicon germanium, germanium, germanium tin, boron-doped silicon germanium (SiGeB), boron-doped germanium, the like, or combinations thereof may be grown. When the resulting FinFET is an n-type FinFET, silicon phosphide (SiP), silicon carbide (SiC), phosphorous-doped silicon carbide (SiCP), or the like, may be grown. In accordance with alternative embodiments of the present disclosure, epitaxial source/drain regions 42 are formed of a III-V compound semiconductor such as GaAs, InP, GaN, InGaAs, InAlAs, GaSb, AlSb, AlAs, AlP, GaP, combinations thereof, or multi-layers thereof. The epitaxial source/drain regions 42 may also have surfaces raised from respective surfaces of the fins 24 and may have facets. Subsequent figures illustrate structures formed from the structure shown in FIG. 1A, but the embodiments and techniques described herein may be used with the structure shown in FIG. 1A or other structures, embodiments, or devices.

Figure 1B:
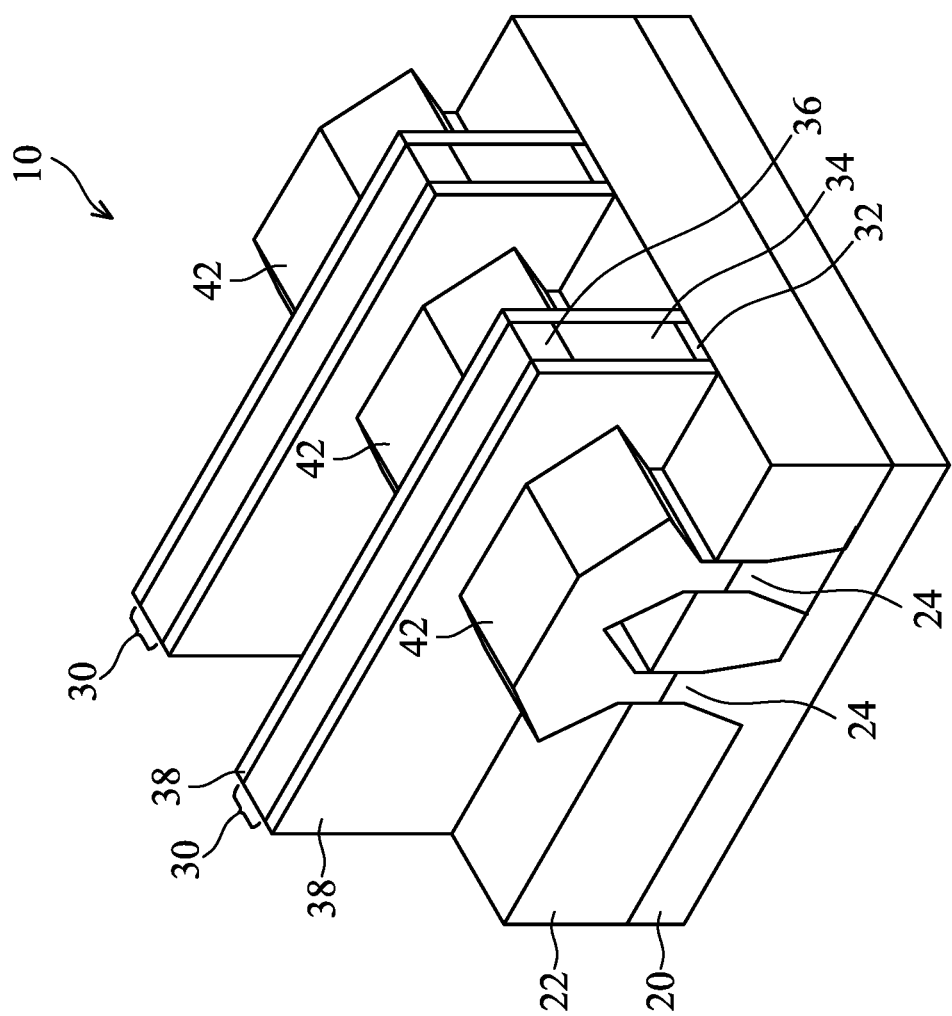

As a result of the epitaxy processes used to form the epitaxial source/drain regions 42, upper surfaces of the epitaxial source/drain regions may have facets which expand laterally outward beyond sidewalls of the fins 24. In some embodiments, these facets cause adjacent source/drain regions 42 of a same FinFET to merge. FIG. 1B illustrates a three dimensional view of a structure similar to that shown in FIG. 1A, except adjacent source/drain regions 42 are merged. In other embodiments, adjacent source/drain regions 42 remain separated after the epitaxy process is completed as illustrated by FIG. 1A. In other embodiments, the fins 24 extend above the STI regions 22 and the gate spacers 38 are formed covering a portion of the sidewalls of fins 24 that extend above the STI regions 22, thereby blocking the epitaxial growth.

Figure 2A:
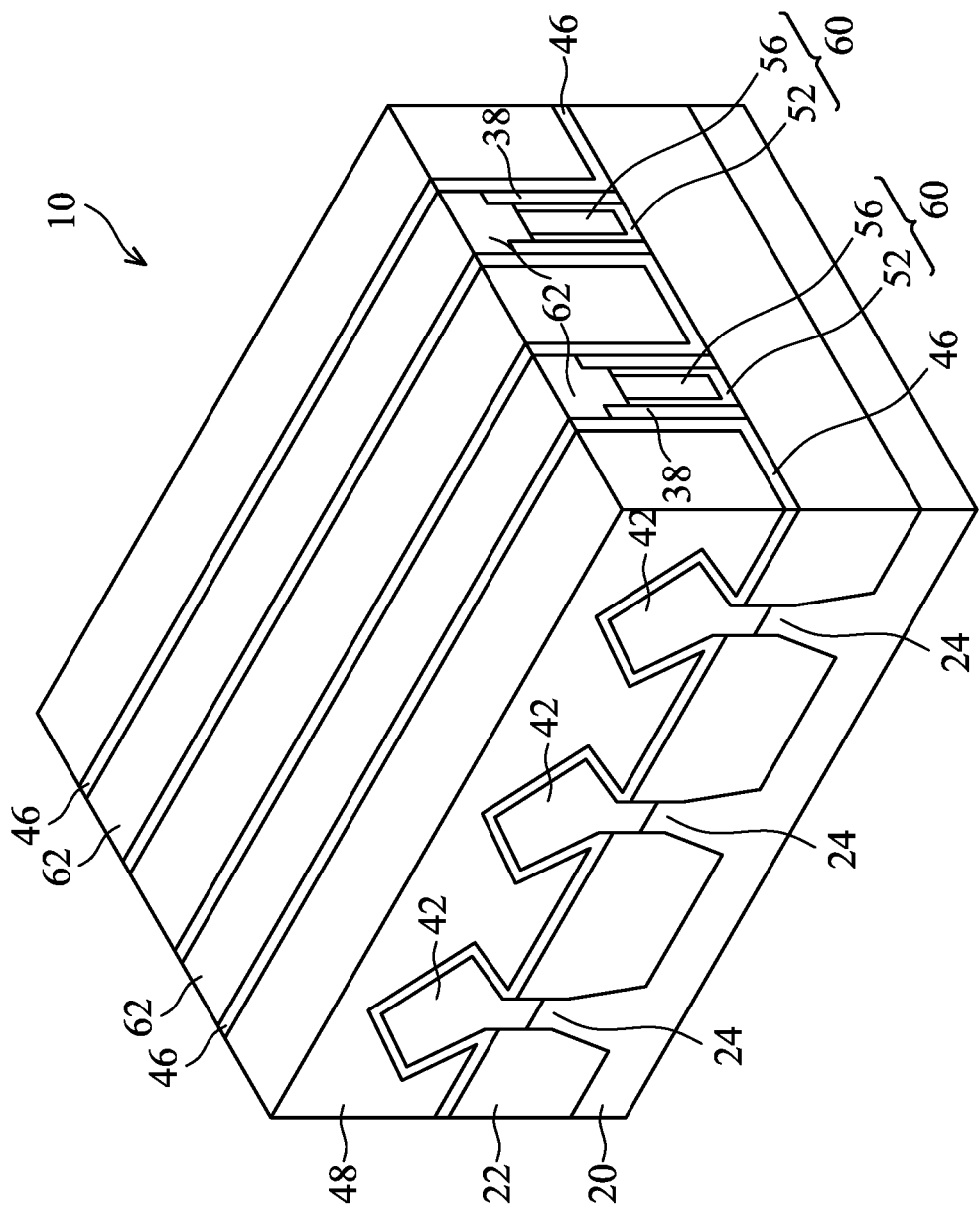
Figure 2B:
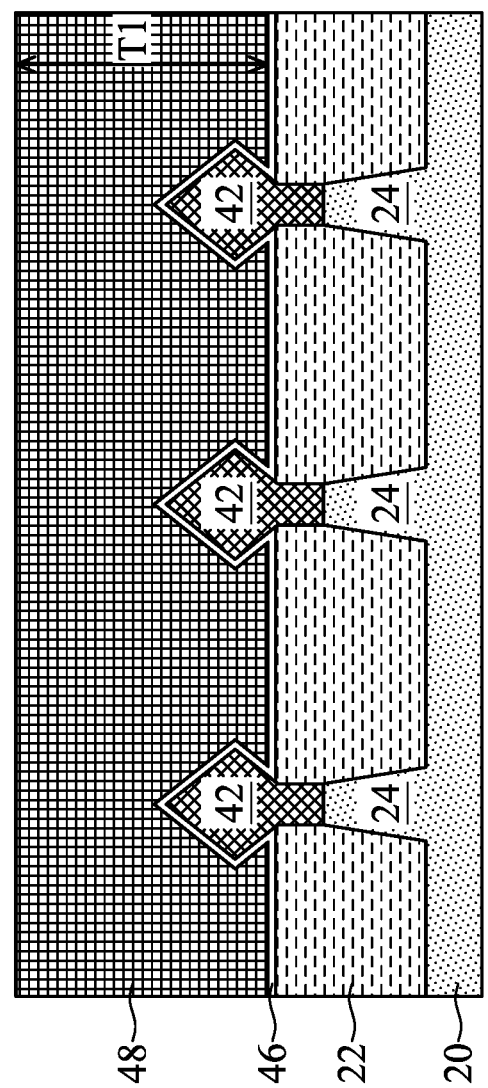
Figure 2C:
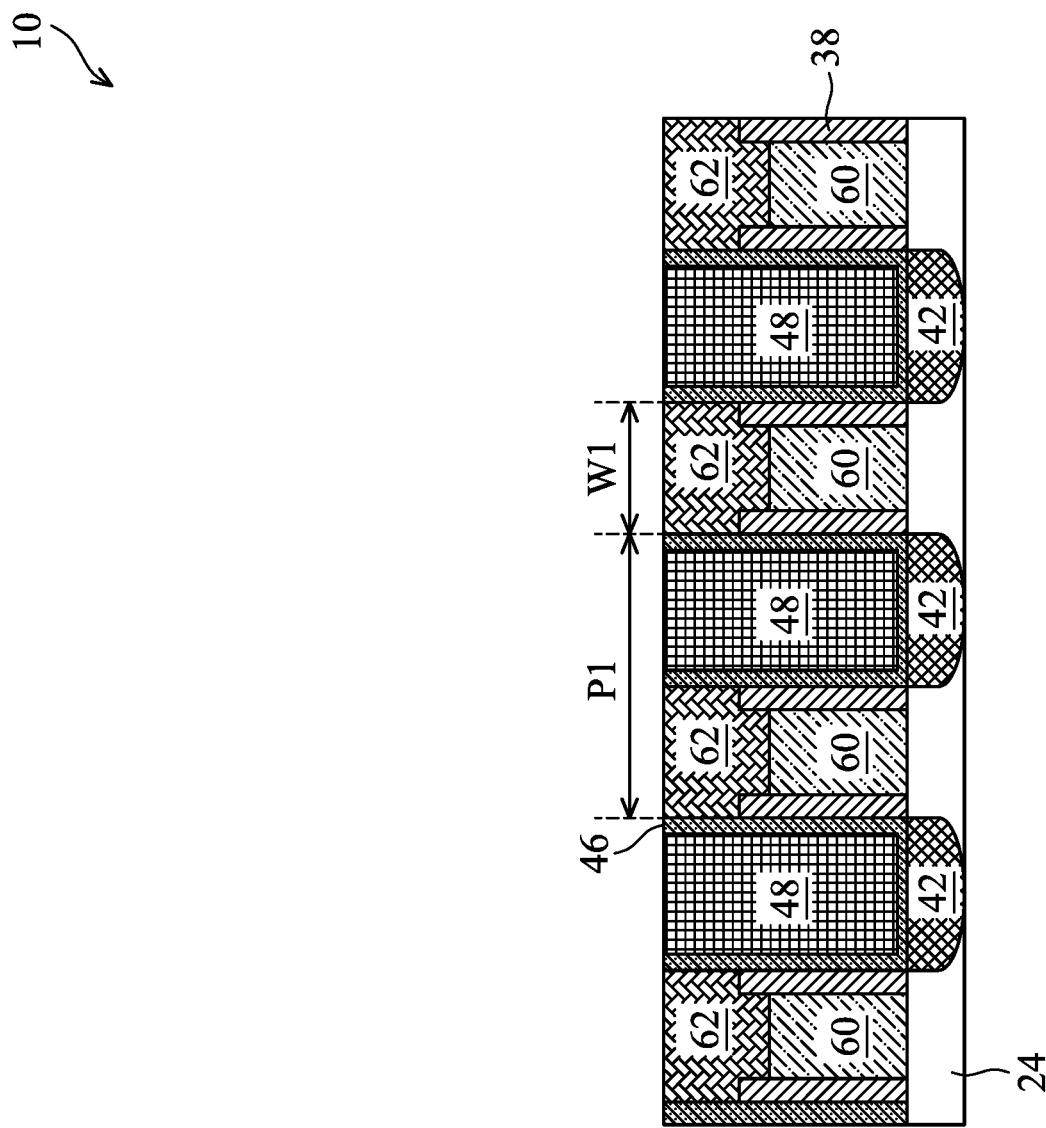
Figure 2D:
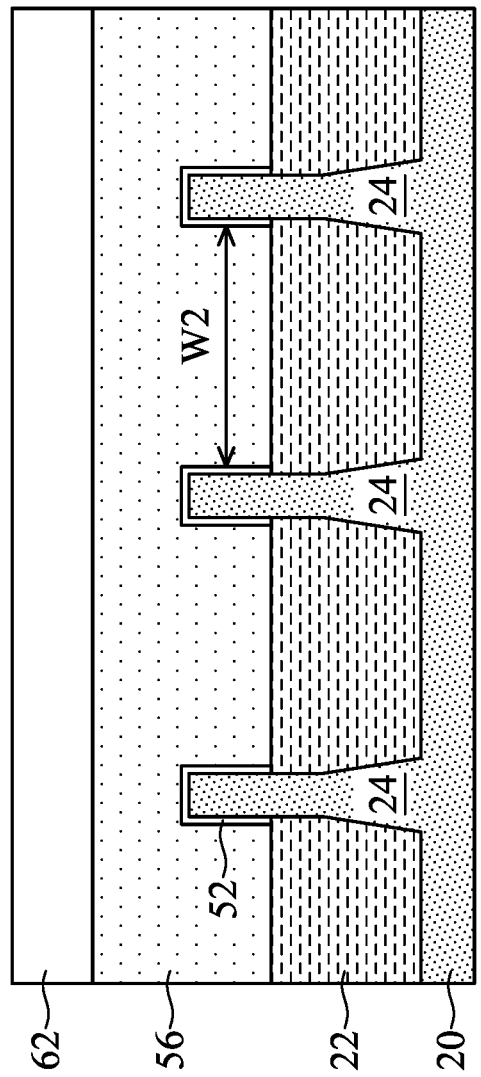

Turning to FIGS. 2A through 2D, a first interlayer dielectric (ILD) 48 is deposited over the structure illustrated in FIG. 1A. FIG. 2B illustrates a cross-section along cross-section B-B as shown in FIG. 1A, FIG. 2C illustrates a cross-section along cross-section C-C, and FIG. 2D illustrates a cross-section along cross-section D-D. The first ILD 48 may be formed of a dielectric material, and may be deposited by any suitable method, such as CVD, plasma-enhanced CVD (PECVD), or flowable CVD (FCVD). Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 46 is disposed between the first ILD 48 and the epitaxial source/drain regions 42 and the gate spacers 38. The CESL 46 may comprise a dielectric material, such as silicon nitride, silicon oxide, silicon oxynitride, silicon carbonitride, a low-k material, or the like, having a different etch rate than the material of the overlying first ILD 48. A planarization process such as a CMP process or a mechanical grinding process may be performed to level the top surfaces of the first ILD 48. The first ILD 48 may have a thickness T1 (see FIG. 2B) between about 50 nm and about 80 nm, in some embodiments. Other thicknesses are possible.

The dummy gate dielectric 32, the dummy gate electrode 34, and the mask layer 36 are removed and a replacement gate stack 60 is formed, in accordance with some embodiments. In some embodiments, the dummy gate dielectric 32, the dummy gate electrode 34, and the mask layer 36 may be removed using an anisotropic dry etch process. For example, the etching process may include a dry etch process using reaction gas(es) that selectively etches the dummy gate dielectric 32, the dummy gate electrode 34, and the mask layer 36 without etching the first ILD 48 or the gate spacers 38. In some embodiments, a wet etch process or an oxide removal process may be used. In some embodiments, the dummy gate dielectric 32 is removed in a first region of a die (e.g., a core logic region) and remains in a second region of the die (e.g., an input/output region). The removal of the dummy gate dielectric 32 and the dummy gate electrode 34 forms a recess that exposes a channel region of a respective fin 24. During the removal, the dummy gate dielectric 32 may be used as an etch stop layer when the dummy gate electrodes 34 are etched. The dummy gate dielectric 32 may then optionally be removed after the removal of the dummy gate electrodes 34.

The replacement gate stack 60 includes a gate dielectric layer 52 and a gate electrode 56, in accordance with some embodiments. Gate dielectric layers 52 are deposited conformally in the recesses, such as on the top surfaces and the sidewalls of the fins 24 and on sidewalls of the gate spacers 38. The gate dielectric layers 52 may also be formed on the top surface of the STI 22. In accordance with some embodiments, the gate dielectric layers 52 comprise silicon oxide, silicon nitride, or multilayers thereof. In some embodiments, the gate dielectric layers 52 include a high-k dielectric material, and in these embodiments, the gate dielectric layers 52 may have a k value greater than about 7.0, and may include a metal oxide or a silicate of hafnium, aluminum, zirconium, lanthanum, manganese, barium, titanium, lead, and combinations thereof. The formation methods of the gate dielectric layers 52 may include molecular-beam deposition (MBD), atomic layer deposition (ALD), PECVD, the like, or combinations thereof. In embodiments where portions of the dummy gate dielectric 32 remains in the recesses, the gate dielectric layers 52 include a material of the dummy gate dielectric 32 (e.g., $SiO_2$).

The gate electrodes 56 are deposited over the gate dielectric layers 52, respectively, and fill the remaining portions of the recesses. The gate electrodes 56 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 56 is illustrated in FIGS. 2A and 2D, the gate electrode 56 may comprise any number of liner layers, any number of work function tuning layers, and a fill material. A planarization process, such as a CMP, may be performed to remove the excess portions of the gate dielectric layers 52 and the material of the gate electrodes 56, which excess portions are over the top surface of the ILD 48. The remaining portions of material of the gate electrodes 56 and the gate dielectric layers 52 thus form replacement gates 60 of the resulting FinFETs. The gate electrodes 56 and the gate dielectric layers 52 may be collectively referred to as a "replacement gate stack 60," a "gate stack 60," or a "gate structure 60." The replacement gate stacks 60 may extend along sidewalls of a channel region of the fins 24. In some embodiments, the gate stacks 60 and gate spacers 38 may have a width W1 (see FIG. 2C) that is between about 9 nm and about 30 nm, though other widths are possible. In some embodiments, the gate stacks 60 may have a pitch P1 (see FIG. 2C) that is between about 39 nm and about 60 nm, though other pitch distances are possible.

The formation of the gate dielectric layers 52 in different regions of the wafer 10 may occur simultaneously such that the gate dielectric layers 52 in each region are formed from the same materials, and the formation of the gate electrodes 56 may occur simultaneously such that the gate electrodes 56 in each region are formed from the same materials. In some embodiments, the gate dielectric layers 52 in each region may be formed by distinct processes, such that the gate dielectric layers 52 may be different materials, and/or the gate electrodes 56 in each region may be formed by distinct processes, such that the gate electrodes 56 may be different materials. Various masking steps may be used to mask and expose appropriate regions when using distinct processes.

Still referring to FIGS. 2A-2D, hard masks 62 may be formed over the gate stacks 60, in accordance with some embodiments. The hard masks 62 may be formed of silicon nitride, silicon oxide, silicon oxynitride, silicon oxycarbide, silicon oxycarbonitride, the like, or combinations thereof. The formation of the hard masks 62 may include recessing the gate stacks 60 (including gate dielectric layers 52 and corresponding overlying gate electrodes 56) using one or more etching processes to form recesses, so that a recess is formed directly over the gate stack 60 and between opposing portions of gate spacers 38. As shown in FIGS. 2A and 2C, the gate spacers 38 may also be etched. Then, a dielectric material is filled into the recesses, and planarization process is performed to remove the excess portions of the dielectric material. The remaining portions of the dielectric material form the hard masks 62. In some embodiments, one or more additional dielectric layers may be formed over the recessed gate electrode 56 before forming the hard mask 62, which may, for example, include an etch stop layer.

Figure 3:
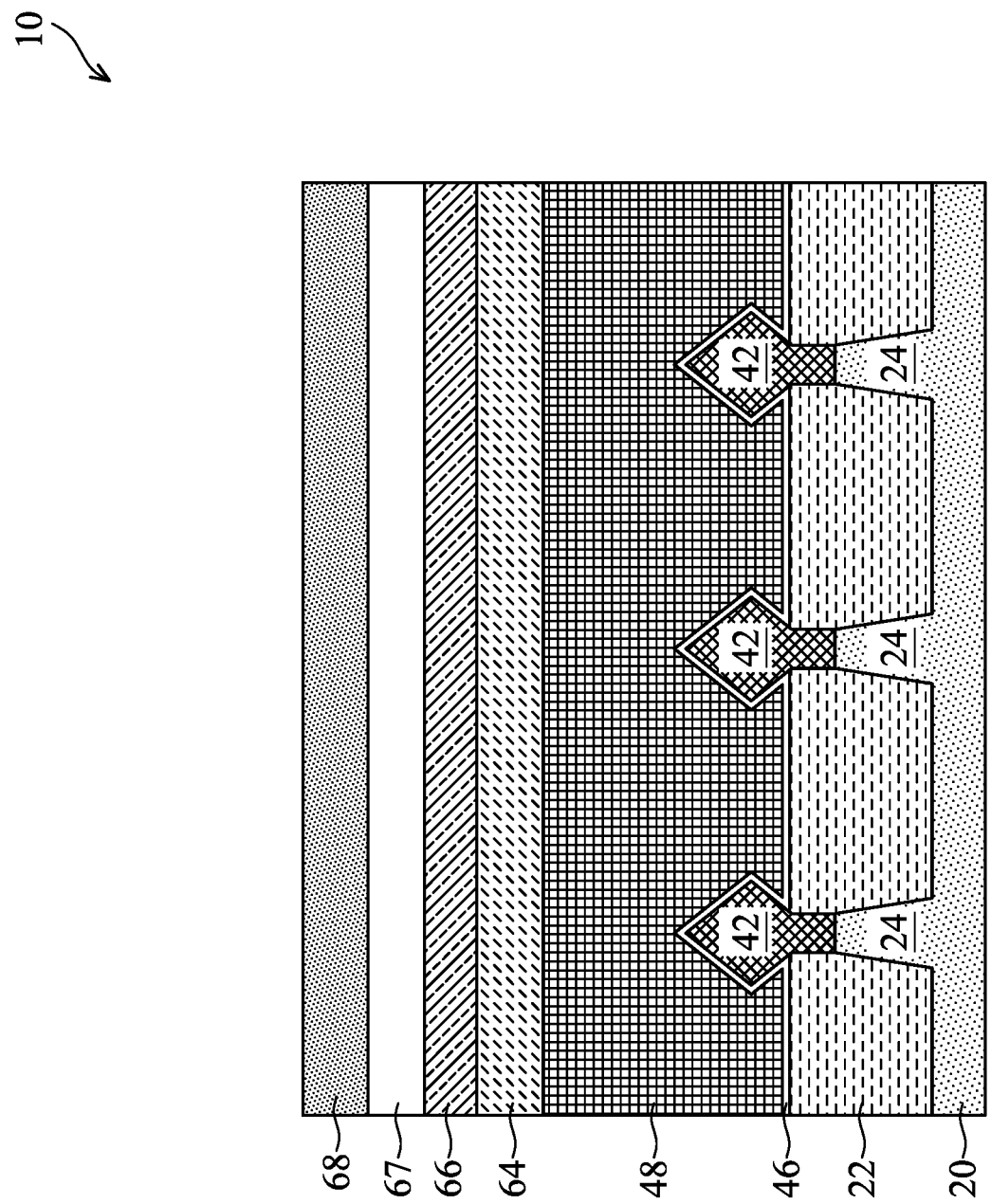
FIGS. 3, 4A, 4B, 4C, 5A, 5B, and 5C illustrate cross-sectional views and plan views of intermediate stages in the formation of a cut mask used in the formation of a FinFET device, in accordance with some embodiments.

In FIG. 3, a second ILD 64 is deposited over the first ILD 48, in accordance with some embodiments. In some embodiments, the second ILD 64 is a flowable film formed by a flowable CVD (FCVD) method. In some embodiments, the second ILD 64 is formed of a dielectric material such as PSG, BSG, BPSG, USG, or the like, and may be deposited by any suitable method, such as CVD and PECVD. The second ILD 64 may have a thickness between about 10 nm and about 90 nm, in some embodiments. Other thicknesses are possible.

Still referring to FIG. 3, a hard mask layer 66 is formed over second ILD 64, in accordance with some embodiments. In some embodiments, the hard mask layer 66 may be formed of a material that includes a metal, such as a material comprising titanium nitride (TiN); titanium; tantalum nitride; tantalum; a metal-doped carbide (e.g., tungsten carbide (WC)) or the like; and/or a metalloid (e.g., silicon nitride, boron nitride, silicon carbide, or the like); the like; or combinations thereof. In some embodiments, a material composition of the hard mask layer 66 may be determined to provide a high etch selectivity with respect to other layers such as the second ILD 64 and/or with respect to other subsequently formed layers. The hard mask layer 66 may be formed by a process such as CVD, ALD, or the like. However, any suitable processes and materials may be used. In some embodiments, the hard mask layer 66 has a thickness between about 10 nm and about 30 nm, though other thicknesses are possible.

In some embodiments, a capping layer 67 is formed over the hard mask layer 66. The capping layer 67 may be, for example, an oxide such as a silicon oxide or the like, which may formed using FCVD, CVD, PECVD, or the like. In some embodiments, the capping layer 67 is a low temperature oxide (e.g., an oxide deposited using a process temperature of 200° C. or less). Other suitable techniques or materials may be used. The capping layer 67 may have a thickness between about 20 nm and about 60 nm, in some embodiments. Other thicknesses are possible. A mask layer 68 is then formed over the capping layer 67, in accordance with some embodiments. The mask layer 68 may be formed of a suitable material that provides a high etch selectivity with respect to other layers such as the capping layer 67 or the hard mask layer 66. For example, the mask layer 68 may comprise silicon or amorphous silicon, though other materials are possible. The mask layer 68 may have a thickness between about 20 nm and about 50 nm, in some embodiments. Other thicknesses are possible.

FIGS. 3 through 11C illustrate various views of intermediate steps in the formation of source/drain contacts 112 (see FIGS. 11A-C), in accordance with some embodiments. FIGS. 4A, 5A, 6A, 7A, 8A, 9A, 10A, and 11A illustrate plan views of the structure. FIGS. 3, 4B, 5B, 6B, 7B, 8B, 9B, 10B, and 11B illustrate cross-sectional views along the reference cross-section B-B shown in FIG. 1A. FIGS. 4C, 5C, 6C, 7C, 8C, 9C, 10C, and 11C illustrate cross-sectional views along the reference cross-section C-C shown in FIG. 1A. The various views shown in the figures are illustrative examples, and other configurations or arrangements than shown are considered within the scope of the present disclosure. In some of the figures, some features have been omitted for clarity.

Figure 4A:
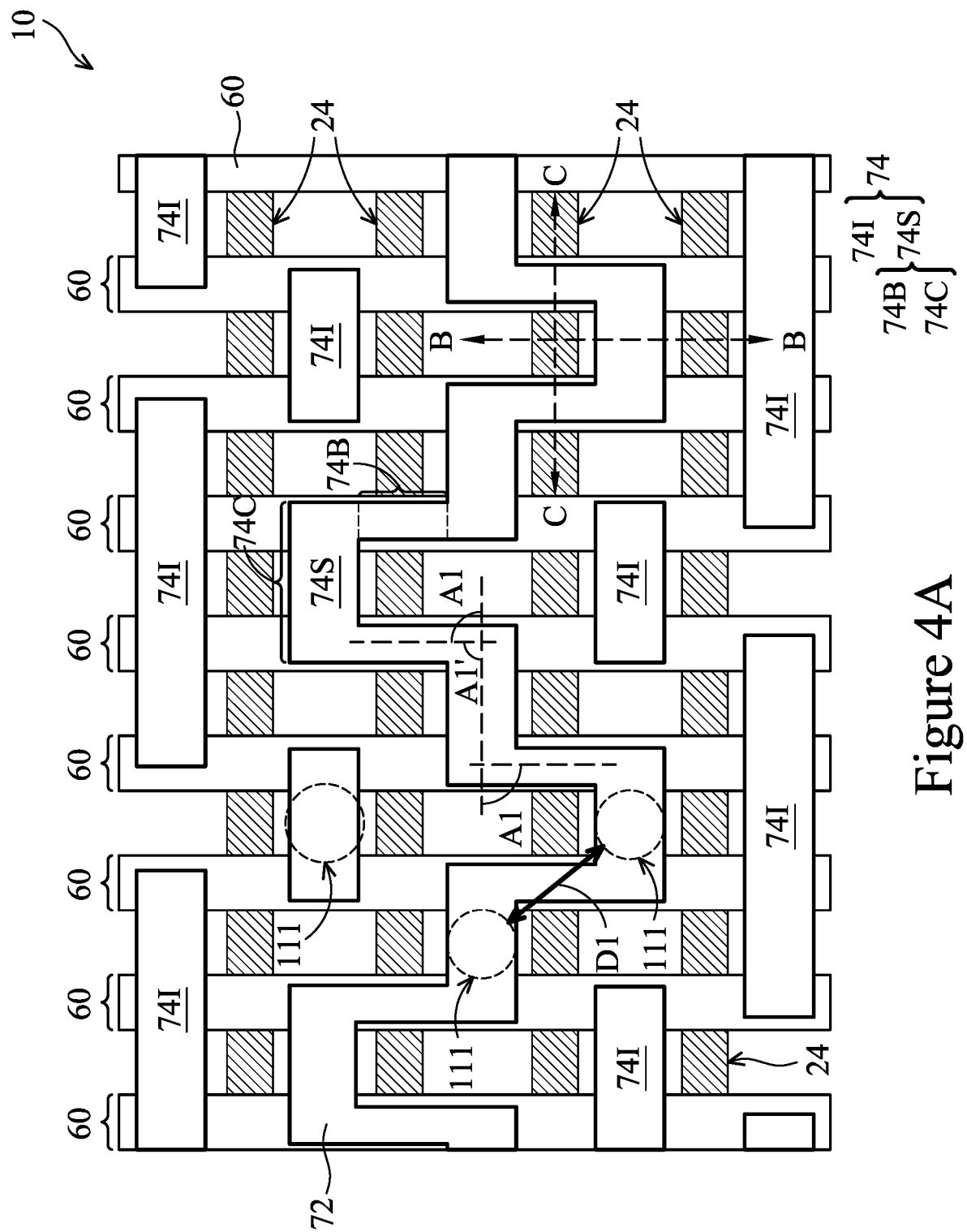
Figure 4B:
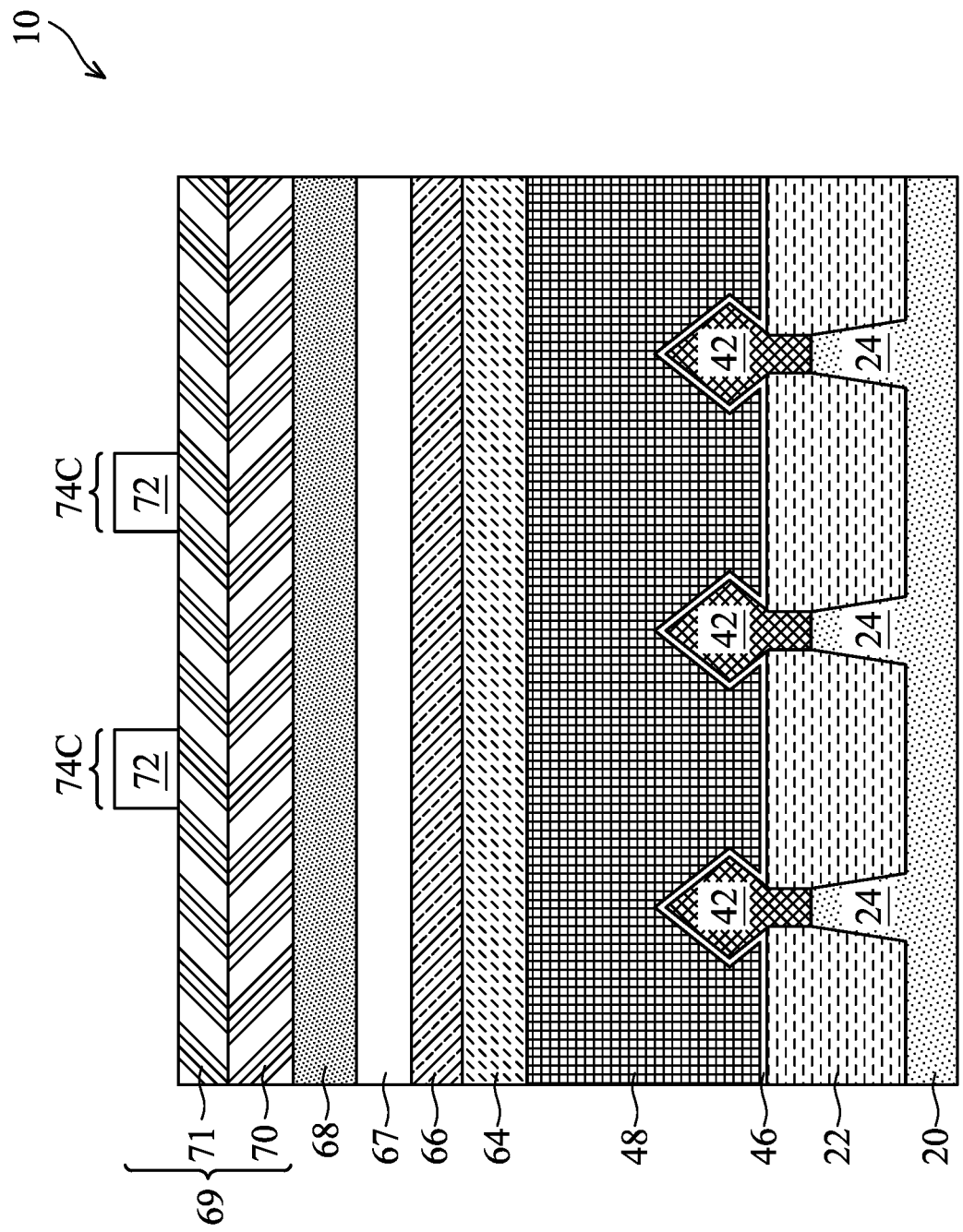
Figure 4C:
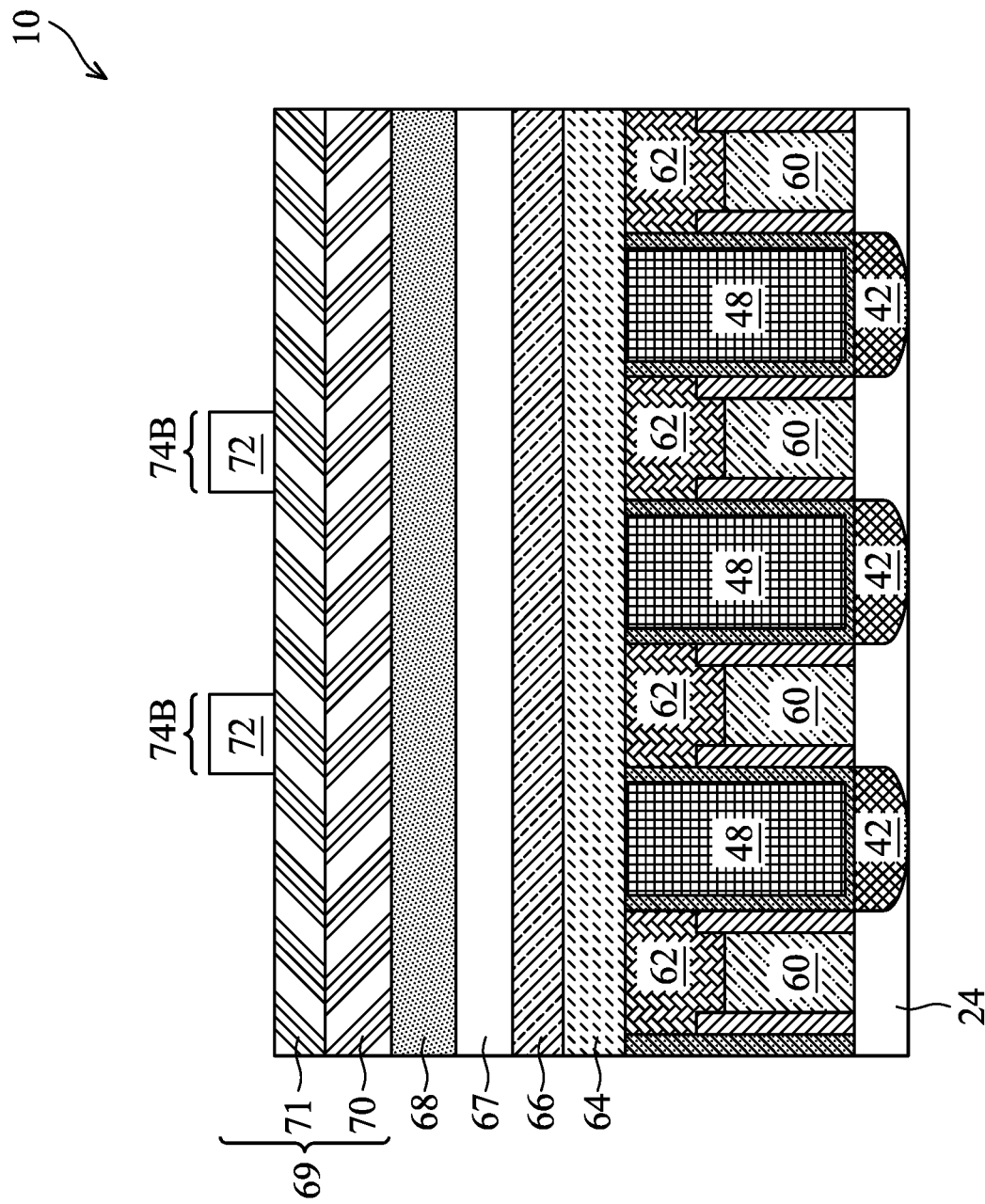

In FIGS. 4A through 4C, a photoresist structure 69 is formed over the mask layer 68 and patterned to have a cut pattern 74, in accordance with some embodiments. The cut pattern 74 is used to define cut regions 111 that separate adjacent source/drain contacts 112 (see FIGS. 11A-C). FIG. 4A illustrates a plan view showing a cut pattern 74 over multiple gate stacks 60 (which may include gate spacers 38) and multiple fins 24 (which may include epitaxial source/drain regions 42), in accordance with some embodiments. FIG. 4A is an illustrative example, and some features and layers have been omitted for clarity. Additionally, the cut pattern 74, the gate stacks 60, the fins 24, and/or the epitaxial source/drain regions 42 may be different than shown or have a different configuration than shown. For example, the two or more fins 24 may be adjacent, similar to the embodiment shown in FIG. 1B. As another example, the portions of the cut pattern 74 may have different sizes, different numbers, or different arrangements than shown. Other variations or configurations than these are possible and considered within the scope of the present disclosure. FIG. 4B illustrates a view along a cross-section similar to cross-section B-B shown in FIG. 4A, in which the cross-section is parallel to the gate stacks 60 and is between two gate stacks 60. FIG. 4C illustrates a view along a cross-section similar to cross-section C-C shown in FIG. 4A, in which the cross-section is parallel to the fins 24 and is along a fin 24.

The photoresist structure 69 shown in FIGS. 4A-4C is a tri-layer photoresist structure that includes a bottom layer 70, a middle layer 71, and an upper layer 72. FIGS. 4A-4C show the photoresist structure 69 after the upper layer 72 has been patterned to have cut pattern 74. In other embodiments, the photoresist structure 69 may have another number of layers. In some cases, using a tri-layer photoresist structure 69 can allow for improved definition of the cut pattern 74. The upper layer 72 may be formed of a photoresist (e.g., a photosensitive material), which includes organic materials, and may be a positive photosensitive material or a negative photosensitive material. In some embodiments, the bottom layer 70 is formed of a polymer material, and may be a bottom anti-reflective coating (BARC) layer. The middle layer 71 may comprise an inorganic material, which may be a nitride (e.g., silicon nitride), an oxynitride (e.g., silicon oxynitride), an oxide (e.g., silicon oxide), the like, or combinations thereof. The middle layer 71 may have a high etching selectivity relative to the upper layer 72 and/or the bottom layer 70. The various layers of photoresist structure 69 may be blanket deposited sequentially using, for example, spin-on processes and/or suitable deposition processes. Although a tri-layer photoresist structure 69 is discussed herein, in other embodiments, the photoresist structure 69 may be a monolayer structure or a bilayer structure (e.g., including only the bottom layer 70 and the upper layer 72 without the middle layer 71). The type of structure used (e.g., monolayer, bilayer, or tri-layer) may depend on the photolithography process used. For example, in extreme ultraviolet (EUV) lithography processes, a monolayer or bilayer may be used. The photoresist structure 69 described for FIGS. 4A-4C is an example, and photoresist structures comprising other layers, materials, or combinations thereof are possible.

The pattern 74 may be formed in the upper layer 72 using a suitable photolithographic process. In some embodiments, the cut pattern 74 defines regions where the cut mask 76 (see FIGS. 5A-5C) is subsequently formed. Subsequently, the upper layer 72 may be used as an etching mask for patterning of the middle layer 71 using an etching process (not separately shown in the figures). The etching process may be anisotropic, so that openings in the upper layer 72 are extended through the middle layer 71. The middle layer 71 is then used as an etching mask for patterning of the bottom layer 70 using an etching process (not separately shown in the figures). The etching process may be anisotropic, so that the openings in the middle layer 71 are extended through the bottom layer 70. As part of etching the bottom layer 70, the upper layer 72 may be consumed.

Referring to FIG. 4A, the cut pattern 74 may include one or more serpentine portions 74S and multiple island portions 74I, in accordance with some embodiments. The serpentine portions 74S and the island portions 74I extend across two or more gate stacks 60 (e.g., in the C-C direction) to define subsequently formed cut regions in that isolate (e.g, "cut") adjacent source/drain contacts 112 (see FIGS. 11A-C). Some example locations where cut regions 111 are subsequently formed are labeled in FIG. 4A. A pair of adjacent cut regions 111 has a separation distance D1, which may be different for different pairs of cut regions 111. In some cases, the use of both serpentine portions 74S and island portions 74I for the cut pattern 74 can allow for the formation of closer cut regions 111 without unwanted bridging of the cut pattern 74 or without increased contact resistance due to rounding of the source/drain contacts 112, described in greater detail below. By forming cut regions in having a smaller separation distance D1, the area of the source/drain contacts 112 may be increased, and the density of the source/drain contacts 112 may be increased. For example, in some cases, the techniques described herein may allow for cut regions 111 to be formed having a separation distance D1 that is between about 5 nm and about 30 nm, such as less than about 16 nm, though other distances are possible.

As shown in FIG. 4A, the serpentine portions 74S may include a continuous region of the cut pattern 74 that includes multiple cut sections 74C and multiple bridge sections 74B. The cut sections 74C are substantially straight regions of the serpentine portion 74S that extend between adjacent gate stacks 60 (e.g., substantially in the C-C direction) to define subsequently formed cut regions 111. A cut section 74C may extend between two or more adjacent gate stacks 60. The bridge sections 74B are substantially straight regions of the serpentine portion 74S that extend along gate stacks 60 (e.g., substantially in the B-B direction) and extend between cut sections 74C. A bridge section 74B may extend over one or more adjacent fins 24. The bridge sections 74B are contiguous with the cut sections 74C, and the bridge sections 74B and the cut sections 74C may be approximately perpendicular. Different parallel cut sections 74C may be perpendicularly offset (e.g., offset in the B-B direction), and thus the serpentine portion 74S may have a curving or tortuous shape that winds over some of the locations where cut regions 111 are to be subsequently formed. As shown in FIG. 4A, the serpentine portion 74S may comprise a contiguous series of similarly-shaped regions (e.g., comprising a periodic or repeating shape), though the shape of the regions or their arrangement may be different than shown. In other embodiments, some of or all of the serpentine portion 74S does not have a repeating shape. The serpentine portion 74S shown in FIG. 4A is an example, and in other embodiments the serpentine portion 74S may comprise bridge sections 74B and cut sections 74C with different dimensions or that are in different locations than shown.

As shown in FIG. 4A, the bridge sections 74B may substantially extend in a direction that is at an angle A1 with respect to a contiguous cut section 74C. The angle A1 may be measured at one end of a bridge section 74B, and on the side of that bridge section 74B that faces the cut section 74C on the opposite end of that bridge section 74B. FIG. 4A shows the bridge sections 74B being approximately perpendicular (e.g., orthogonal) to the cut sections 74C and thus having an angle A1 of about 90°. However, in other embodiments, the angle A1 may be between about 60° and about 90°. In some embodiments, the angle A1 is within about 30° of the longitudinal direction of the gate stacks 60. In this manner, the angle A1' made by a bridge section 74B and an adjacent cut section 74C may be between about 90° and about 120°. By forming the serpentine portions 74S with an angle A1 greater than about 60° (e.g., having nearly perpendicular sections), the cut regions 111 may be formed having less rounding, and the area of the source/drain contact regions 112 may be increased (described in greater detail for FIG. 12).

The island portions 74I are separated from other island portions 74I or from the serpentine portions 74S. The island portions 74I may extend between two or more gate stacks 60 (e.g., in the C-C direction), and may have different sizes. As shown in FIG. 4A, some island portions 74I may be located between cut sections 74C of a serpentine portion 74S. In some embodiments, some island portions 74I may be located between bridge sections 74B of a serpentine portion 74S. In some embodiments, some island portions 74I may be located between two different serpentine portions 74S (not shown in the figures).

Figure 5A:
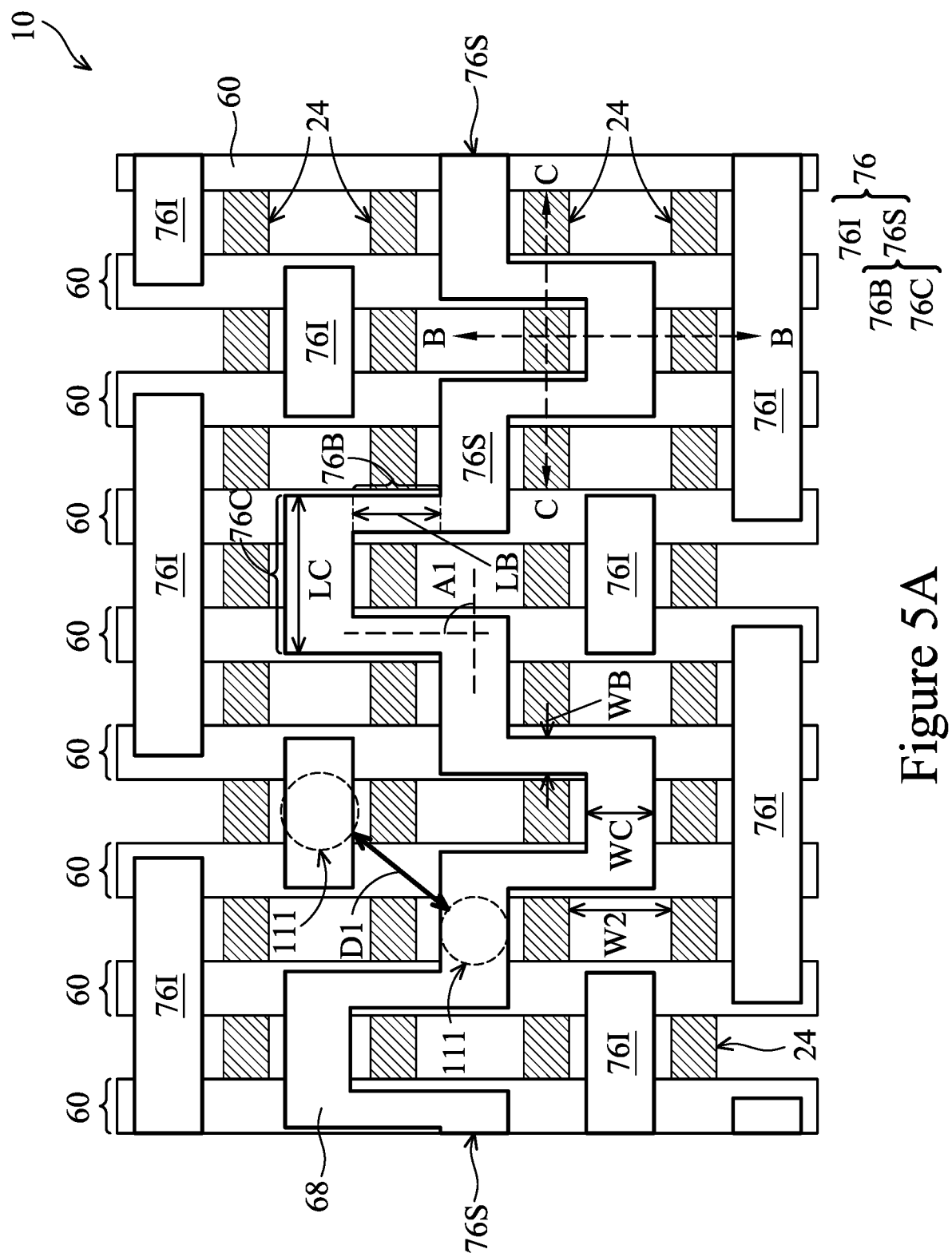
Figure 5B:
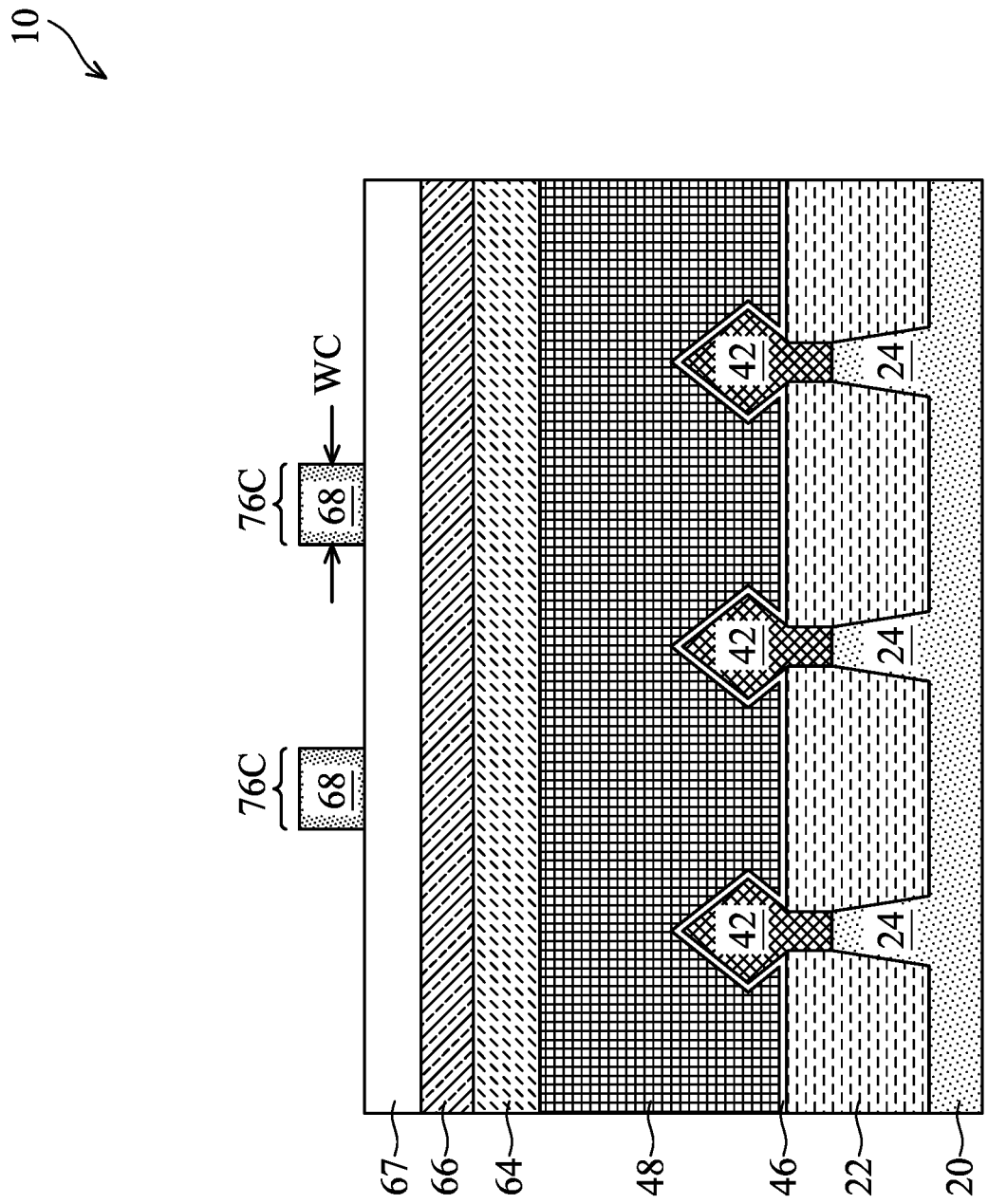
Figure 5C:
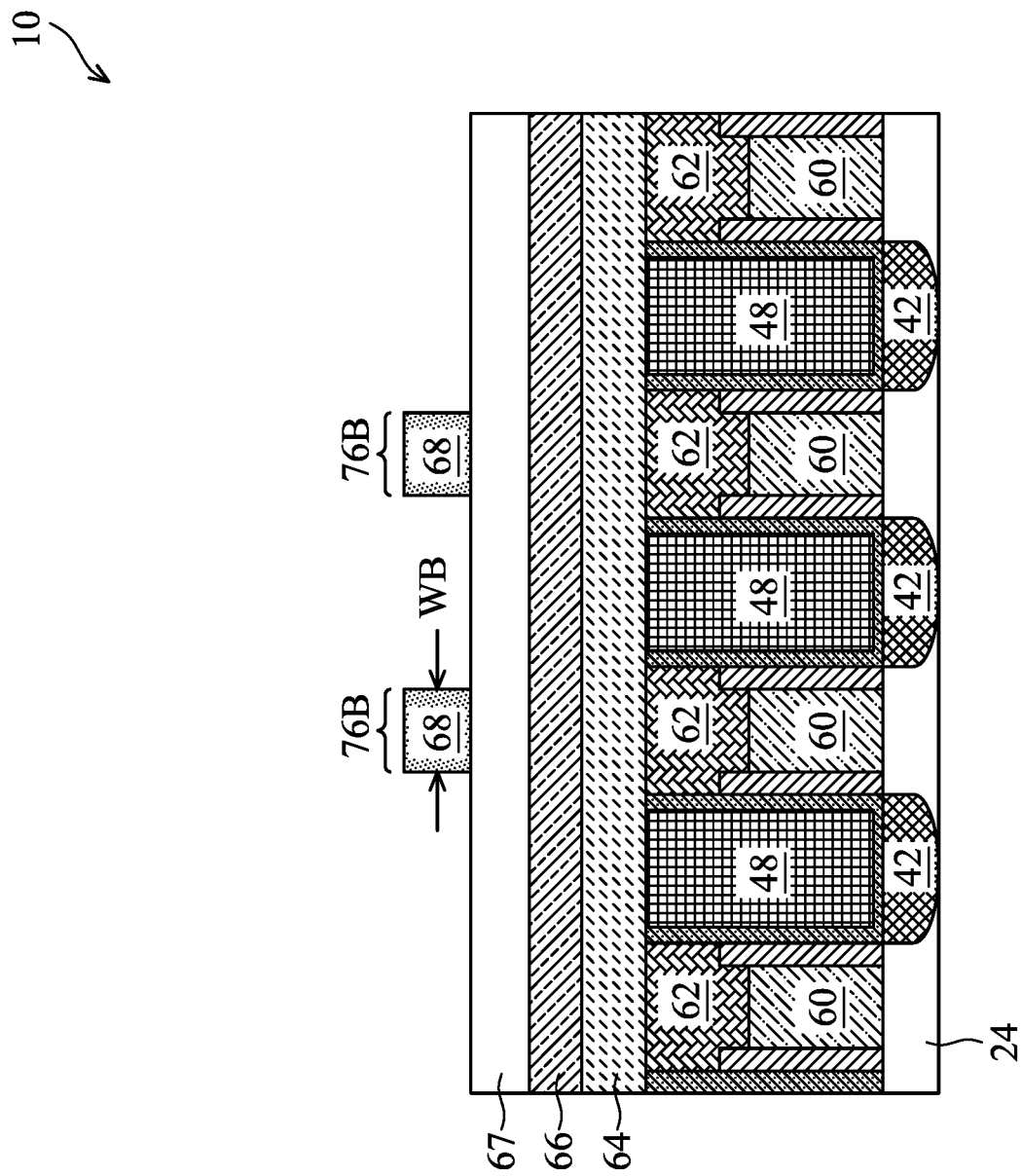

FIGS. 5A through 5C illustrate the patterning of the mask layer 68 to form the cut mask 76, in accordance with some embodiments. FIGS. 5A-5C show similar views as FIGS. 4A-4C. The mask layer 68 may be patterned using the patterned photoresist structure 69 as an etching mask. In this manner, the cut mask 76 is patterned using the cut pattern 74 described previously, and thus has a similar pattern. For example, the cut mask 76 may have island portions 76I and serpentine portions 76S, similar to the cut pattern 74. Additionally, the serpentine portions 76S may include bridge sections 76B and cut sections 76C, similar to the bridge sections 74B and cut sections 74C of the cut pattern 74. The patterning of the mask layer 68 may be performed using an anisotropic etching process, so that openings in the patterned photoresist structure are extended through the mask layer 68, transferring the cut pattern 74 to the mask layer 68. The etching process may be, for example, an anisotropic dry etching process, and may be performed using process gases such as $Cl_2$, $NF_3$, HBr, $CF_4$, the like, or combinations thereof.

The dimensions or shape of the cut mask 76 may be about the same as the cut pattern 74. For example, the cut mask 76 may have bridge sections 76B that extend at an angle A1 from the cut sections 76C, in which the angle A1 is between about 60° and about 90°. In some cases, having an angle A1 greater than about 60° may reduce rounding of the cut mask 76 during patterning, and thus may allow for source/drain contacts 112 having larger contact area (described in greater detail for FIGS. 12-13). In some embodiments, the bridge sections 76B may have a length LB that is between about 5 nm and about 30 nm, though other lengths are possible. The bridge sections 76B may have a width WB that is between about 0.5 nm and about 25 nm, though other widths are possible. In some embodiments, the width WB may be between about 0.016% and about 100% of the width W1 of the gate stack 60 and spacers 38. In some cases, bridge sections 76B having a smaller width WB may allow for source/drain contacts 112 having increased area. This is described in greater detail below for FIG. 13. In some embodiments, the cut sections 76C may have a length LC that is between about 39 nm and about 60 nm, though other lengths are possible. In some embodiments, the length LC may be between about 100% and about 180% of the pitch P1 of the gate stack 60. In some embodiments, the length LC may be such that the sides of the cut sections 76C protrude beyond the sides of the contiguous bridge sections 76B. This is illustrated in the embodiment shown in FIG. 13. In some embodiments, the cut sections 76C may have a width WC that is between about 15 nm and about 200 nm, though other widths are possible. The width WC defines the width of each cut region 111, and thus defines the distance D2 between adjacent source/drain contacts 112 (see FIGS. 11A-C and 12). In some embodiments, the width WC may be between about 25% and about 1000% of the width W2 between adjacent fins 24. In some embodiments, a smaller width WC may allow for source/drain contacts 112 having increased area.

Figure 6A:
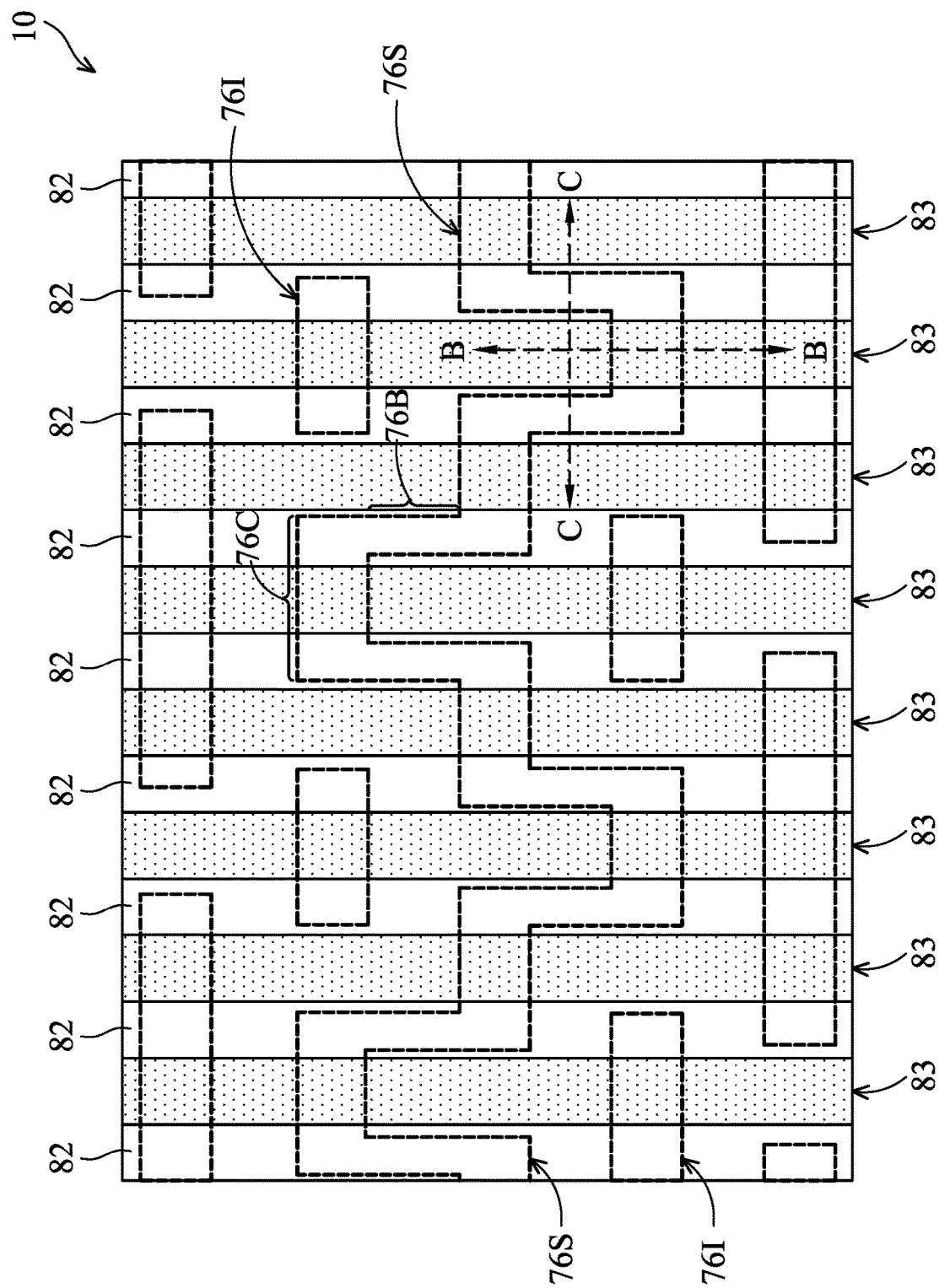
FIGS. 6A, 6B, 6C, 7A, 7B, 7C, 8A, 8B, 8C, 9A, 9B, 9C, 10A, 10B, 10C, 11A, 11B, and 11C illustrate cross-sectional views and plan views of intermediate stages in the formation of a source/drain contacts of a FinFET device, in accordance with some embodiments.
Figure 6B:
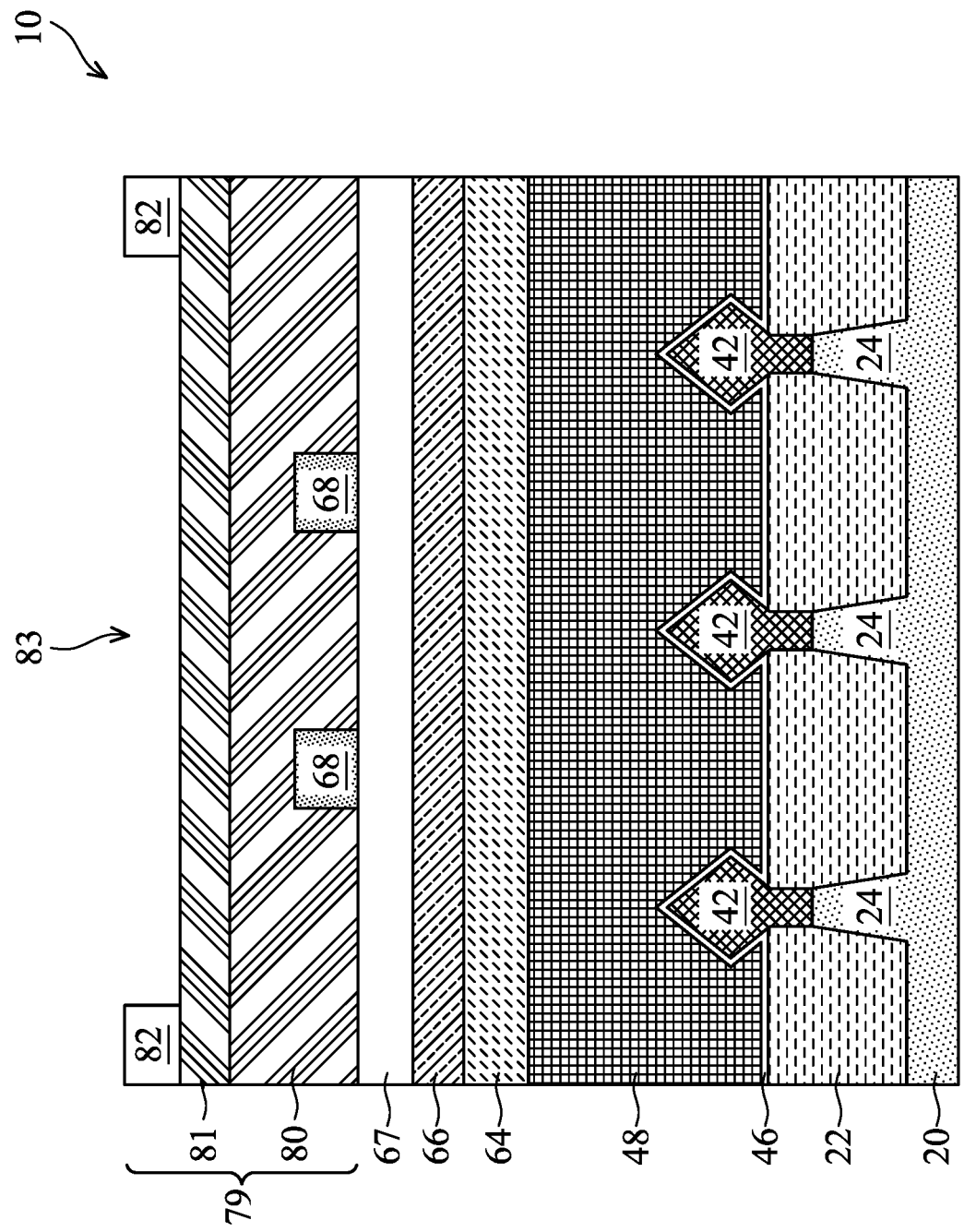
Figure 6C:
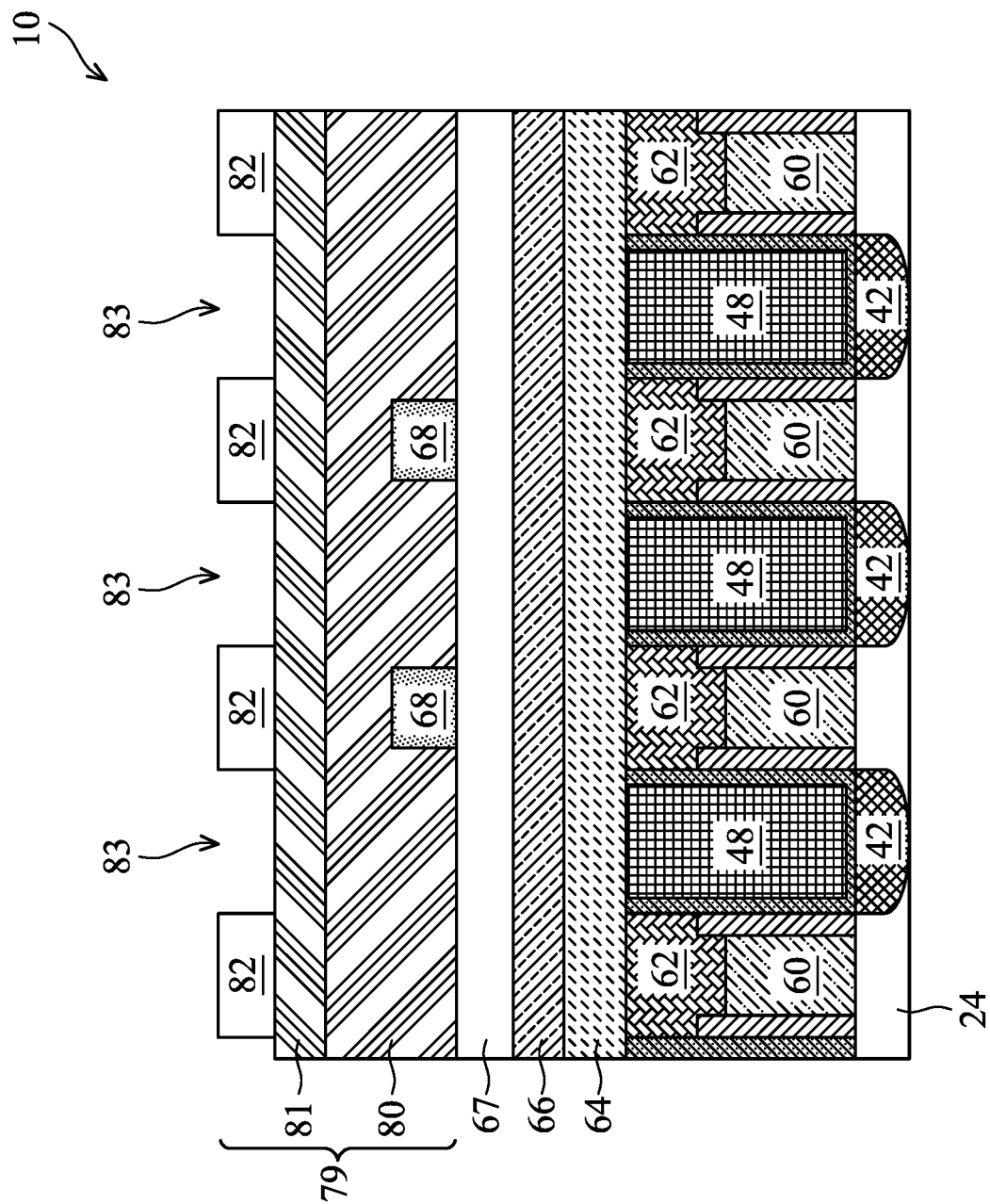

In FIGS. 6A through 6C, a photoresist structure 79 is formed over the cut mask 76 and patterned to form openings 83, in accordance with some embodiments. FIGS. 6A-6C show similar views as FIGS. 5A-5C. The openings 83 may define larger regions of the wafer 10 within which contact openings 84 and cut regions 111 are subsequently formed (see FIGS. 9A-C and 11A-C). In this manner, the openings 83 may extend in the B-B direction between adjacent gate stacks 60 and over epitaxial source/drain regions 42. For reference, the cut mask 76 has been indicated in FIG. 6A by a dashed outline.

The photoresist structure 79 shown in FIGS. 6A-6C is a tri-layer photoresist structure that includes a bottom layer 80, a middle layer 81, and an upper layer 82. The photoresist structure 79 shown in FIGS. 6A-6C may be similar to the photoresist structure 69 described for FIGS. 4A-4C. For example, the bottom layer 80 may be similar to the bottom layer 70, the middle layer 81 may be similar to the middle layer 71, or the upper layer 82 may be similar to the upper layer 72. The various layers of photoresist structure 79 may be blanket deposited sequentially using, for example, spin-on processes and/or suitable deposition processes. As shown in FIGS. 6B-6C, the bottom layer 80 is formed over the capping layer 67 and the cut mask 76. The middle layer 81 is formed over the bottom layer 80, and the upper layer 82 is formed over the middle layer 81. The photoresist structure 79 described for FIGS. 6A-6C is an example, and photoresist structures comprising other layers, materials, or combinations thereof are possible.

FIGS. 6A-6C show the photoresist structure 79 after the upper layer 82 has been patterned using, for example, a suitable photolithographic process. Subsequently, the upper layer 82 may be used as an etching mask for patterning of the middle layer 81 using an etching process (not separately shown in the figures). The etching process may be anisotropic, so that openings 83 in the upper layer 82 are extended through the middle layer 81. The middle layer 81 is then used as an etching mask for patterning of the bottom layer 80 using an etching process (not separately shown in the figures). The etching process may be anisotropic, so that the openings in the middle layer 81 are extended through the bottom layer 80. As part of etching the bottom layer 80, the upper layer 82 may be consumed. In some embodiments, the openings 83 in the photoresist structure 79 may be formed using two or more photolithographic patterning steps (e.g., using a multipatterning process).

Figure 7A:
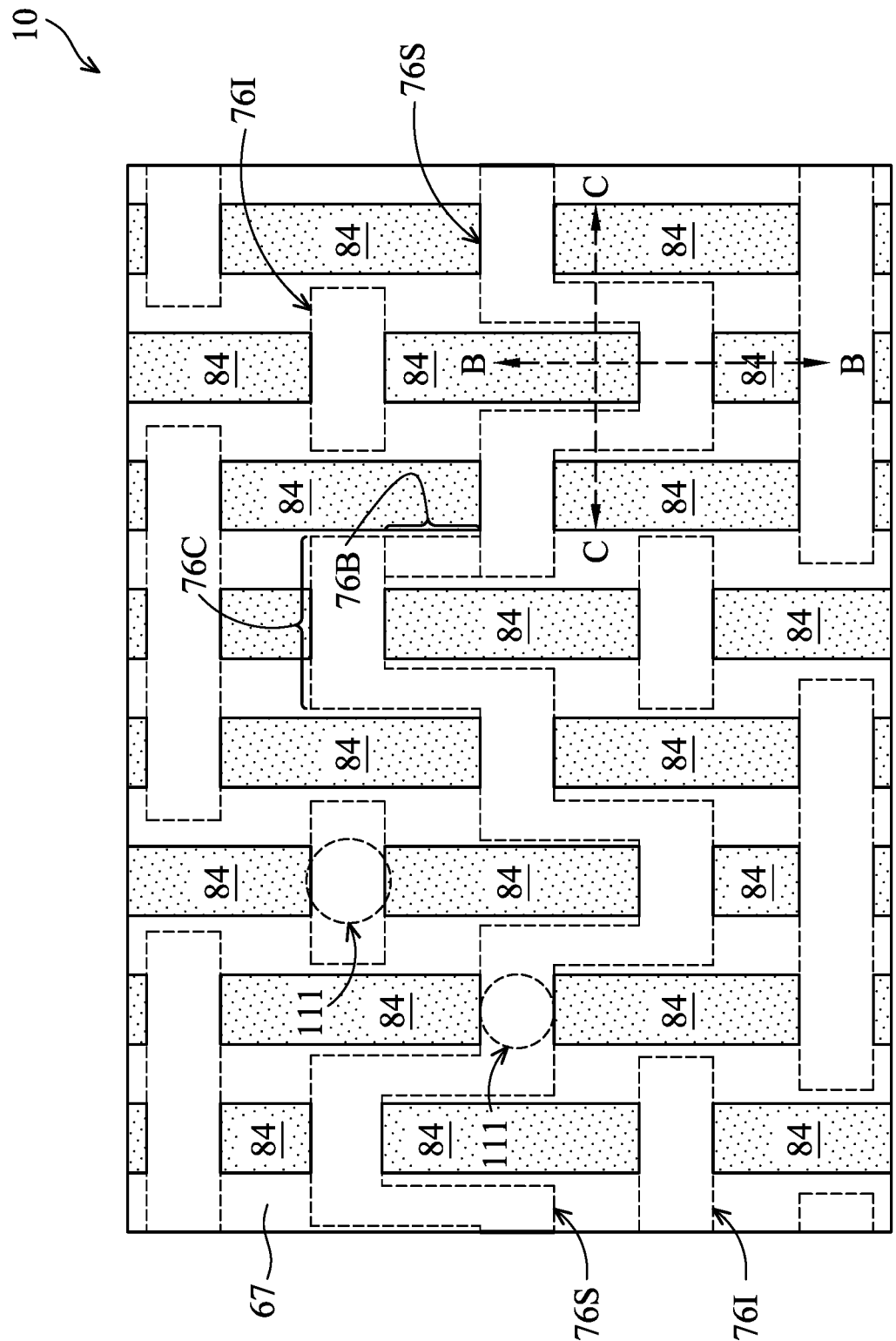
Figure 7B:
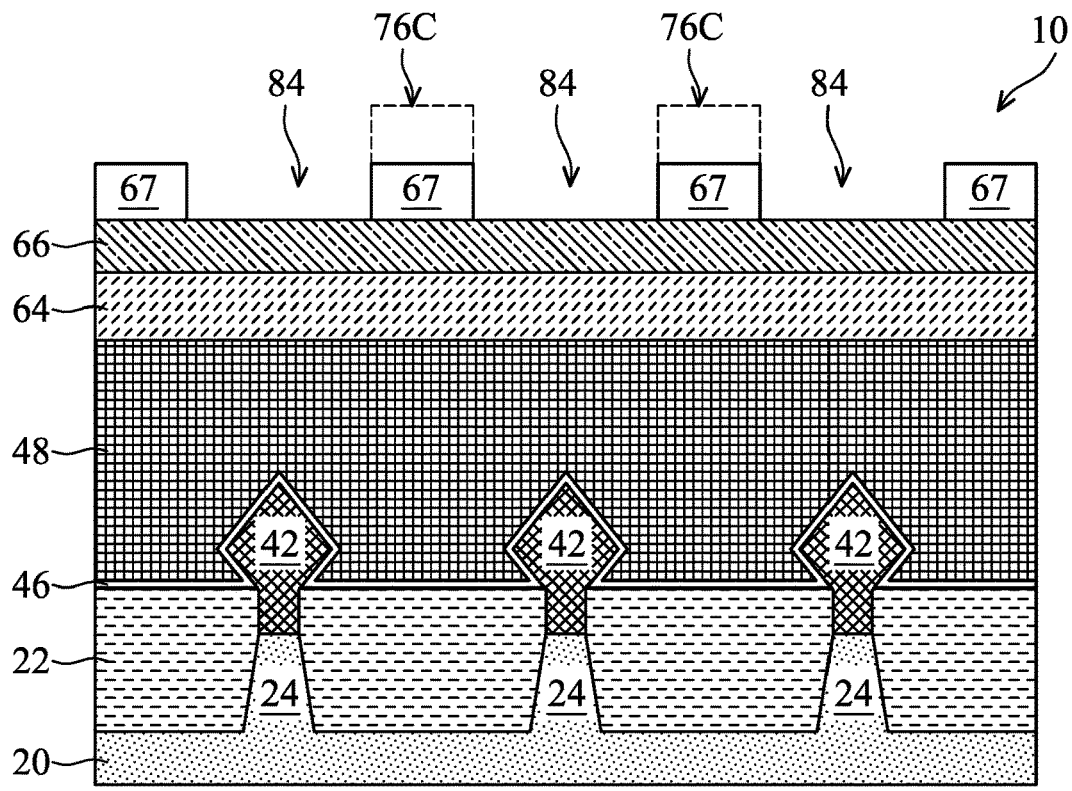
Figure 7C:
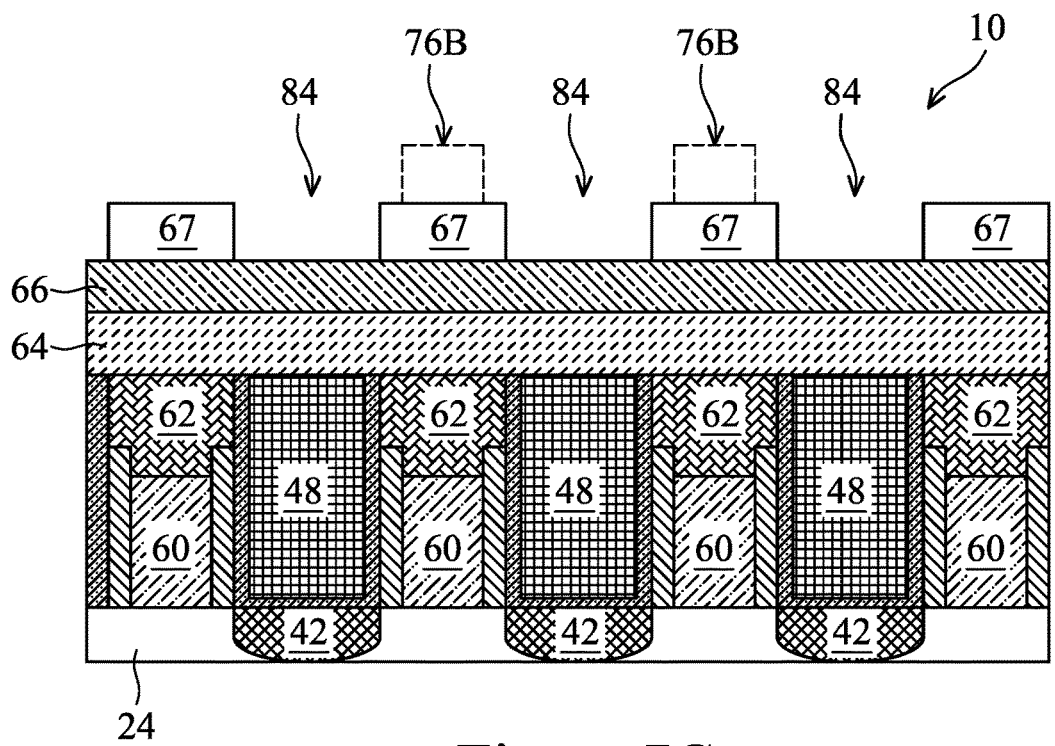

In FIGS. 7A through 7C, the patterned photoresist structure 79 and the cut mask 76 are used as a combined etching mask to pattern contact openings 84 in the capping layer 67, in accordance with some embodiments. FIGS. 7A-7C show similar views as FIGS. 6A-6C. The contact openings 84 may define larger regions of the wafer 10 within which source/drain contacts 112 (see FIGS. 11A-C) may be formed. The contact openings 84 are separated in the B-B direction from the cut regions 111. For reference, cut regions 111 and the regions where the cut mask 76 had been previously formed have been indicated in FIG. 7A-7C by dashed outlines. As shown in FIGS. 7A-7C, the cut regions 111 may be defined by the cut mask 76. The patterning of the capping layer 67 may be performed using an anisotropic etching process, so that openings 83 in the patterned photoresist structure 79 are extended through the capping layer 67 except for regions where the cut mask 76 is present. The etching process may be, for example, an anisotropic dry etching process, and may be performed using process gases such as $Cl_2$, $NF_3$, HBr, $CF_4$, the like, or combinations thereof. The patterning of the capping layer 67 may remove remaining portions of the photoresist structure 79 or the cut mask 76, or these remaining portions may be removed after patterning the capping layer 67 using, e.g., an ashing process, a wet chemical process, or the like. In some cases, portions of the cut mask 76 may remain after patterning the capping layer 67.

Figure 8A:
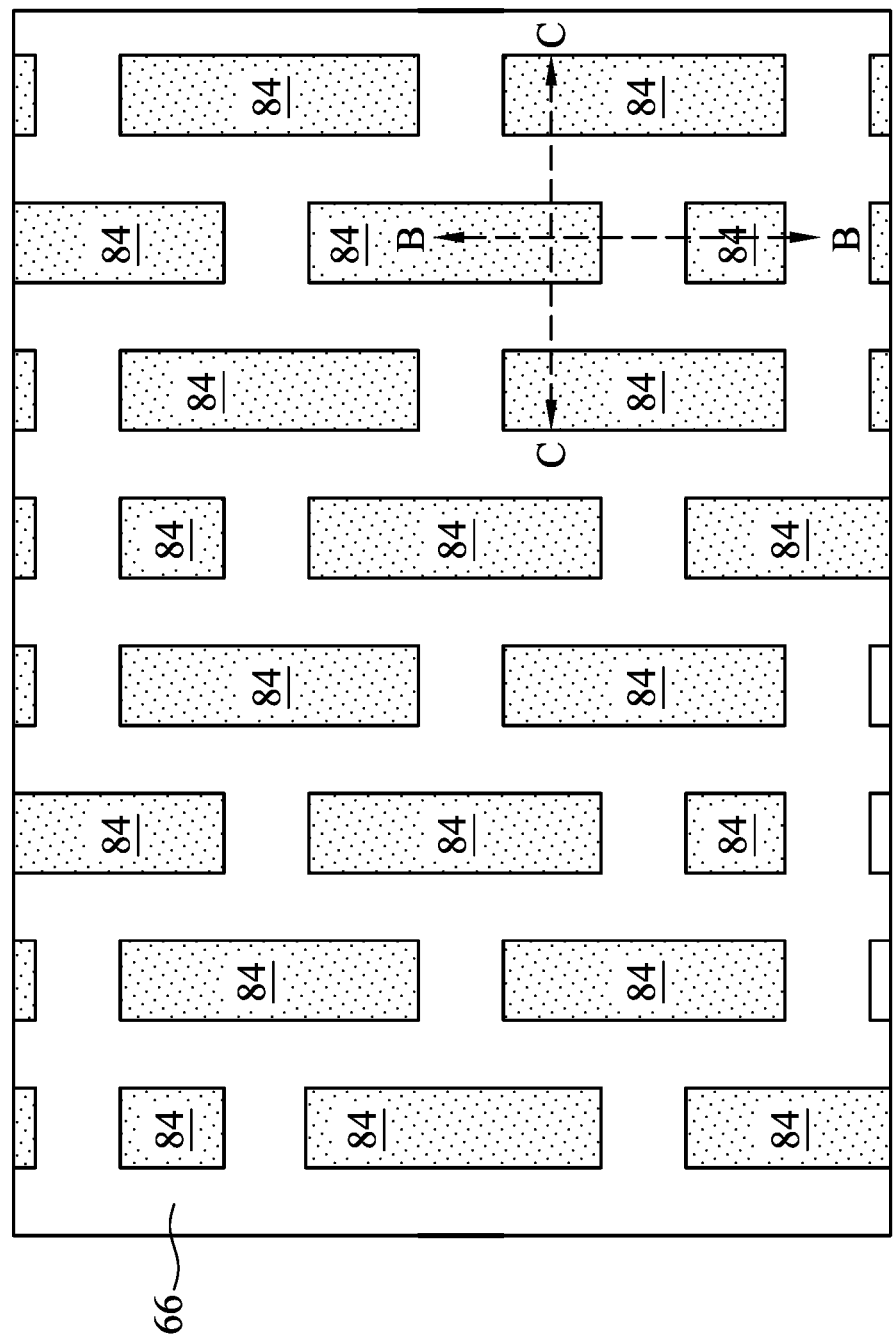
Figure 8B:
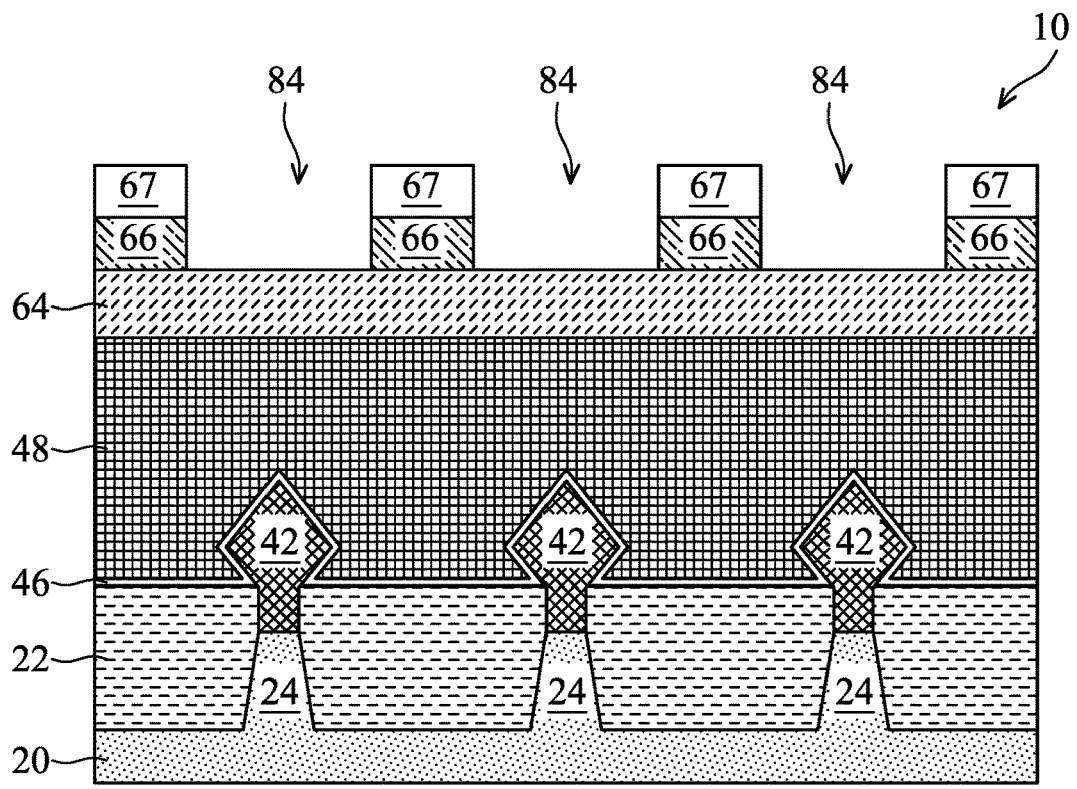
Figure 8C:
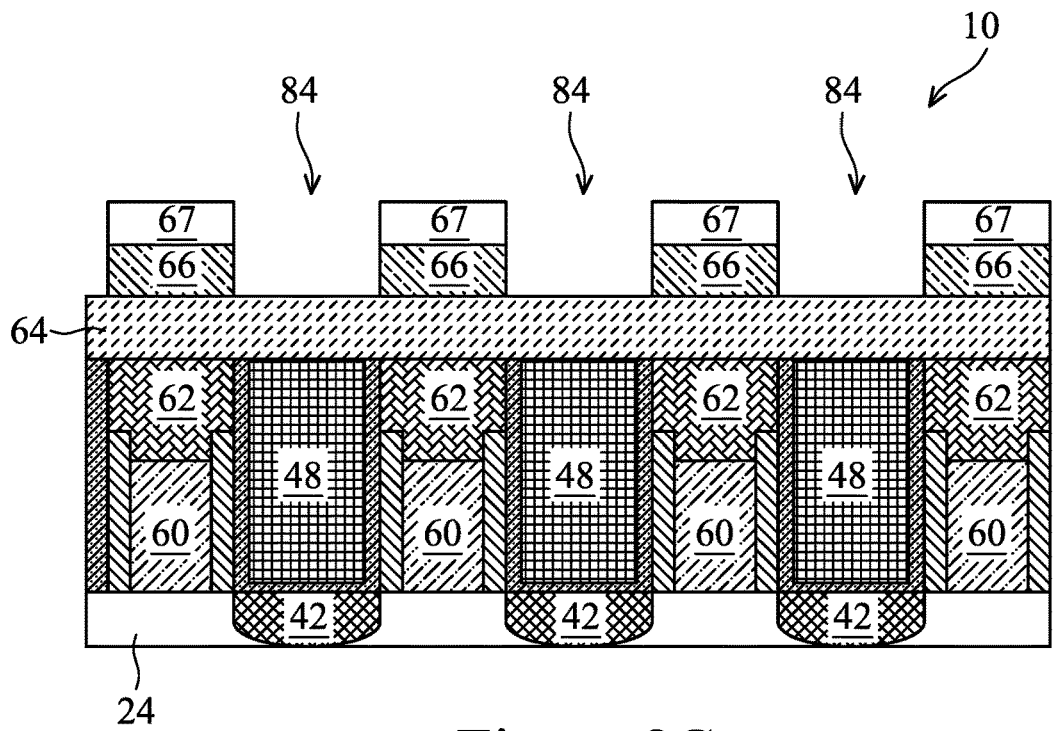

In FIGS. 8A through 8C, the contact openings 84 formed in the capping layer 67 are extended through hard mask layer 66 using an etching process, in accordance with some embodiments. FIGS. 8A-8C show similar views as FIGS. 7A-7C. The etching of the hard mask layer 66 may be performed using an anisotropic etching process, so that contact openings 84 in the patterned capping layer 67 are extended through the hard mask layer 66. The etching process may be, for example, an anisotropic dry etching process, and may be performed using process gases such as $Cl_2$, $NF_3$, HBr, $CF_4$, the like, or combinations thereof. The etching of the hard mask layer 66 may thin or remove remaining portions of the capping layer 67. In some embodiments, the capping layer 67 and the hard mask layer 66 are patterned using a single etching process.

Figure 9A:
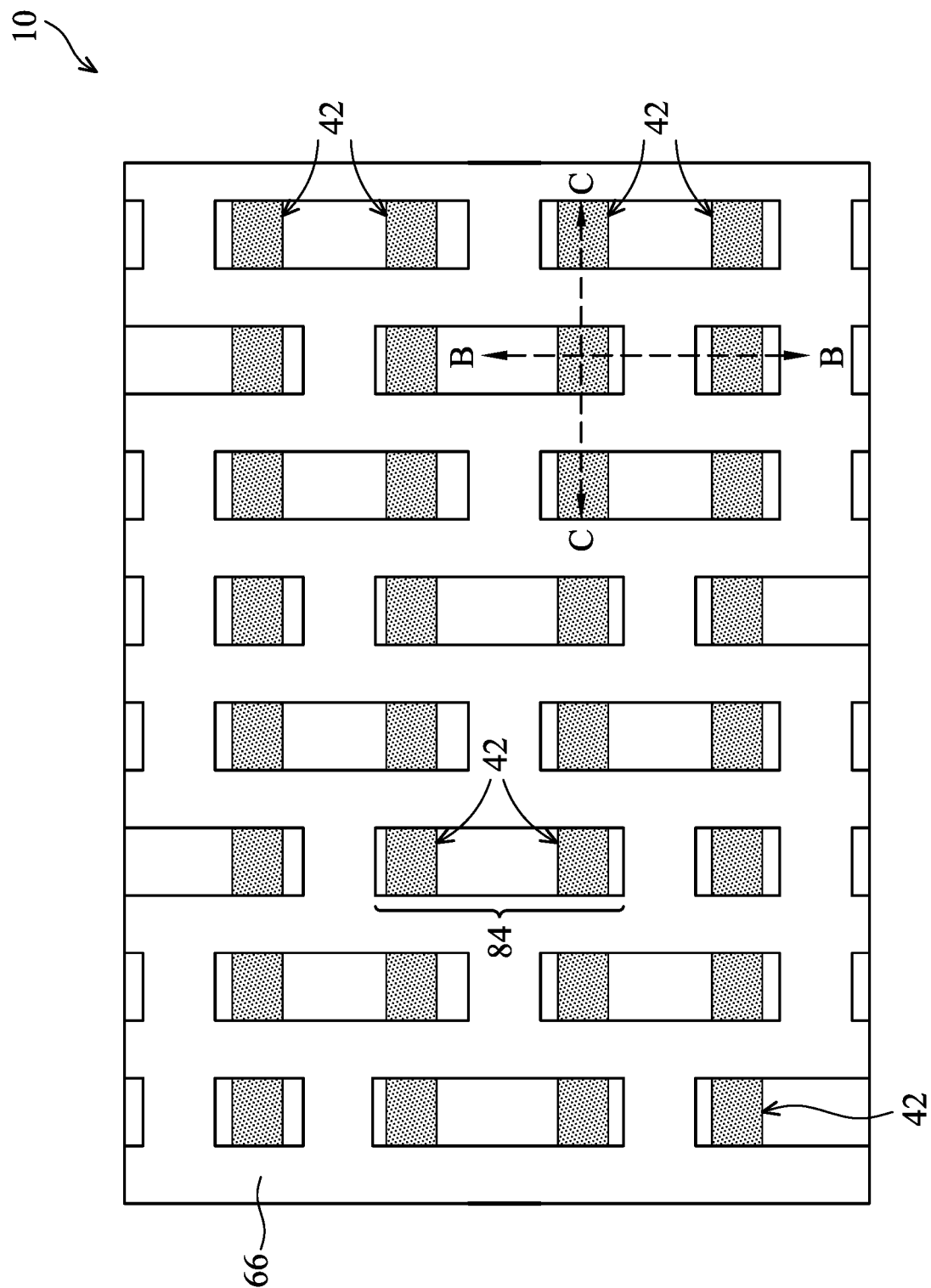
Figure 9B:
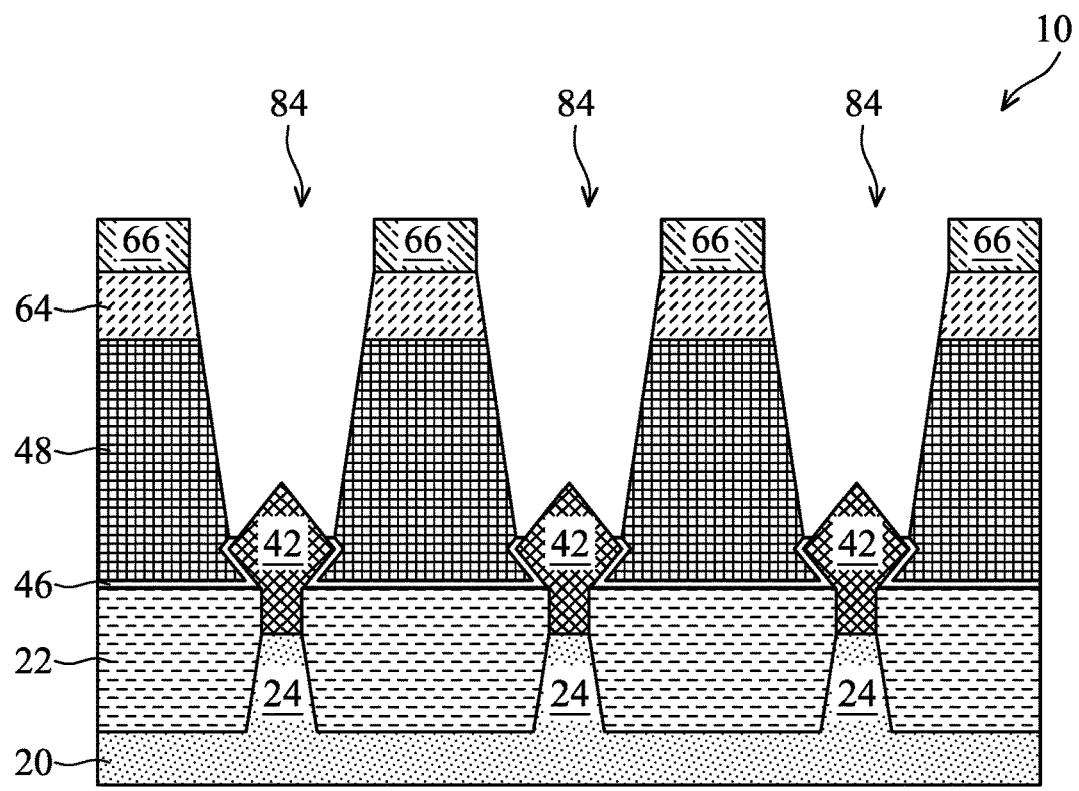
Figure 9C:
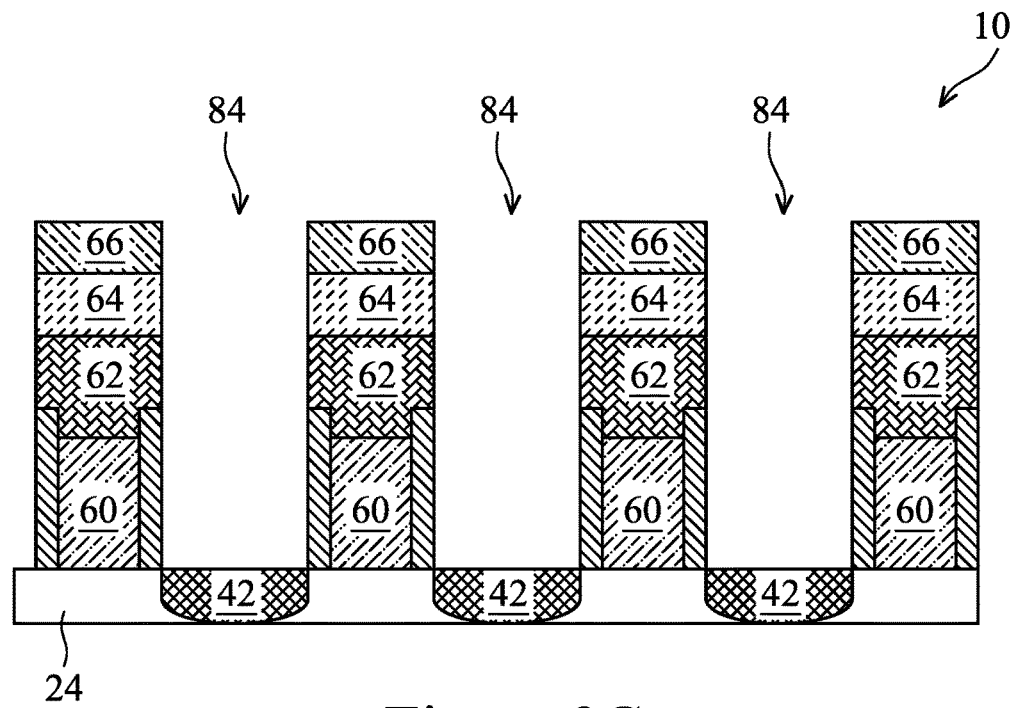

In FIGS. 9A through 9C, the contact openings 84 formed in the hard mask layer 66 are extended through the second ILD 64, the first ILD 48, and the CESL 46 to expose the epitaxial source/drain regions 42, in accordance with some embodiments. FIGS. 9A-9C show similar views as FIGS. 8A-8C. In some cases, the use of a cut pattern 94 with relatively perpendicular sections as described previously may allow for more of the epitaxial source/drain regions 42 to be exposed by the contact openings 84, which can allow for reduced contact resistance and improved device performance.

The contact openings 84 shown in FIGS. 9A-9C may be etched using one or more dry etching processes, in accordance with some embodiments. The etching processes may have a high etching selectivity of the second ILD 64, the first ILD 48, and/or the CESL 46 relative to the hard mask layer 66. In some embodiments, the dry etching process may include an anisotropic plasma etch having a plasma generated with a power between about 50 Watts and about 500 Watts, and may be performed at a pressure between about 3 mTorr and about 200 mTorr. In some embodiments, the dry etching process may use one or more process gases such as $CF_4$, $C_4F_6$, $C_4F_8$, $CH_2F_2$, $CHF_3$, other fluorine-based gases, $O_2$, CO, $CO_2$, $H_2$, $CH_4$, the like, or other types of process gases. In some embodiments, the etching process may be followed by a wet clean process, which may include the use of dHF (e.g., dilute HF), SC-1, or the like. Other etching techniques may be used in other embodiments. During the etching, the capping layer 67 may be consumed, and hard mask layer 66 may be at least partially consumed.

Figure 10A:
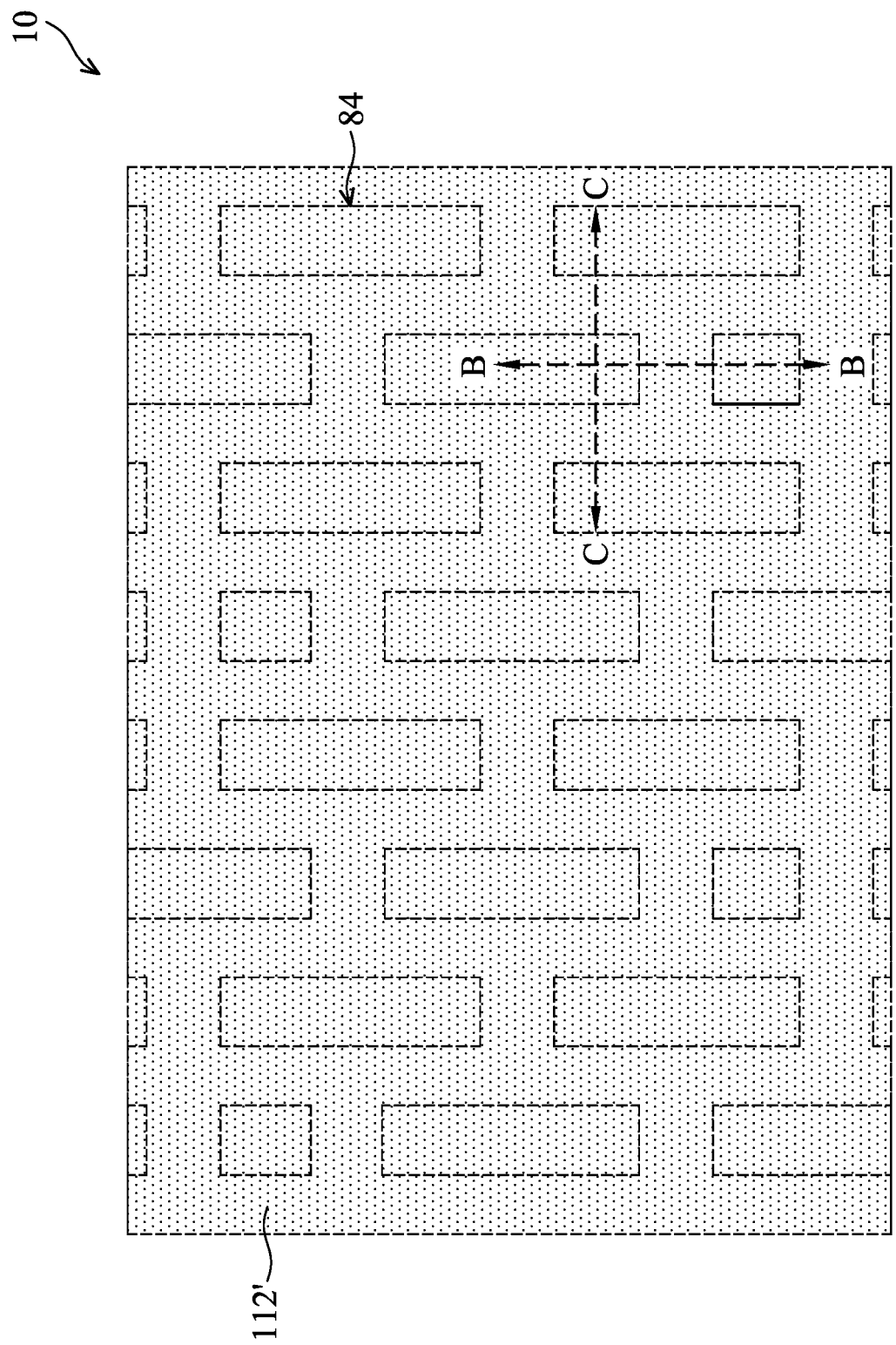
Figure 10B:
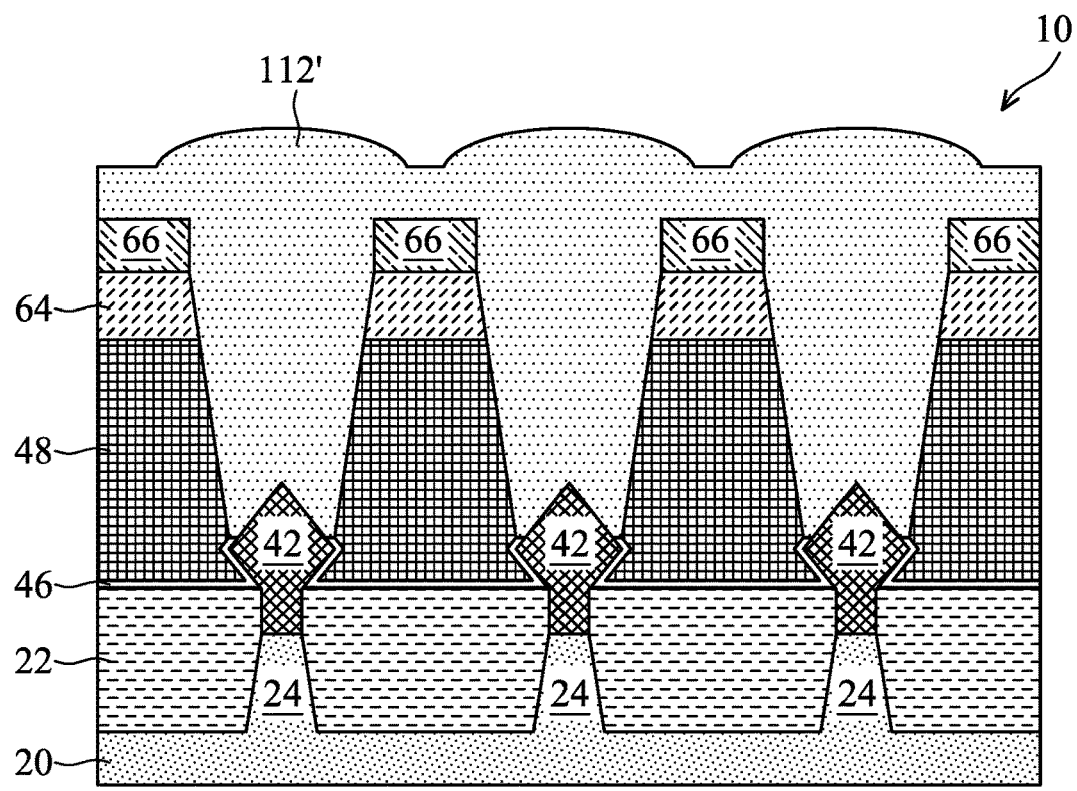
Figure 10C:
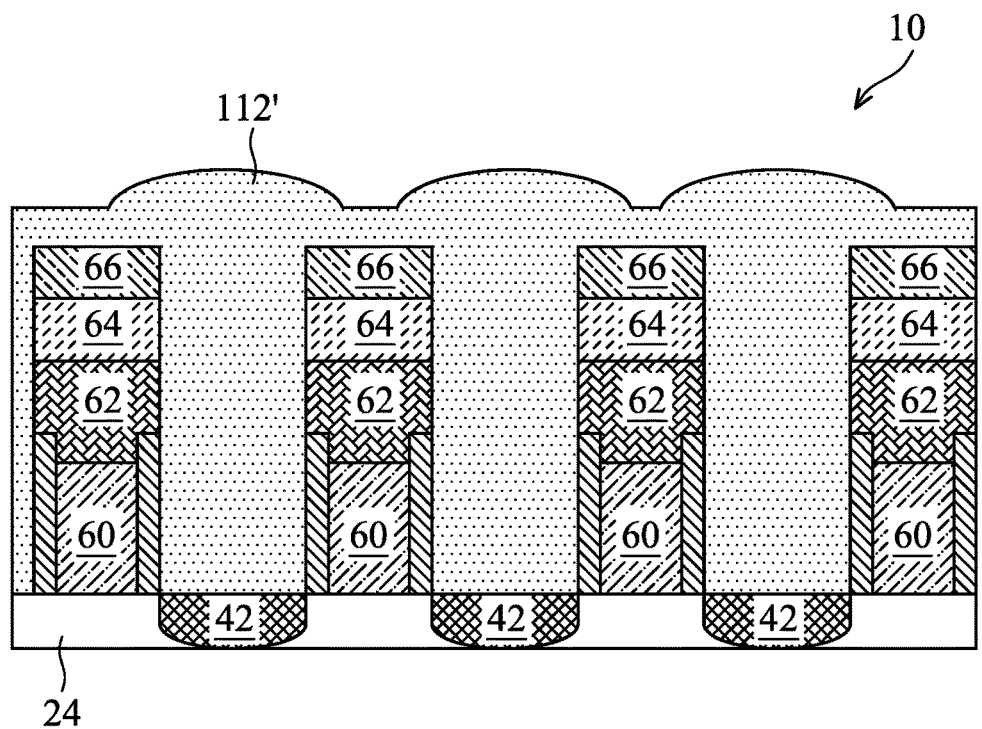

In FIGS. 10A through 10C, a contact material 112' is formed over the structure and within the contact openings 84, in accordance with some embodiments. FIGS. 10A-10C show similar views as FIGS. 9A-9C. The contact material 112' may comprise a liner and a conductive material, which are not separately illustrated in the figures. The liner may be, for example, a diffusion barrier layer, an adhesion layer, or the like, and may comprise a material such as titanium, titanium nitride, tantalum, tantalum nitride, the like, or combinations thereof. The conductive material may include, for example, copper, a copper alloy, silver, gold, tungsten, cobalt, aluminum, nickel, the like, or combinations thereof. The liner and/or the conductive material may be formed using a suitable process, such as ALD, CVD, PVD, plating, the like, or combinations thereof. In some embodiments, a silicide (not shown in the figures) may be formed at the interface between the epitaxial source/drain regions 42 and the contact material 112'.

Figure 11A:
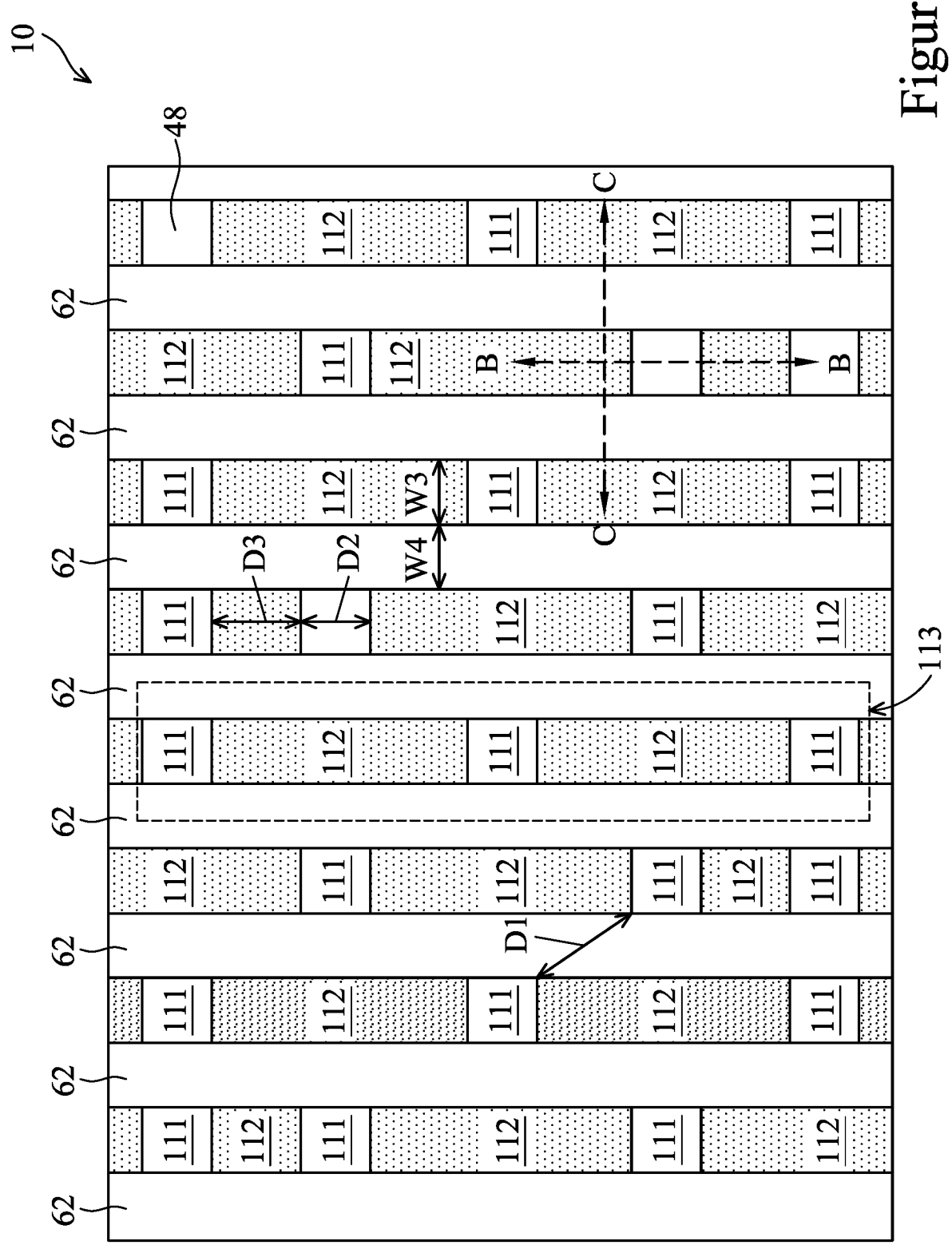
Figure 11B:
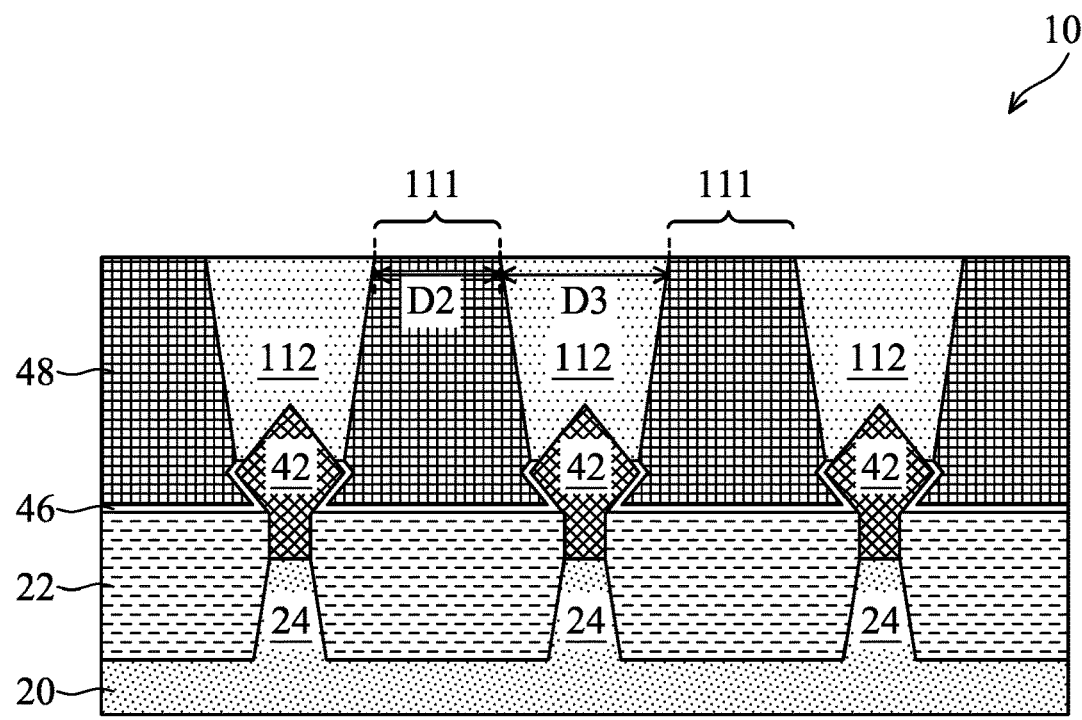
Figure 11C:
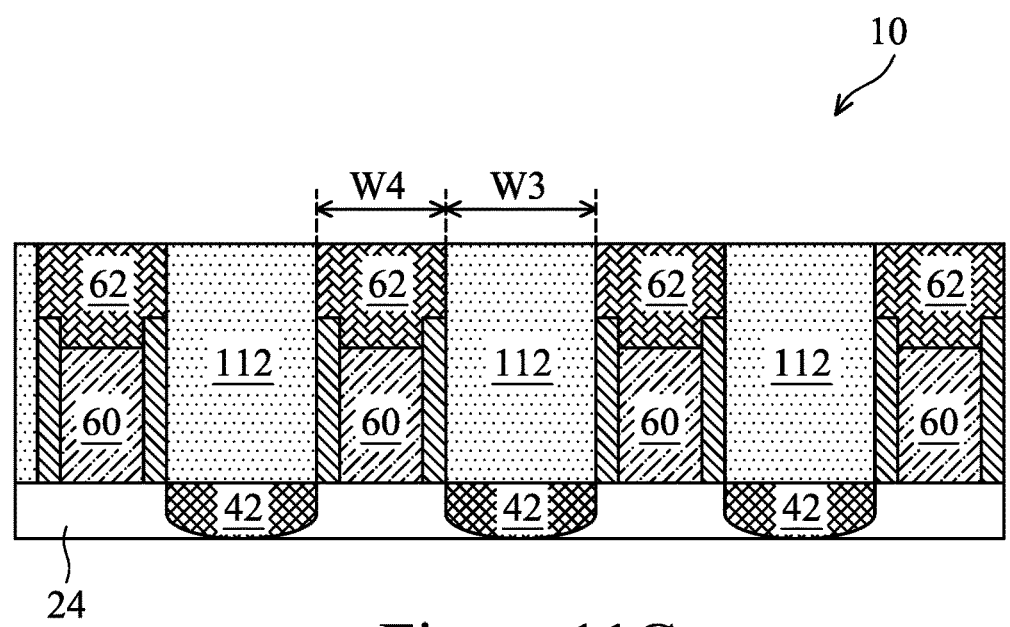

In FIGS. 11A through 11C, a planarization process, such as a CMP, is performed on the contact material 112' to form source/drain contacts 112, in accordance with some embodiments. FIGS. 11A-11C show similar views as FIGS. 10A-10C. In some embodiments, the planarization removes the hard mask layer 66, the second ILD 64, and upper portions of the contact material 112'. The remaining liner and conductive material form the source/drain contacts 112. The planarization process may also thin the first ILD 48, in some embodiments. After the planarization process, the top surfaces of the source/drain contacts 112 may be substantially level with the top surfaces of the first ILD 48.

Although not explicitly shown, a person having ordinary skill in the art will readily understand that further processing steps may be performed on the structures in FIGS. 11A-C. For example, gate contacts may be formed to contact the gate stack 60, or various Inter-Metal Dielectrics (IMD) and their corresponding metallizations may be formed over the first ILD 48. An embodiment including gate contacts 612A, source/drain contacts 612B formed in a second ILD 614, and metal lines 616 formed in an IMD 618 is described below for FIGS. 32A-35C.

As shown in FIGS. 11A-11C, the source/drain contacts 112 may be separated in the B-B direction by cut regions 111 comprising the first ILD 48. In some embodiments, a cut region 111 may have a cut length D2 (in the B-B direction) that is between about 15 nm and about 220 nm, though other lengths are possible. In some cases, forming cut regions 111 using the techniques described herein can allow for a smaller cut length D2, which can increase the contact area of source/drain contacts 112, which can improve contact resistance and reduce sensitivity to process variations. Forming cut regions 111 as described herein may also allow for a smaller minimum separation distance D1 between cut regions 111 without increased risk of bridging during photolithographic or etching steps. In this manner, the density, pitch, yield, and electrical performance of a device can be improved. In some embodiments, a source/drain contacts 112 may have a length D3 (in the B-B direction) that is between about 25 nm and about 500 nm, though other lengths are possible. In some embodiments, the source/drain contacts 112 may have a width W3 (in the C-C direction) that is between about 15 nm and about 50 nm, though other widths are possible. In some embodiments, the source/drain contacts 112 may be separated by a width W4 (in the C-C direction) that is between about 9 nm and about 30 nm, though other widths are possible. In some cases, the width W4 is about the same as the width W1 (see FIG. 2C).

In some cases, photolithographic or etching steps may form a cut mask 76 having rounded corners. By forming a cut mask 76 having serpentine portions 76S with an angle A1 greater than about 60° (e.g., having relatively perpendicular sections), the cut mask 76 may be formed having less rounding, and the area of the cut regions 111 may be formed having a smaller area. By forming cut regions 111 with a smaller area, the area of the source/drain contacts 112 may be correspondingly increased. Increasing the area of the source/drain contacts 112 can increase conductivity and can increase the contact area between the source/drain contacts 112 and the epitaxial source/drain regions 42, which can reduce contact resistance. Additionally, by forming cut regions 111 with less rounding and with a smaller area, the cut regions 111 can be patterned more densely without increasing the risk of the cut regions 111 being incompletely separated (e.g. "bridging") during photolithography and etching steps. For example, by reducing the rounding or area of the cut regions 111, the cut regions 111 may be formed having a smaller separation distance D1 (see FIG. 4A). In this manner, finer feature sizes may be formed without decreasing yield or device reliability.

Figure 12:
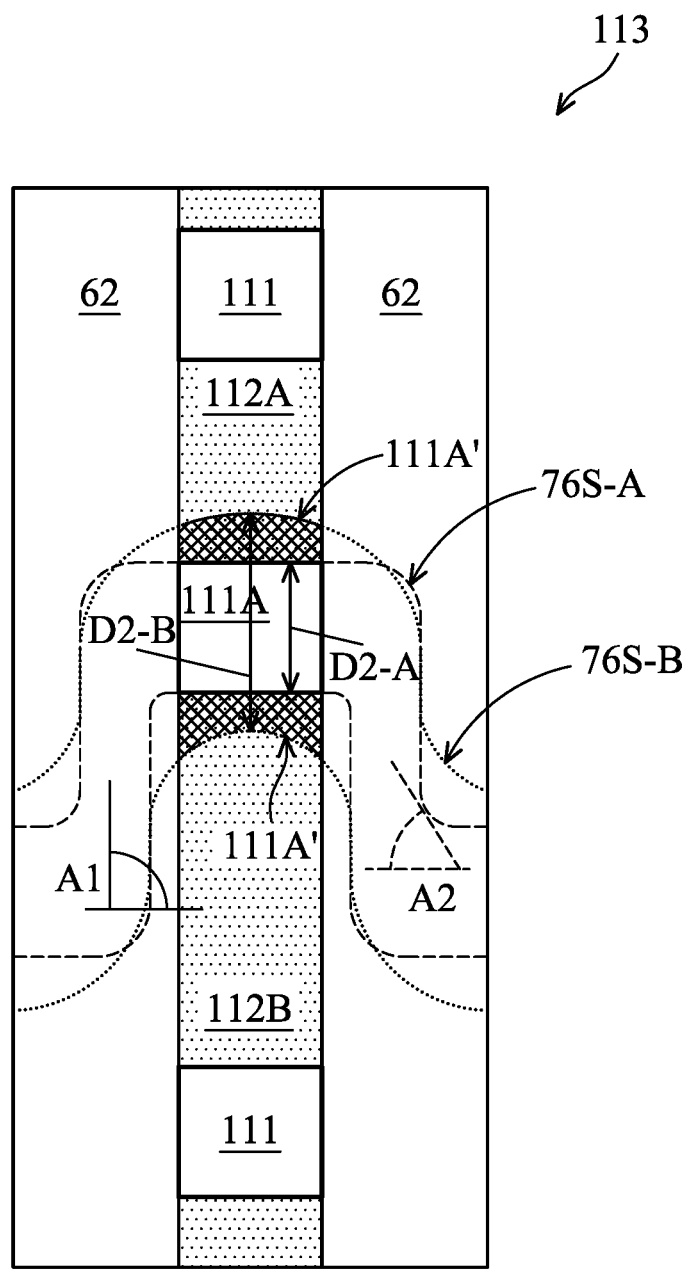
FIGS. 12 and 13 illustrate plan views of cut regions in the source/drain contacts of a FinFET device, in accordance with some embodiments.

This area increase of the source/drain contacts 112 is illustrated in FIG. 12, which shows an example plan view of a region similar to the region 113 labeled in FIG. 11A. The region 113 shown in FIG. 12 includes source/drain contacts 112 separated by cut regions 111. An example cut region 111A is shown separating source/drain contacts 112A and 112B. For explanatory purposes, FIG. 12 also shows an outline of a serpentine portion 76S-A of a cut mask having a relatively more perpendicular angle A1 (e.g., greater than about 60°) and an outline of a serpentine portion 76S-B of a cut mask having a relatively less perpendicular angle A2 (e.g., less than about 60°).

In some embodiments, by using a serpentine portion 76S-A having a steeper angle A1, rounding during photolithographic and etching steps can be reduced, and a cut region 111 can be formed having a smaller cut length D2. In some cases, a shallower angle A2 of the serpentine portion 76S-B can result in increased rounding of the cut mask 76 during photolithographic patterning, which can result in an increased cut length D2-B. A rounded cut mask 76 can result in a cut region 111A having rounded regions 111A' (shown with a hashed pattern in FIG. 12). The rounded regions 111A' can increase the cut length of the cut region 111A, shown in FIG. 12 by the larger cut length D2-B. In some embodiments, the use of a serpentine portion 76S-A having a steeper angle A1 can result in reduced rounding of the cut mask 76, which can reduce the size of the rounded regions 111A'. Without the presence of the rounded regions 111A', a cut region 111A having a smaller cut length can be formed, shown in FIG. 12 by the shorter cut length D2-A.

For the example shown in FIG. 12, using the serpentine portion 76S-A instead of the serpentine portion 76S-B increases the area of the source/drain contacts 112A and 112B by reducing the size of the rounded regions 111A' and reducing the cut length D2. Thus, in some embodiments, using a cut mask 76 having a relatively greater angle A1 can form source/drain contacts 112 having a larger area and smaller cut length D2 than using a cut mask 76 having a relatively smaller angle A2. In some embodiments, the angle A1 may be greater than about 60°, though other angles are possible. In some embodiments, a cut region 111 may be formed with little or no rounding, and thus may be formed having substantially straight sides (e.g. as shown by cut region 111A). In some embodiments, a cut region 111 may be formed having a rounded region 111A' on one side but not the other. For example, the rounded region 111A' at the source/drain contact 112B may be formed for cut region 111A, but the rounded region 111A' at the source/drain contact 112A not be formed for the same cut region 111A. In this manner, a cut section 76C (and the resulting cut region iii) may have one straight side and one convex concave side. In other cases, a cut section 76C (and the resulting cut region iii) may have one straight side and one convex side, one concave side and one convex side, or two convex sides. Increasing the area of the source/drain contacts 112 by using a larger angle A1 as described herein can improve device performance by increasing conductivity and reducing contact resistance.

Figure 13:
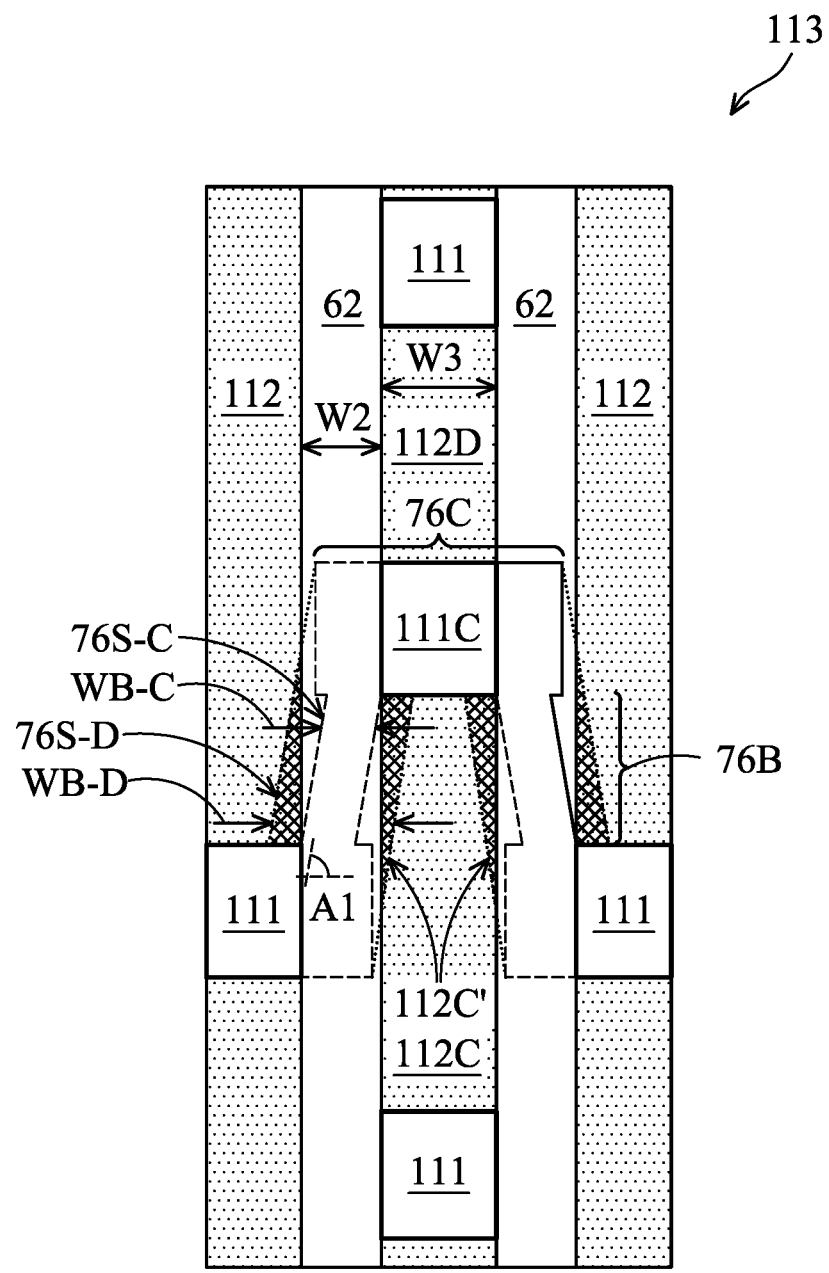

In some cases, using serpentine portions 76S having bridge sections 76B with a smaller width WB can form source/drain contacts 112 having a larger area. This area increase of the source/drain contacts 112 is illustrated in FIG. 13, which shows an example plan view of a region similar to the region 113 labeled in FIG. 11A (note the region shown in FIG. 13 is wider in the C-C direction than region 113). The region 113 shown in FIG. 13 includes source/drain contacts 112 separated by cut regions 111. An example cut region 111C is shown separating source/drain contacts 112C and 112D. For explanatory purposes, FIG. 13 also shows an outline of a serpentine portion 76S-C of a cut mask having a relatively small width WB-C and an outline of a serpentine portion 76S-D of a cut mask having a relatively large width WB-D.

As shown in FIG. 13, the larger width WB-D of the bridge sections 76B can cause the serpentine portion 76S-D to overlap the source/drain contacts 112. The regions where the serpentine portion 76S-D overlaps the source/drain contacts 112 are indicated by the overlapping regions 112C' (shown with a hashed pattern in FIG. 13). The cut region 111C is formed in the overlapping regions 112C', and thus the presence of overlapping regions 112C' can reduce the area of the subsequently formed source/drain contacts 112. By forming a serpentine portion 76S-C having a smaller width WB-C, the size of the overlapping regions 112C' is reduced or eliminated. In this manner, a reduction in source/drain contact 112 area due to the overlapping regions 112C' can be avoided. In some embodiments, the width WB is between about 0.016% and about 100% of the width W2, though other percentages are possible. In some cases, the width WB may be determined from the angle A1. As described previously, forming source/drain contacts 112 having a larger area can improve device performance by increasing conductivity and reducing contact resistance.

FIGS. 1A through 11C show an embodiment in which a cut mask 76 having serpentine portions 76S is used to form cut regions 111 between source/drain contacts 112. The serpentine portions 76S have bridge sections 76B that are approximately perpendicular to adjacent cut sections 76C, which can allow, for example, for source/drain contacts 112 having larger areas. However, a cut mask having perpendicular serpentine portions may be used to form "cuts" in other features or structures. FIGS. 14A through 35C illustrate example process flows for forming "cuts" in other features during the formation of a FinFET device similar to that shown in FIGS. 1A-11C, in accordance with some embodiments. The process flows in FIGS. 14A-35C use serpentine patterns having approximately orthogonal sections, similar to the serpentine portion 76S. One or more of the process flows shown in FIGS. 14A-35C may be used during the formation of a device such as that shown in FIGS. 11A-C. FIGS. 14A through 18C illustrate intermediate steps in the formation of cut regions 211 in fins 24 prior to the formation of STI regions 22. FIGS. 19A through 23C illustrate intermediate steps in the formation of cut regions 311 in fins 24 after the formation of STI regions 22. FIGS. 24A-27C illustrate intermediate steps in the formation of cut regions 411 in the dummy gate stacks 30. FIGS. 28A-31C illustrate intermediate steps in the formation of cut regions 511 in the replacement gate stacks 60. FIGS. 32A-35C illustrate intermediate steps in the formation of cut regions 611 in metal lines 616A-B. The process flows shown in FIGS. 14A-35C are illustrative examples, and the techniques described herein and variations thereof may be combined or used for forming other structures. While island portions of cut patterns (e.g., similar to island portions 74I shown in FIG. 4A) are not shown in FIGS. 14A-35C, it will be appreciated that cut patterns may include various arrangements or combinations of island portions and/or serpentine portions.

FIGS. 14A through 18C illustrate the formation of cut regions 211 in fins 24, in accordance with some embodiments. FIGS. 14A, 15A, 16A, 17A, and 18A show a plan view of a wafer 200. FIGS. 14B, 15B, 16B, 17B, and 18B illustrate a cross-sectional view along the reference cross-section D-D indicated in FIG. 14A, which also corresponds to the reference cross-section D-D indicated in FIG. 1A. FIGS. 14C, 15C, 16C, 17C, and 18C illustrate a cross-sectional view along the reference cross-section C-C indicated in FIG. 14A, which also corresponds to the reference cross-section C-C indicated in FIG. 1A.

Figure 14A:
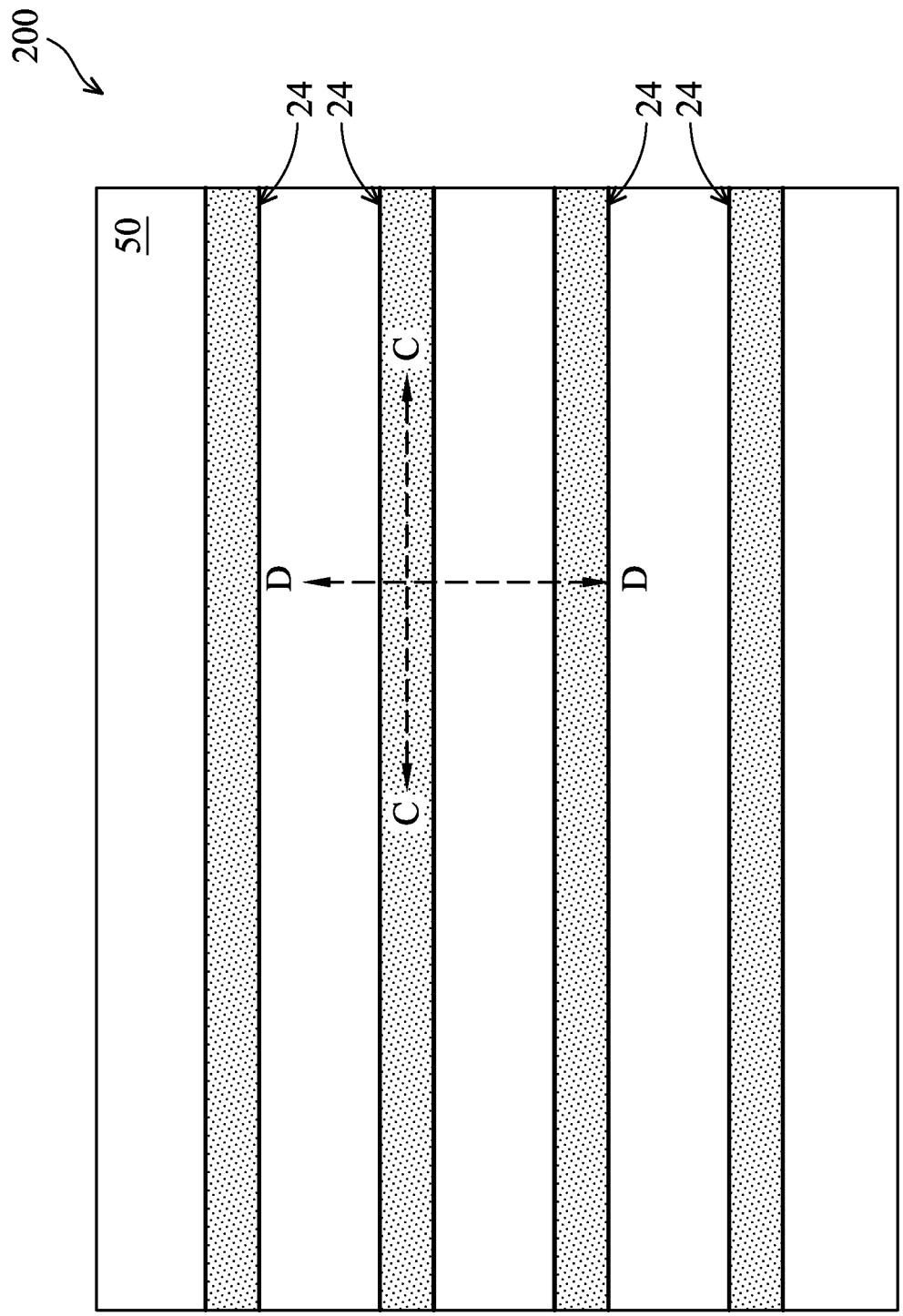
FIGS. 14A, 14B, 14C, 15A, 15B, 15C, 16A, 16B, 16C, 17A, 17B, 17C, 18A, 18B, and 18C illustrate cross-sectional views and plan views of intermediate stages in the formation of cut regions in the fins of a FinFET device, in accordance with some embodiments.
Figure 14C:
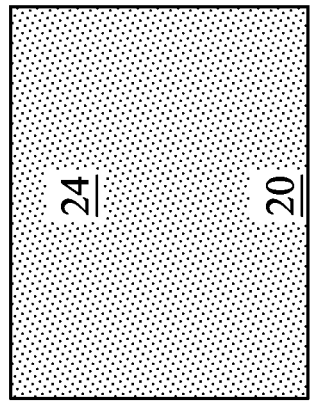
Figure 14B:
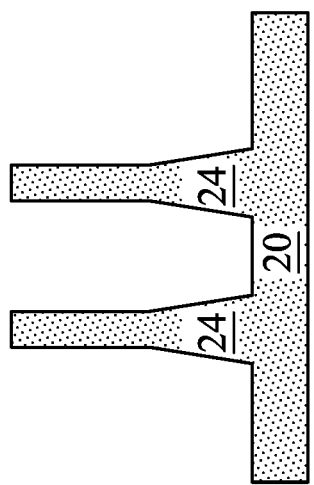
Figure 15A:
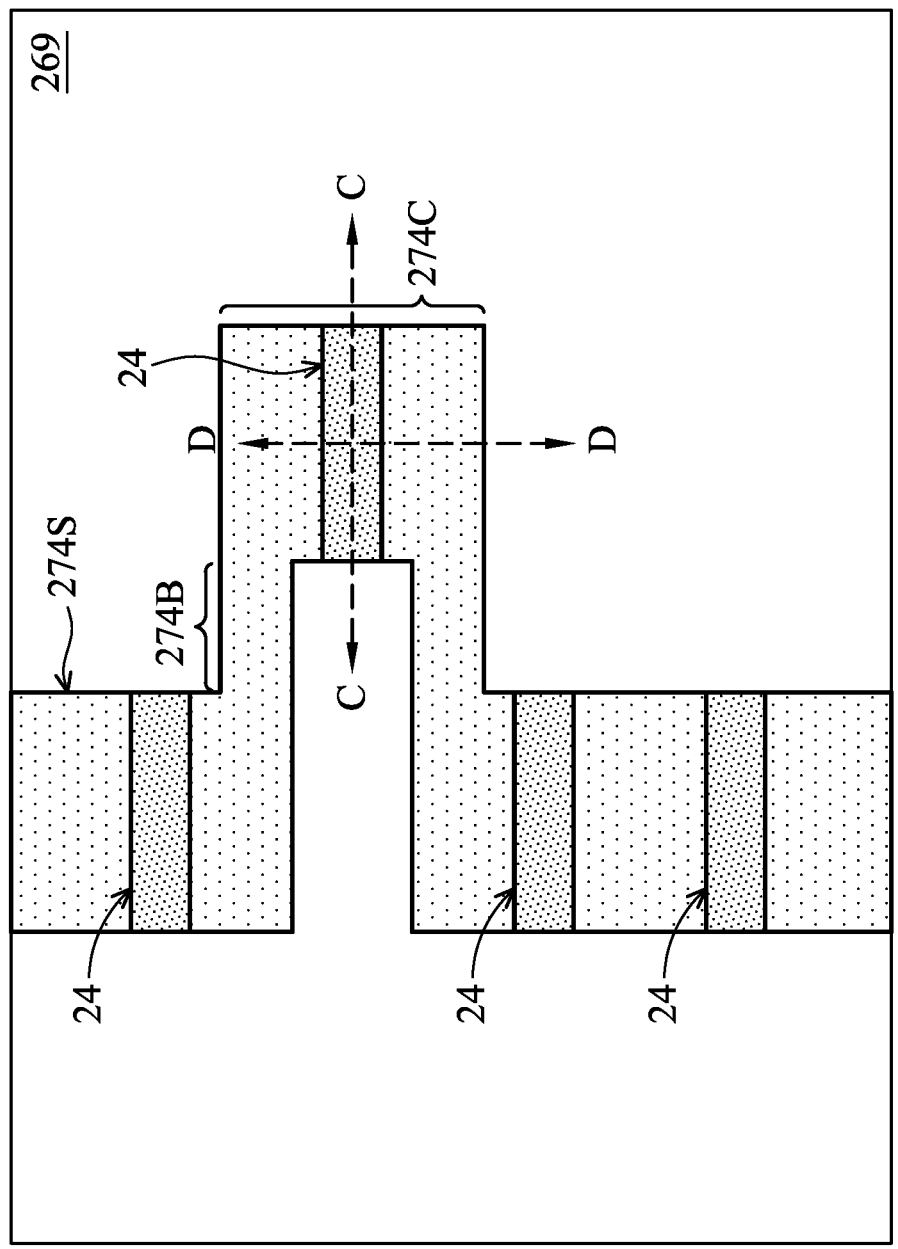
Figure 15C:
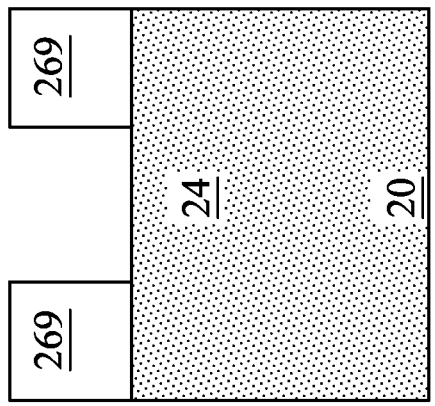
Figure 15B:
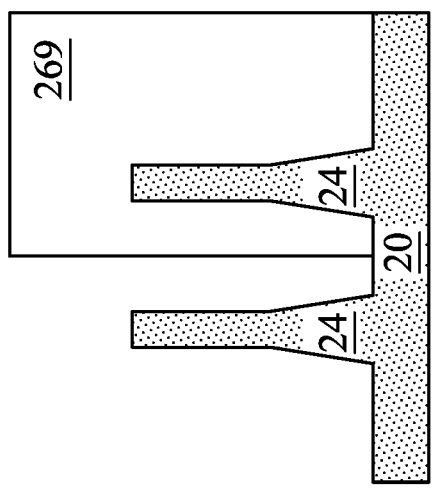

FIGS. 14A-C show the wafer 200 with fins 24 formed in the substrate 50. The fins 24 may be formed in a manner similar to that described previously for FIG. 1A. In FIGS. 15A-C, a photoresist structure 269 is formed and patterned to have an opening in a serpentine pattern 274S. The photoresist structure 269 may be similar to the photoresist structure 69 shown in FIGS. 4A-C, and may be formed in a similar manner. As shown in FIG. 15A, the serpentine pattern 274S includes bridge sections 274B and cut sections 274C that may be approximately orthogonal to each other, similar to the serpentine portion 74S shown in FIGS. 4A-C. The serpentine pattern 274S exposes regions of the fins 24 where cut regions 211 (see FIGS. 16A-C) are to be formed. The serpentine pattern 274S may be formed in the photoresist structure 269 using suitable photolithographic techniques.

Figure 16A:
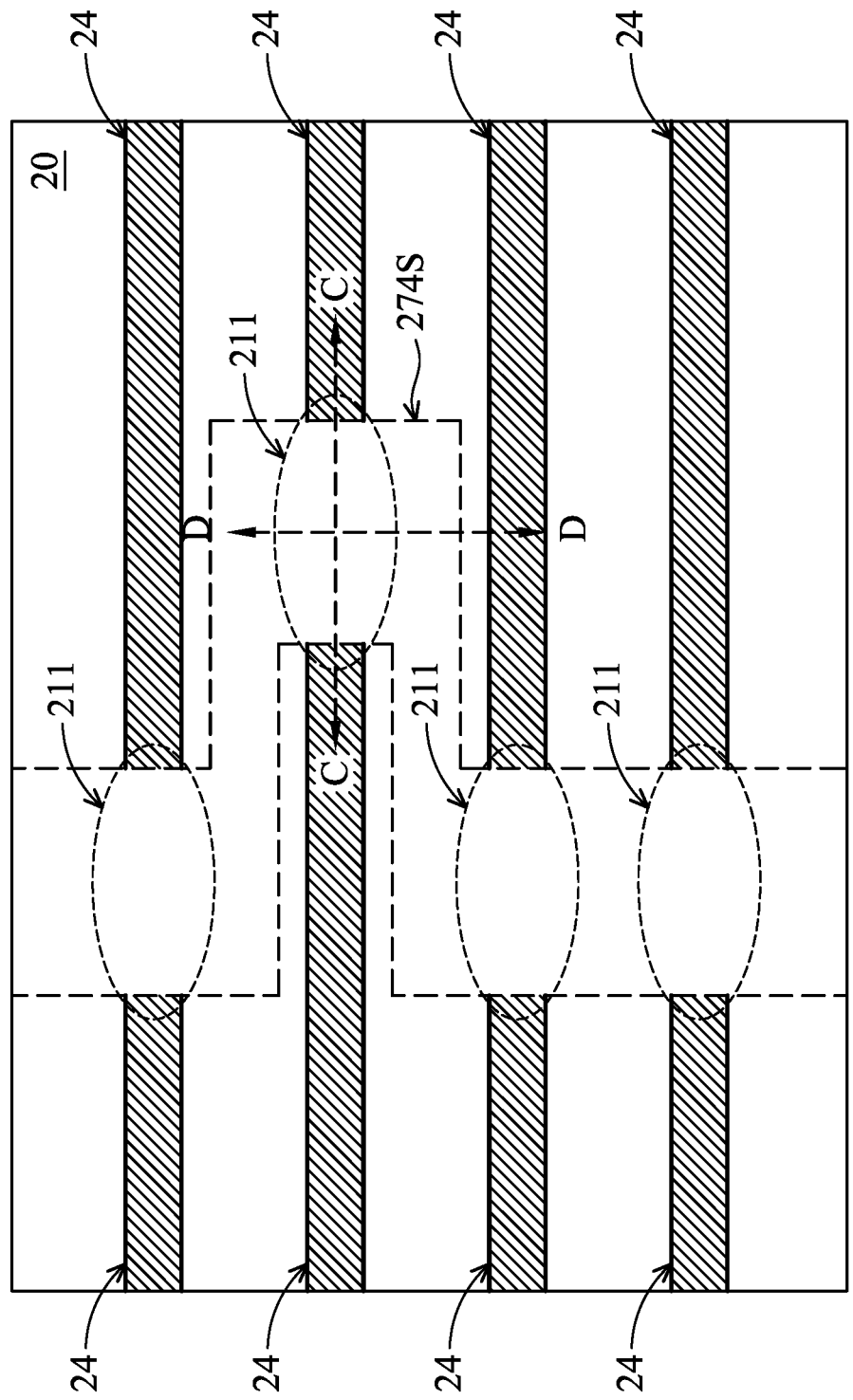
Figure 16C:
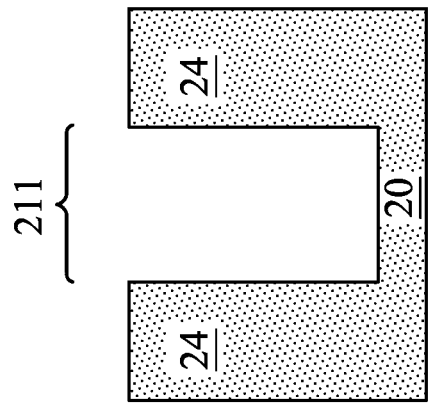
Figure 16B:
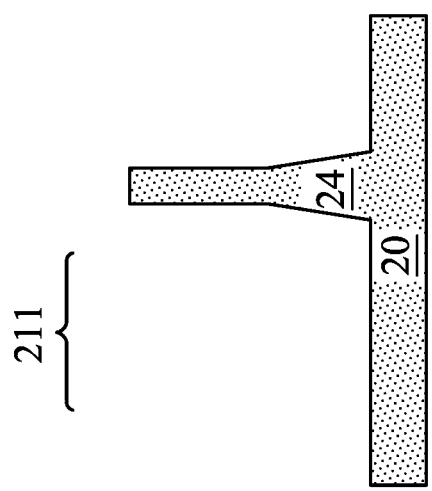

In FIGS. 16A-C, an etching process is performed using the patterned photoresist structure 269 as an etching mask to etch the fins 24 and form cut regions 211. For reference, the serpentine pattern 274S is shown in FIG. 16A. The etching process may include one or more suitable etching processes, such as dry etching process and/or wet etching processes. The cut regions 211 are regions where the fins 24 have been removed, and are defined by the serpentine pattern 274S.

Figure 17A:
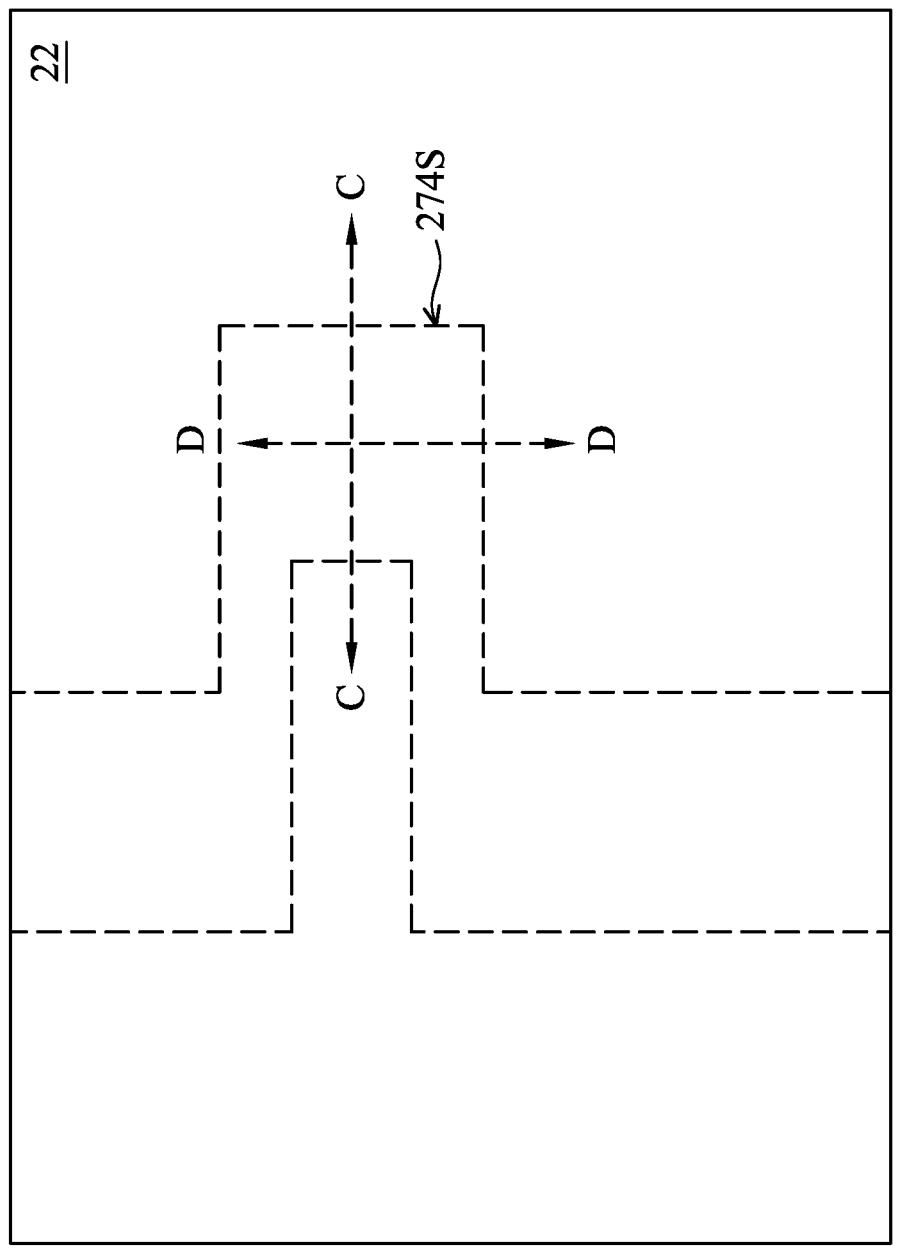
Figure 17B:
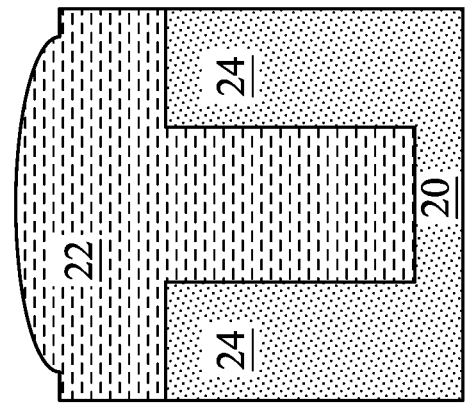
Figure 17C:
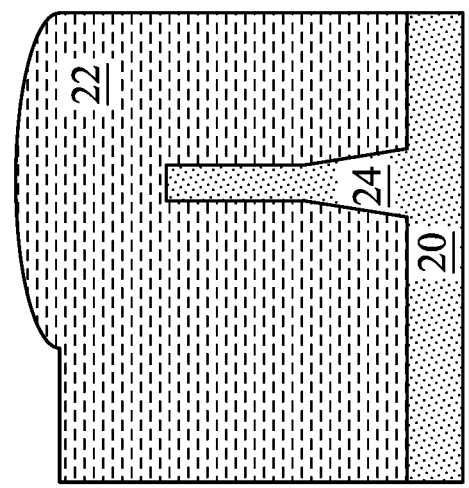
Figure 18A:
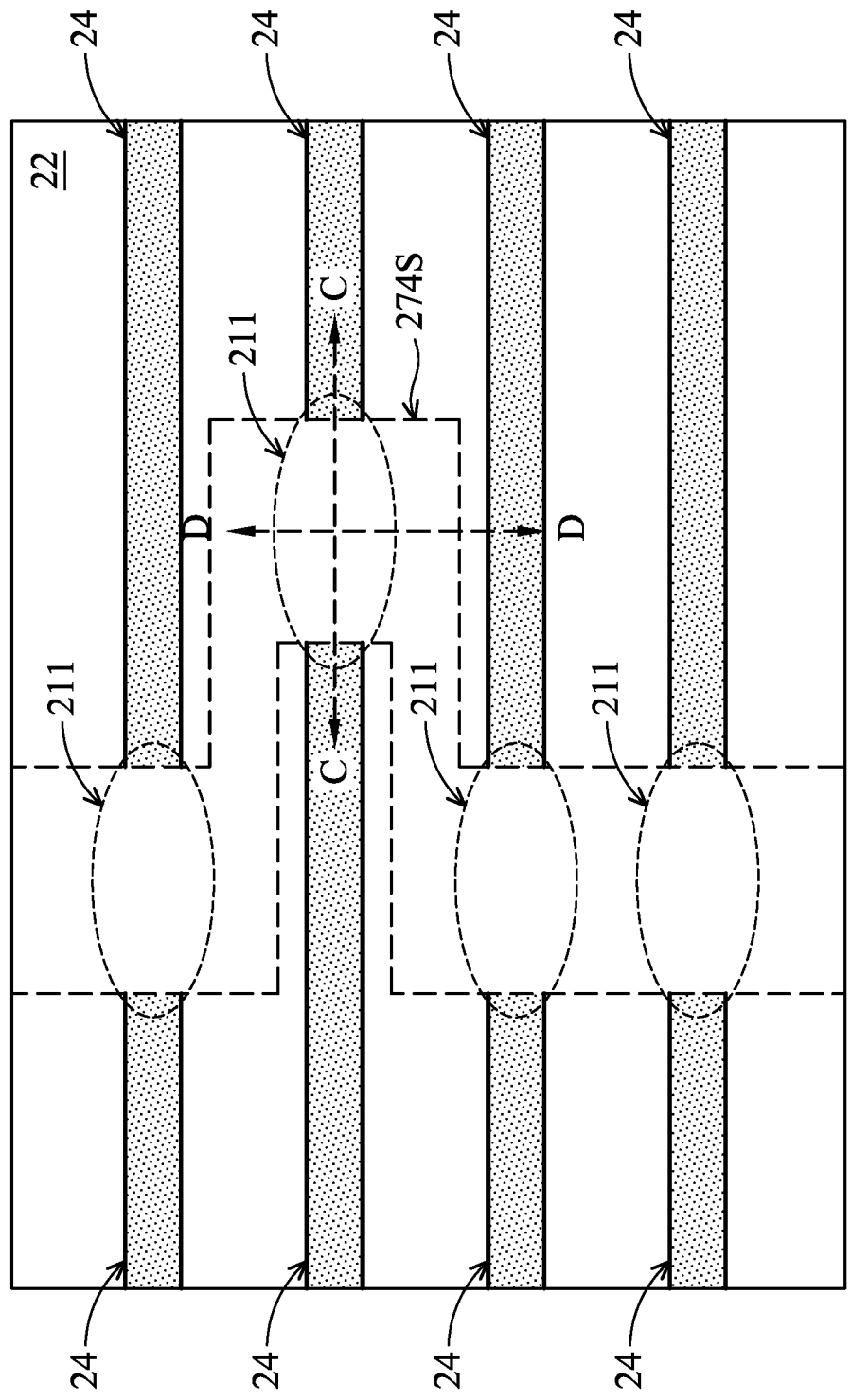
Figure 18C:
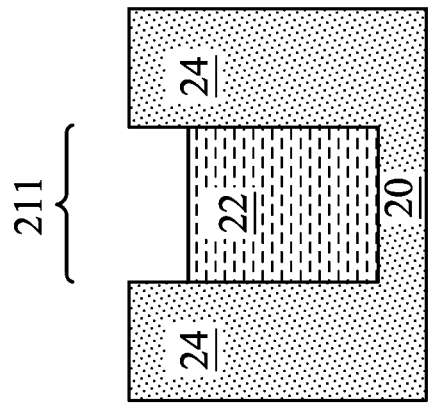
Figure 18B:
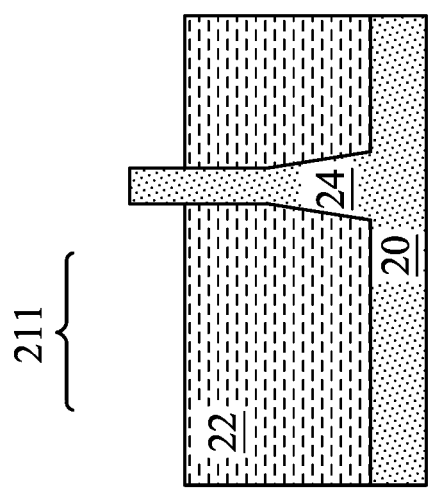

In FIGS. 17A-C, an insulating material 22 is deposited over the wafer 200 and within the cut regions 211. The insulating material 22 may be similar to the material of the STI regions 22 described for FIG. 1A, and may be formed in a similar manner. In FIGS. 18A-C, the insulating material 22 is recessed to form STI regions 22. The recessing may be similar to that described previously for FIG. 1A. The STI regions 22 surround the fins 24 and form cuts between the fins 24 in the cut regions 211. By forming cut regions 211 between fins 24 using a serpentine pattern 274S with approximately orthogonal sections, rounding can be reduced, which can decrease the separation distance between cut regions 211 without increasing the risk of process defects.

FIGS. 19A through 23C illustrate the formation of cut regions 311 in fins 24, in accordance with some embodiments. FIGS. 19A, 20A, 21A, 22A, and 23A show a plan view of a wafer 300. FIGS. 19B, 20B, 21B, 22B, and 23B illustrate a cross-sectional view along the reference cross-section D-D indicated in FIG. 19A, which also corresponds to the reference cross-section D-D indicated in FIG. 1A. FIGS. 19C, 20C, 21C, 22C, and 23C illustrate a cross-sectional view along the reference cross-section C-C indicated in FIG. 19A, which also corresponds to the reference cross-section C-C indicated in FIG. 1A.

Figure 19A:
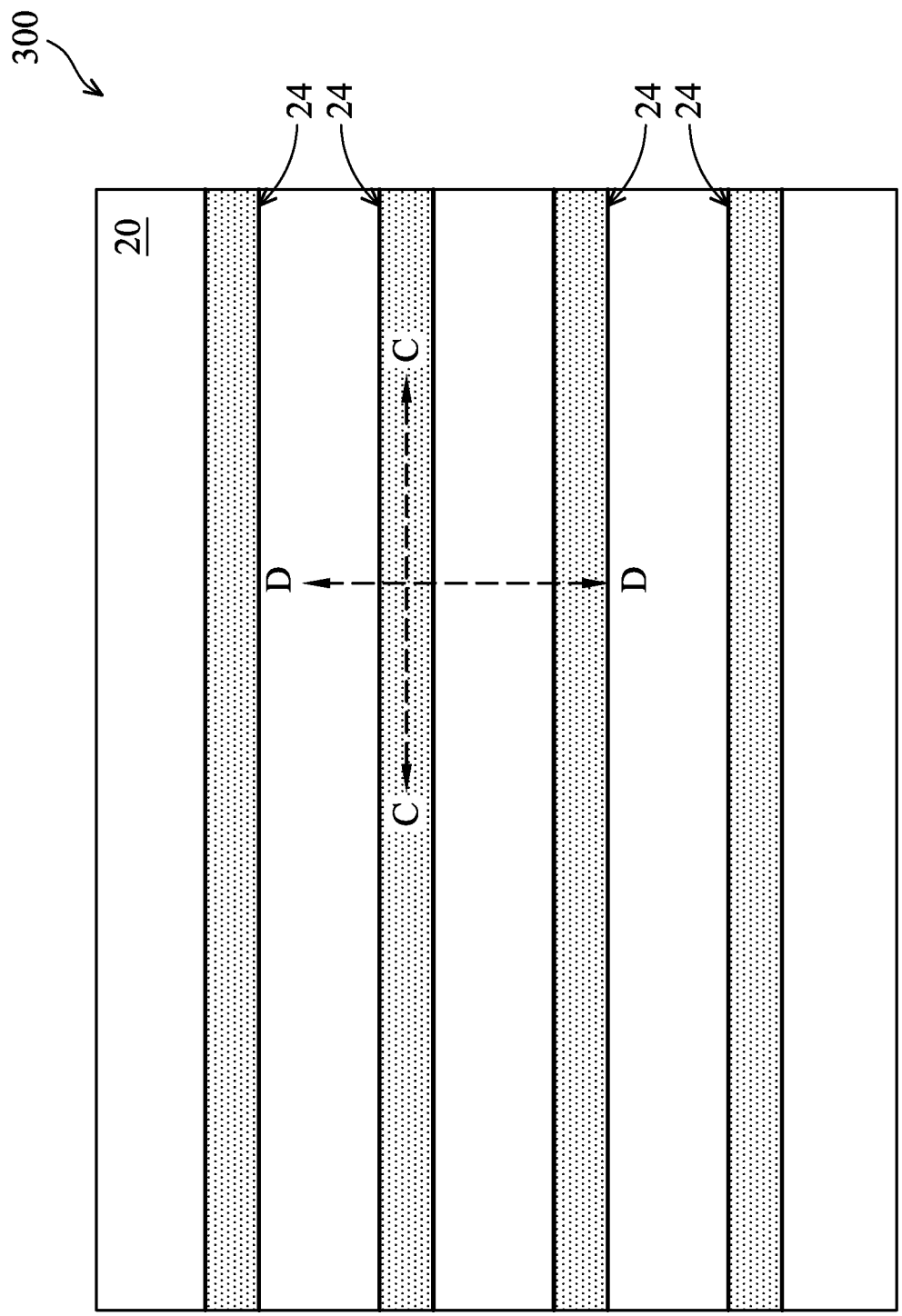
FIGS. 19A, 19B, 19C, 20A, 20B, 20C, 21A, 21B, 21C, 22A, 22B, 22C, 23A, 23B, and 23C illustrate cross-sectional views and plan views of intermediate stages in the formation of cut regions in the fins of a FinFET device, in accordance with some embodiments.
Figure 19C:
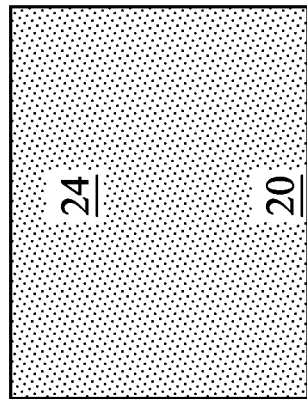
Figure 19B:
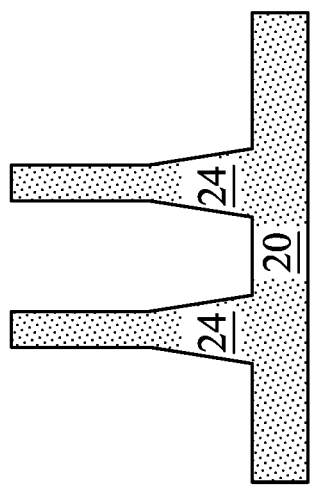
Figure 20A:
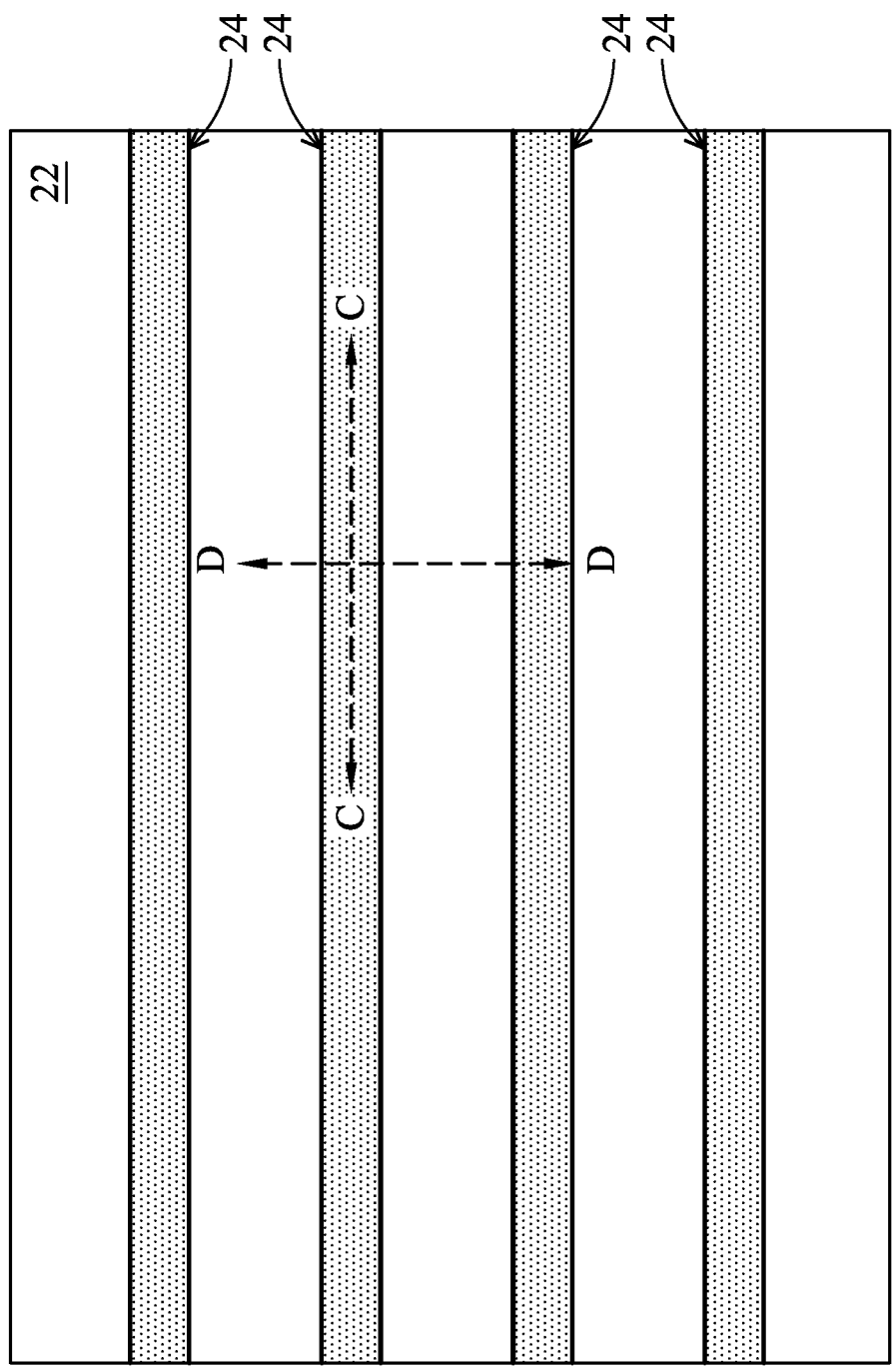
Figure 20C:
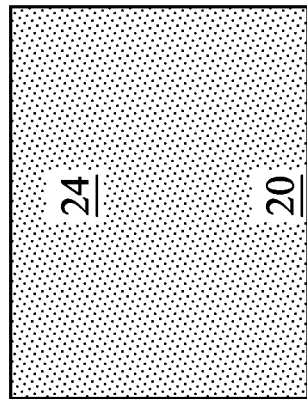
Figure 20B:
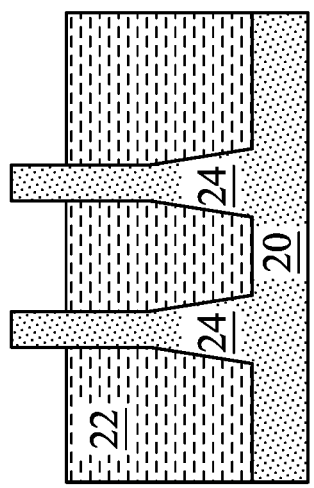
Figure 21A:
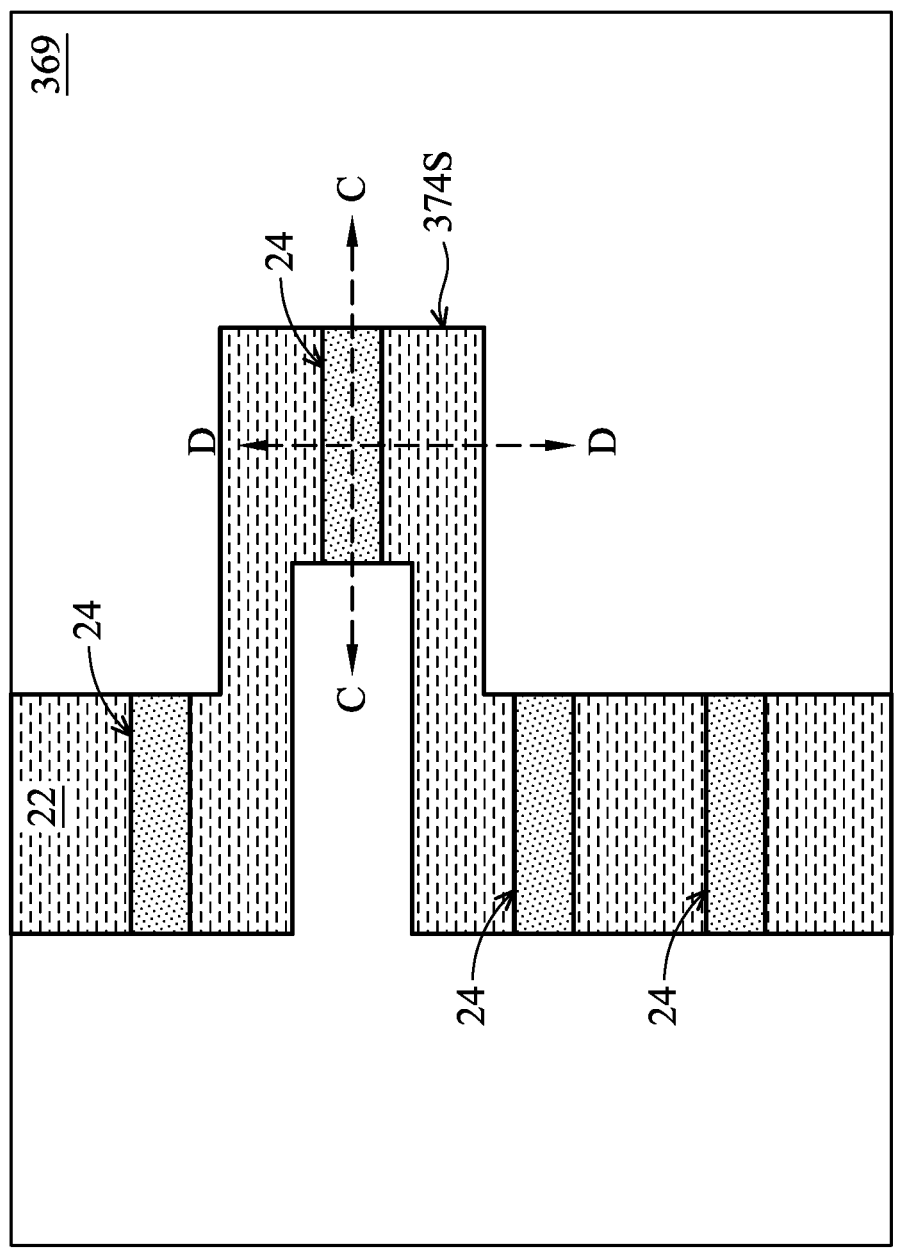
Figure 21B:
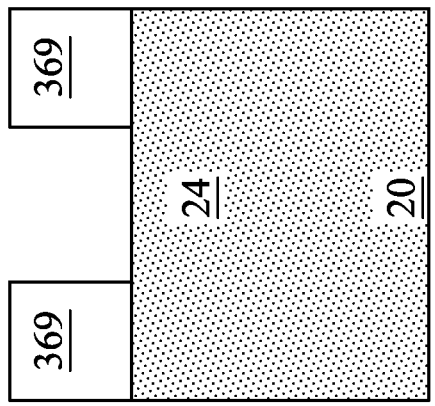
Figure 21C:
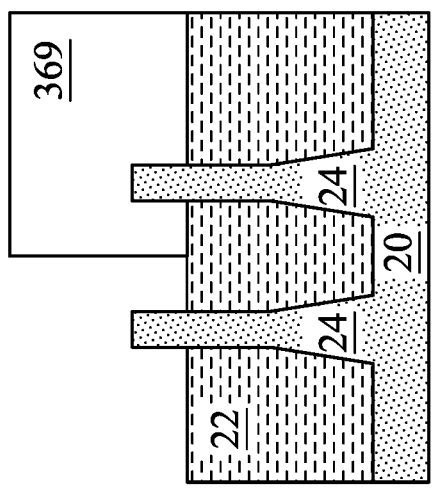

FIGS. 19A-C show the wafer 300 with fins 24 formed in the substrate 50, in accordance with some embodiments. The fins 24 may be formed in a manner similar to that described previously for FIG. 1A, or in FIGS. 14A-16C. In FIGS. 20A-C, STI regions 22 are formed surrounding the fins 24. The STI regions 22 may be formed in a manner similar to that described previously for FIG. 1A. In FIGS. 21A-C, a photoresist structure 369 is formed and patterned to have an opening in a serpentine pattern 374S. The photoresist structure 369 may be similar to the photoresist structure 69 shown in FIGS. 4A-C, and may be formed in a similar manner. As shown in FIG. 21A, the serpentine pattern 374S includes sections that may be approximately orthogonal to each other, similar to the serpentine portion 74S shown in FIGS. 4A-C and the serpentine pattern 274S shown in FIG. 16A. The serpentine pattern 374S exposes regions of the fins 24 where cut regions 311 (see FIGS. 22A-C) are to be formed. The serpentine pattern 374S may be formed in the photoresist structure 369 using suitable photolithographic techniques.

Figure 22A:
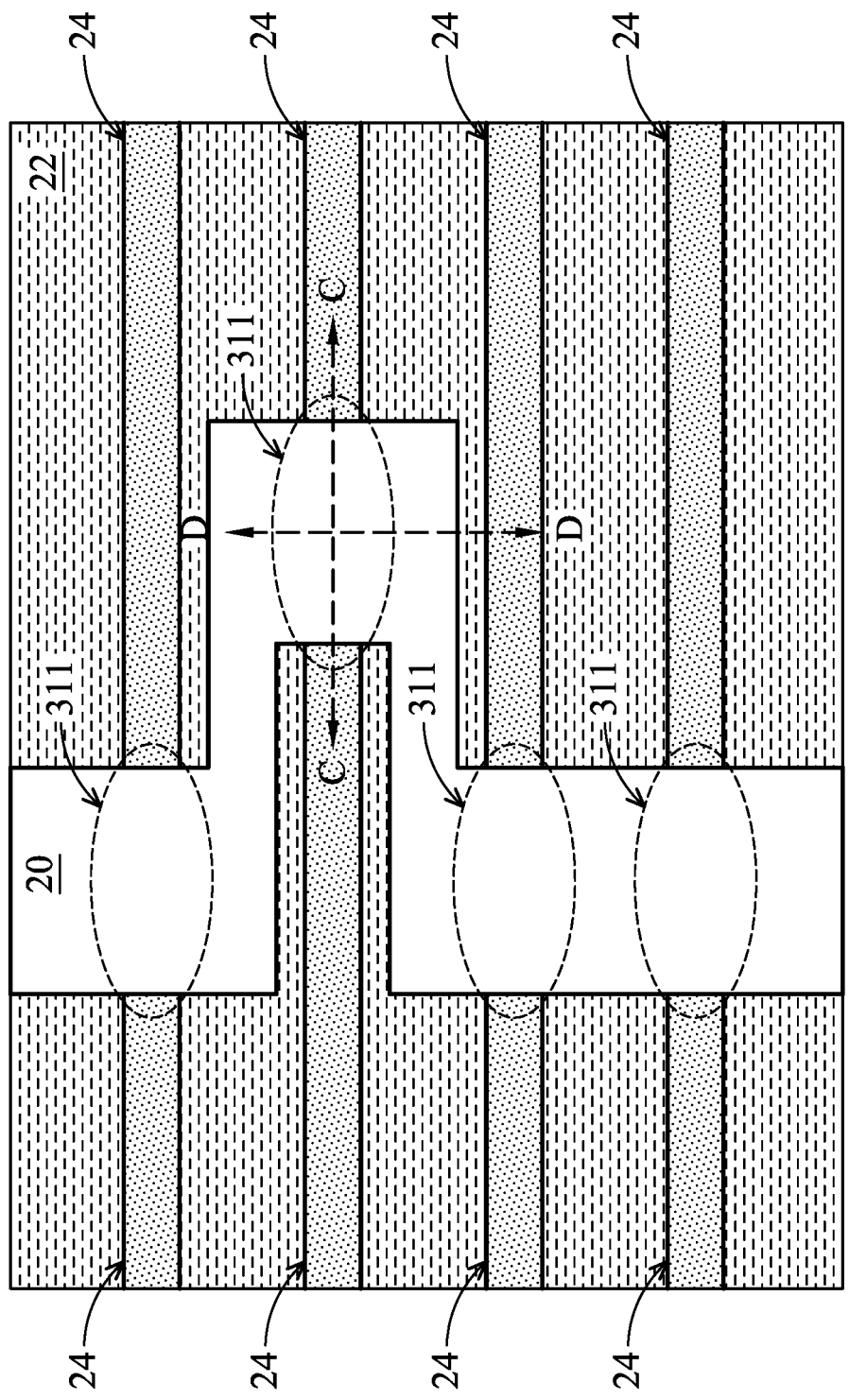
Figure 22C:
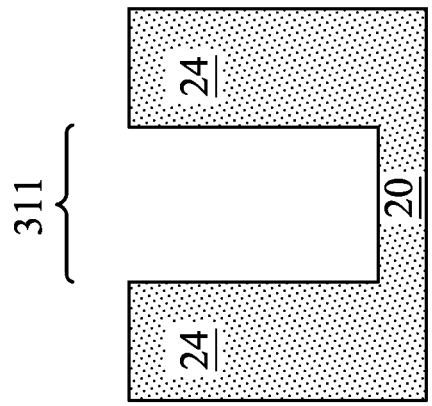
Figure 22B:
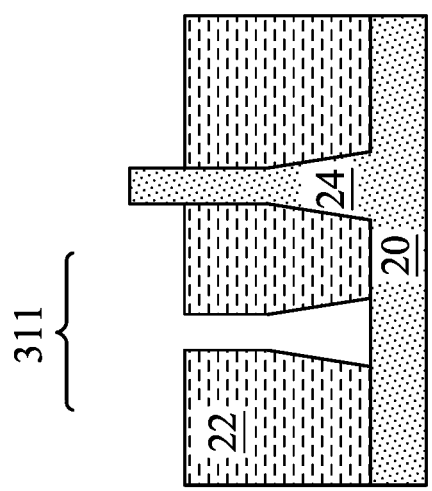

In FIGS. 22A-C, an etching process is performed using the patterned photoresist structure 369 as an etching mask to etch the fins 24 and form cut regions 311. In some embodiments, the etching process may selectively etch the fins 24 over etching the STI regions 22, as shown in FIG. 22B. The etching process may include one or more suitable etching processes, such as dry etching process and/or wet etching processes. The cut regions 311 are regions where the fins 24 have been removed, and are defined by the serpentine pattern 374S.

Figure 23A:
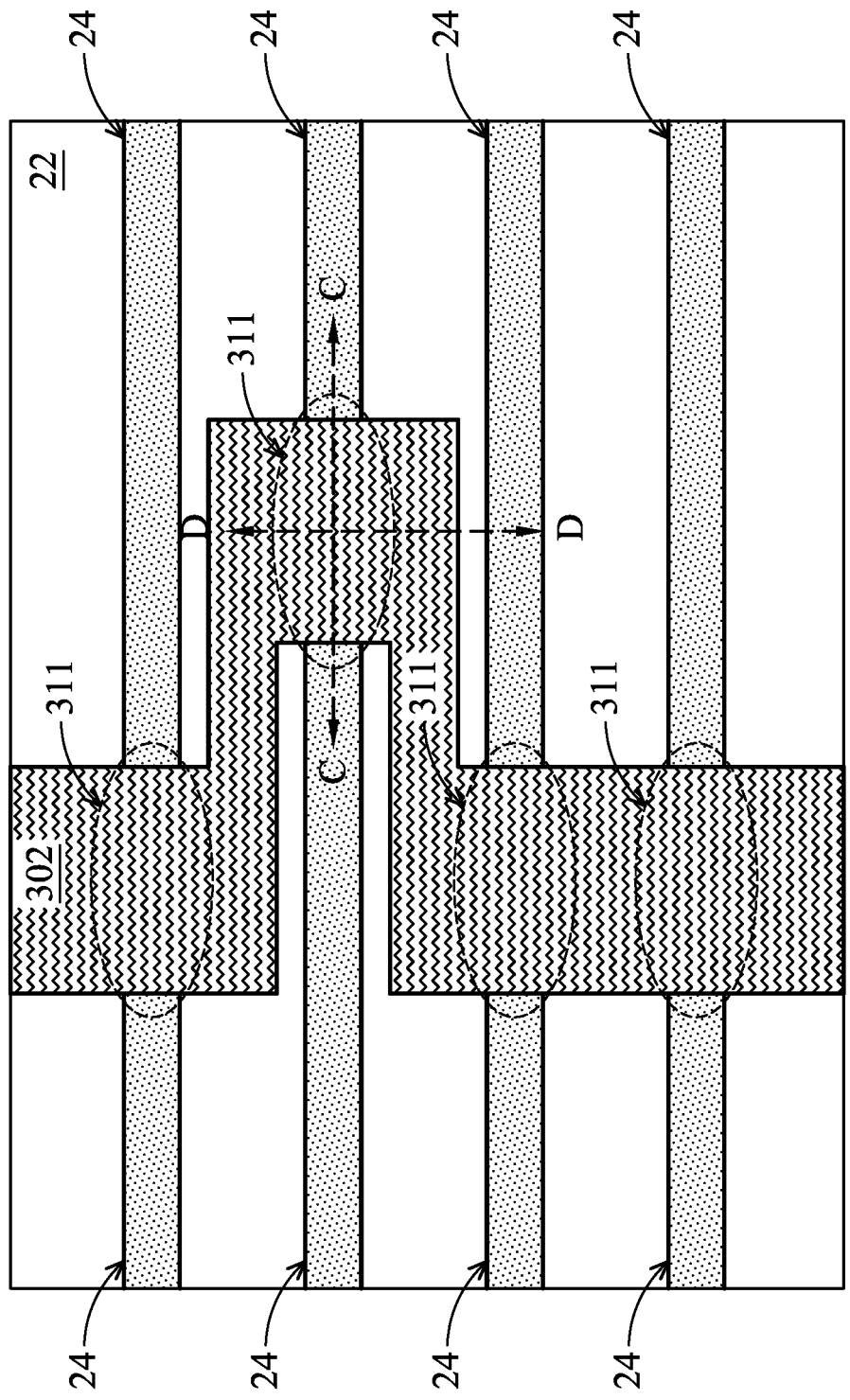
Figure 23C:
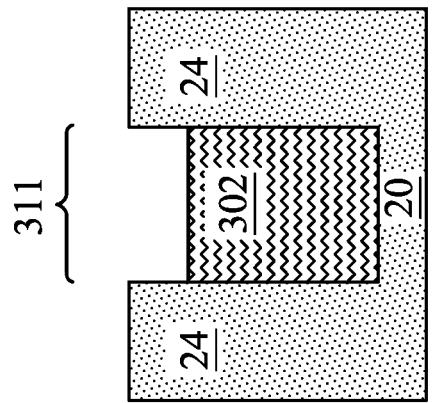
Figure 23B:
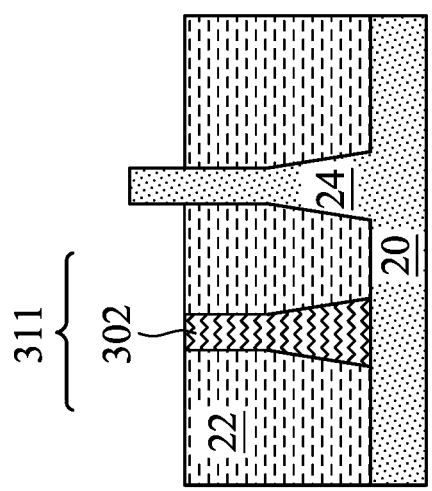

In FIGS. 23A-C, a fill material 302 is deposited over the wafer 300 and within the cut regions 311. The fill material 302 may include one or more suitable dielectric materials, such as an oxide, a nitride, the like, or a combination thereof. The fill material 302 may be deposited using suitable processes. In some embodiments, an etch back process is performed to remove upper portions of the fill material 302, as shown in FIGS. 23B-C. The etch back process may include one or more suitable etching processes, such as dry etching process and/or wet etching processes. By forming cut regions 311 between fins 24 using a serpentine pattern 374S with approximately orthogonal sections, rounding can be reduced, which can decrease the separation distance between cut regions 311 without increasing the risk of process defects.

FIGS. 24A through 27C illustrate the formation of cut regions 411 in the dummy gate stacks 30 (e.g., in the dummy gate dielectric 32 and dummy gate electrode 34), in accordance with some embodiments. FIGS. 24A, 25A, 26A, and 27A show a plan view of a wafer 400. FIGS. 24B, 25B, 26B, and 27B illustrate a cross-sectional view along the reference cross-section D-D indicated in FIG. 24A, which also corresponds to the reference cross-section D-D indicated in FIG. 1A. FIGS. 24C, 25C, 26C, and 27C illustrate a cross-sectional view along the reference cross-section E-E indicated in FIG. 24A, which also corresponds to the reference cross-section E-E indicated in FIG. 1A. Reference cross-section E-E is parallel to the longitudinal direction of the fins 24 (indicated in FIG. 24A by dashed outlines) but is located between the fins 24.

Figure 24A:
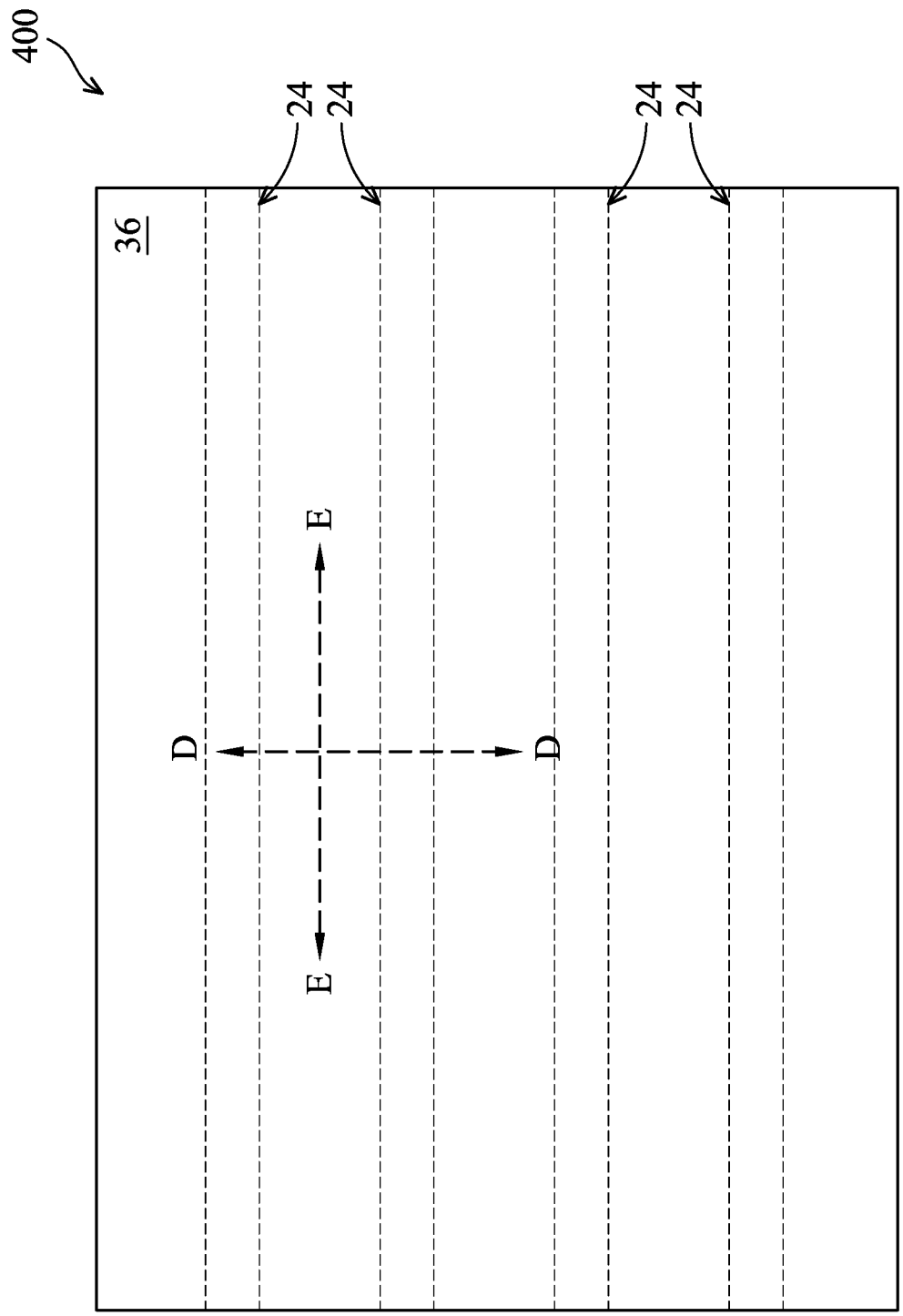
FIGS. 24A, 24B, 24C, 25A, 25B, 25C, 26A, 26B, 26C, 27A, 27B, and 27C illustrate cross-sectional views and plan views of intermediate stages in the formation of cut regions in the dummy gate stacks of a FinFET device, in accordance with some embodiments.
Figure 24C:
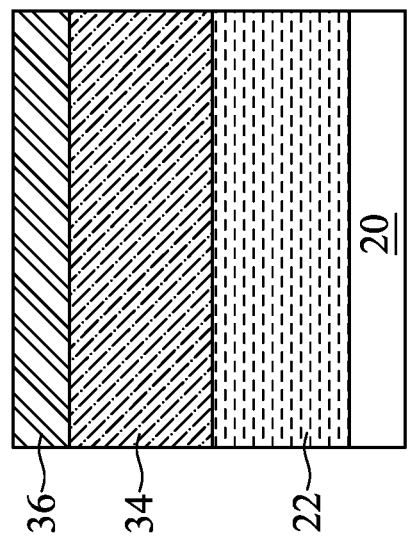
Figure 24B:
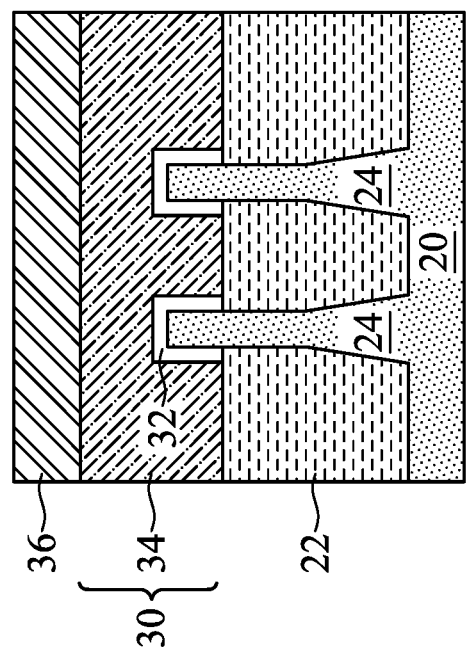
Figure 25A:
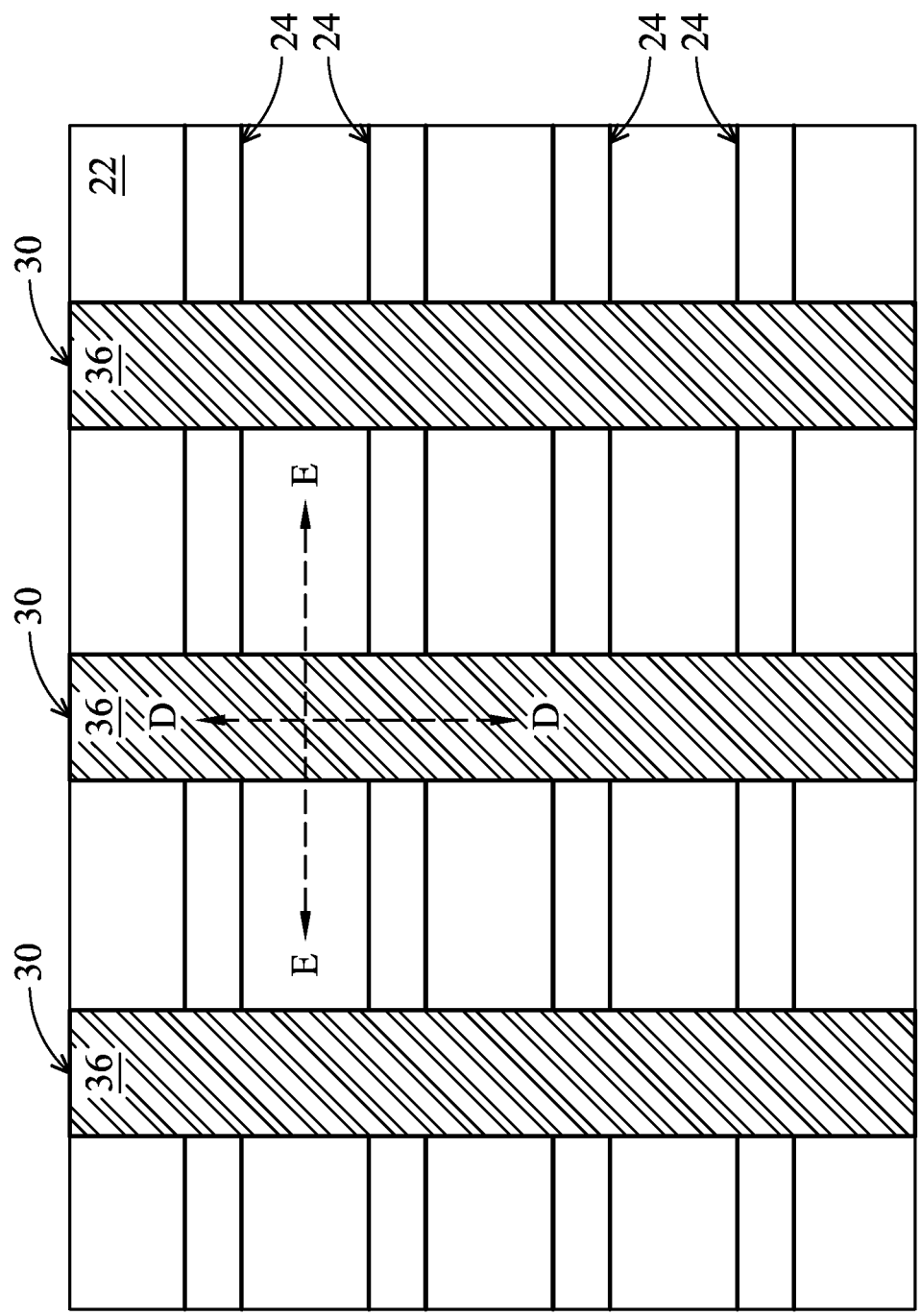
Figure 25C:
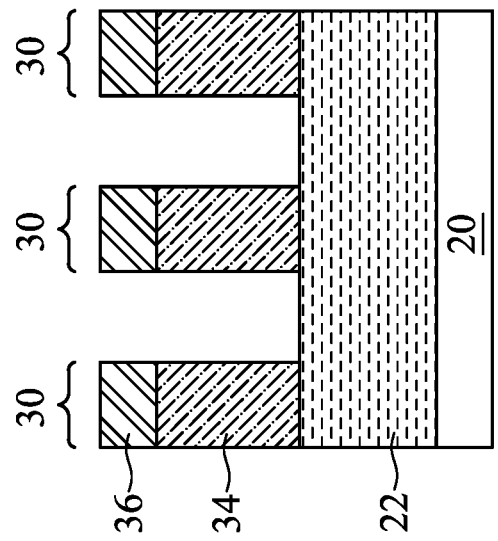
Figure 25B:
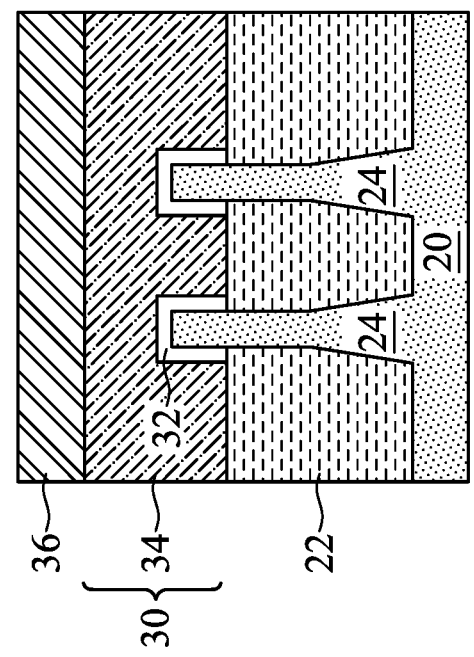

FIGS. 24A-C show the wafer 400 with a dummy gate dielectric 32, a dummy gate electrode 34, and a mask layer 36 formed over the fins 24. The dummy gate dielectric 32, the dummy gate electrode 34, and the mask layer 36 may be formed in a manner similar to that described previously for FIG. 1A. In FIGS. 25A-C, the dummy gate dielectric 32, the dummy gate electrode 34, and the mask layer 36 are patterned, forming dummy gate stacks 30. The dummy gate stacks 30 may be formed using suitable photolithography and etching techniques.

Figure 26A:
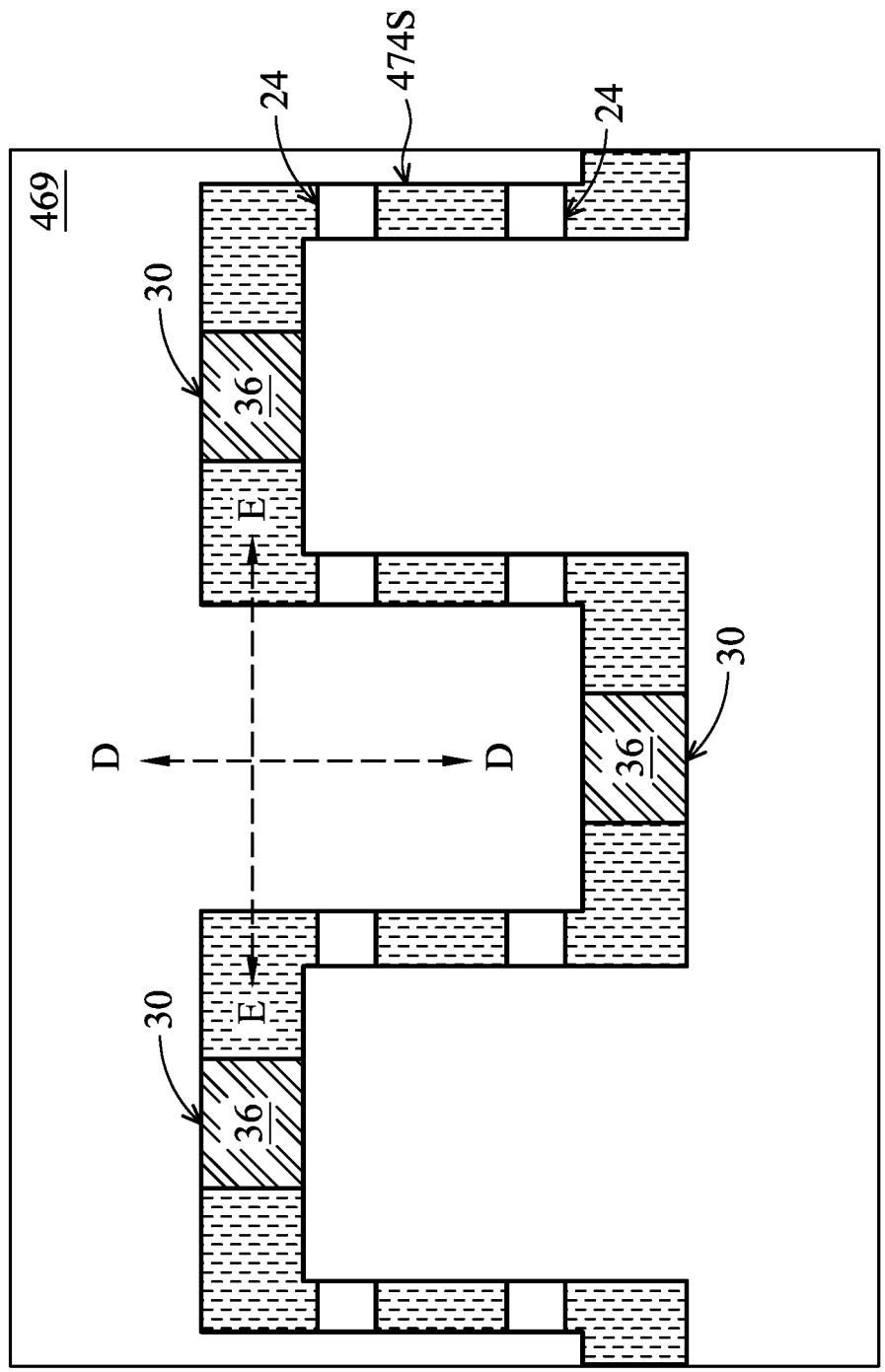
Figure 26C:
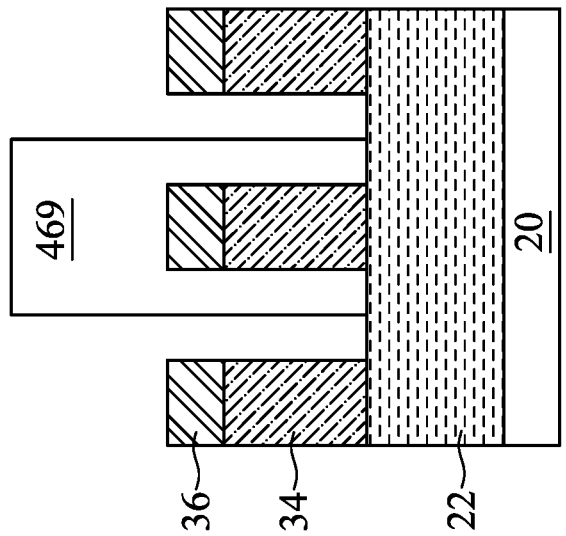
Figure 26B:
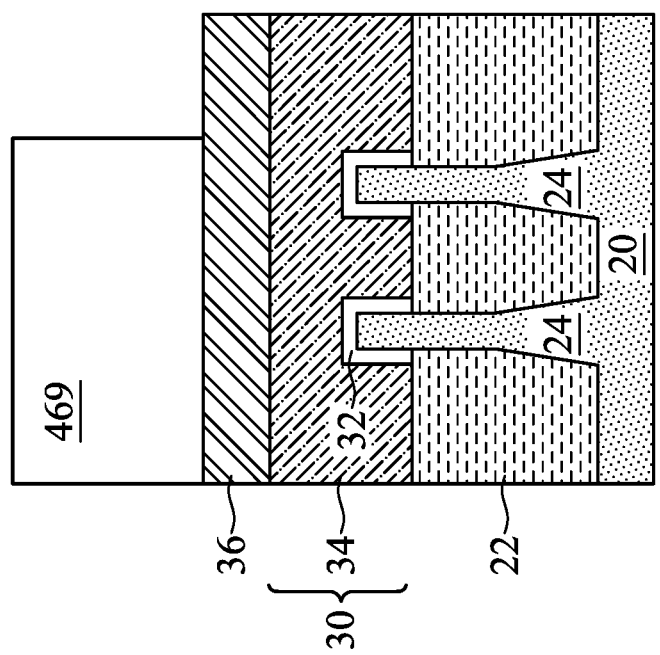

In FIGS. 26A-C, a photoresist structure 469 is formed and patterned to have an opening in a serpentine pattern 474S. The photoresist structure 469 may be similar to the photoresist structure 69 shown in FIGS. 4A-C, and may be formed in a similar manner. As shown in FIG. 26A, the serpentine pattern 474S includes sections that may be approximately orthogonal to each other, similar to the serpentine portion 74S shown in FIGS. 4A-C and the serpentine pattern 274S shown in FIG. 16A. The serpentine pattern 474S exposes regions of the mask layer 36 where cut regions 411 (see FIGS. 27A-C) are to be formed. The serpentine pattern 474S may be formed in the photoresist structure 469 using suitable photolithographic techniques.

Figure 27A:
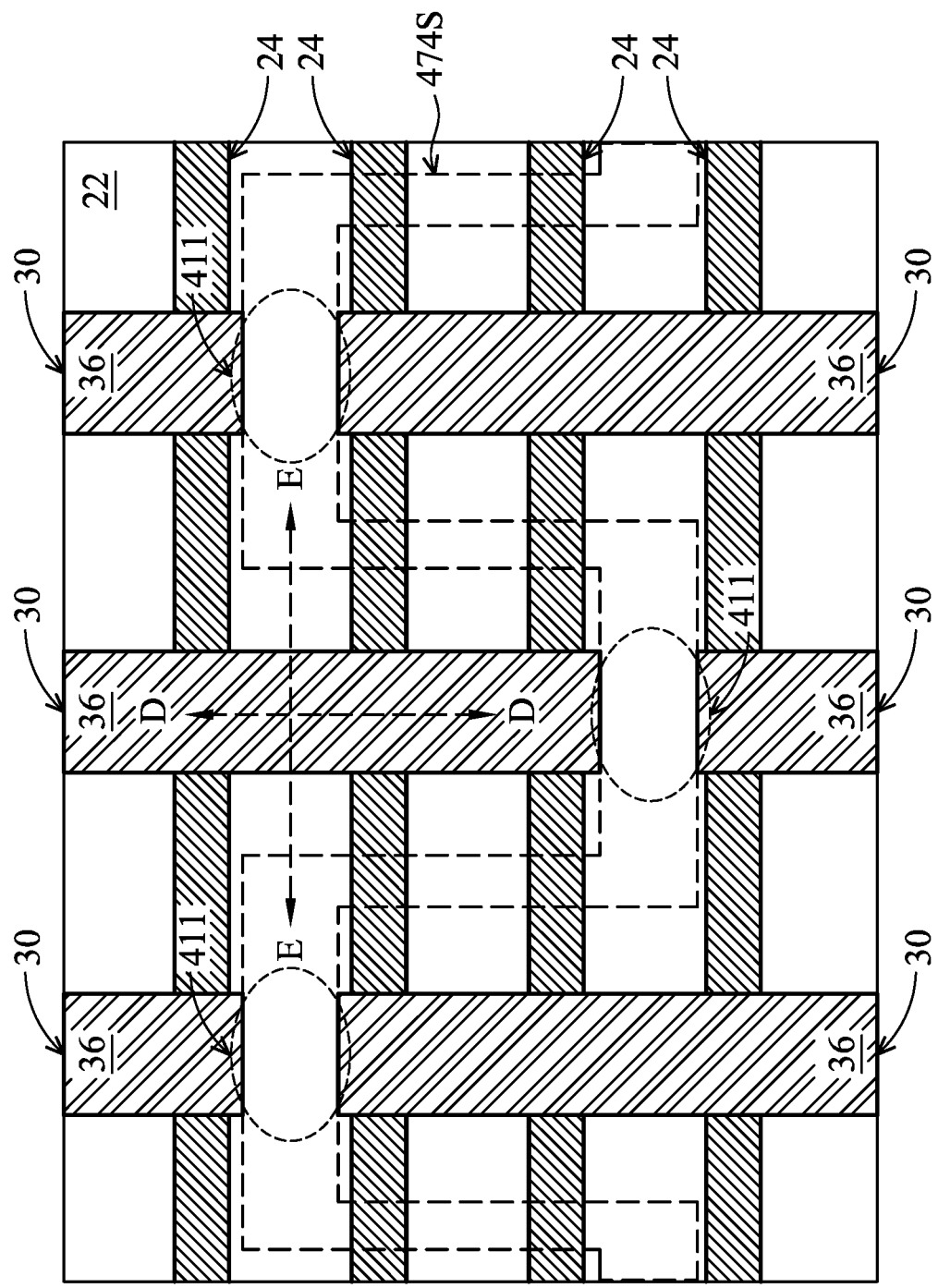
Figure 27C:
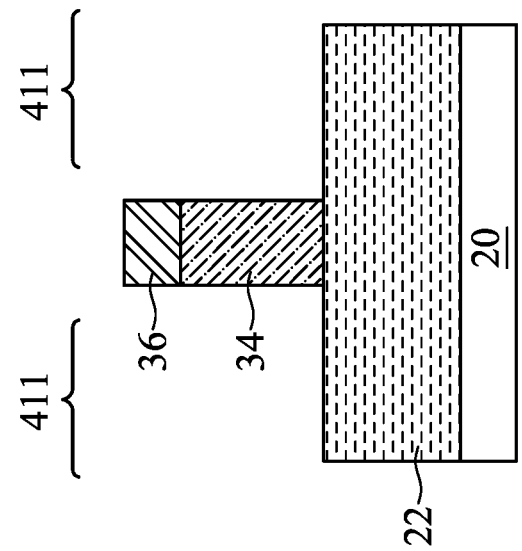
Figure 27B:
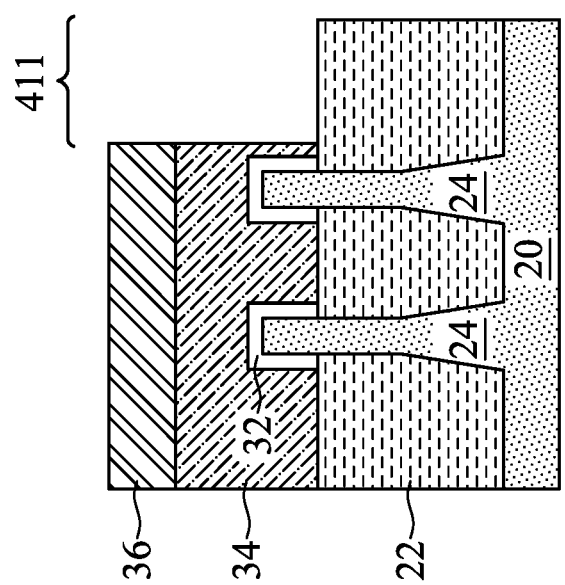

In FIGS. 27A-C, an etching process is performed using the patterned photoresist structure 469 as an etching mask to etch the mask layer 36 and the dummy gate stacks 30, forming cut regions 411. In some embodiments, the etching process may selectively etch the mask layer 36 and the dummy gate stacks 30 over etching the STI regions 22, as shown in FIGS. 27B-C. The etching process may include one or more suitable etching processes, such as dry etching process and/or wet etching processes. The cut regions 411 are regions where the dummy gate stacks 30 have been removed, and are defined by the serpentine pattern 474S. By forming cut regions 411 between dummy gate stacks 430 using a serpentine pattern 474S with approximately orthogonal sections, rounding can be reduced, which can decrease the separation distance between cut regions 411 without increasing the risk of process defects.

FIGS. 28A through 31C illustrate the formation of cut regions 511 in the replacement gate stacks 60 (e.g., in the gate dielectric layers 52 and gate electrodes 56), in accordance with some embodiments. FIGS. 28A, 29A, 30A, and 31A show a plan view of a wafer 500. FIGS. 28B, 29B, 30B, and 31B illustrate a cross-sectional view along the reference cross-section D-D indicated in FIG. 28A, which also corresponds to the reference cross-section D-D indicated in FIG. 1A. FIGS. 28C, 29C, 30C, and 31C illustrate a cross-sectional view along the reference cross-section E-E indicated in FIG. 28A, which also corresponds to the reference cross-section E-E indicated in FIG. 1A. Reference cross-section E-E is parallel to the longitudinal direction of the fins 24 (indicated in FIG. 28A by dashed outlines) but is located between the fins 24.

Figure 28A:
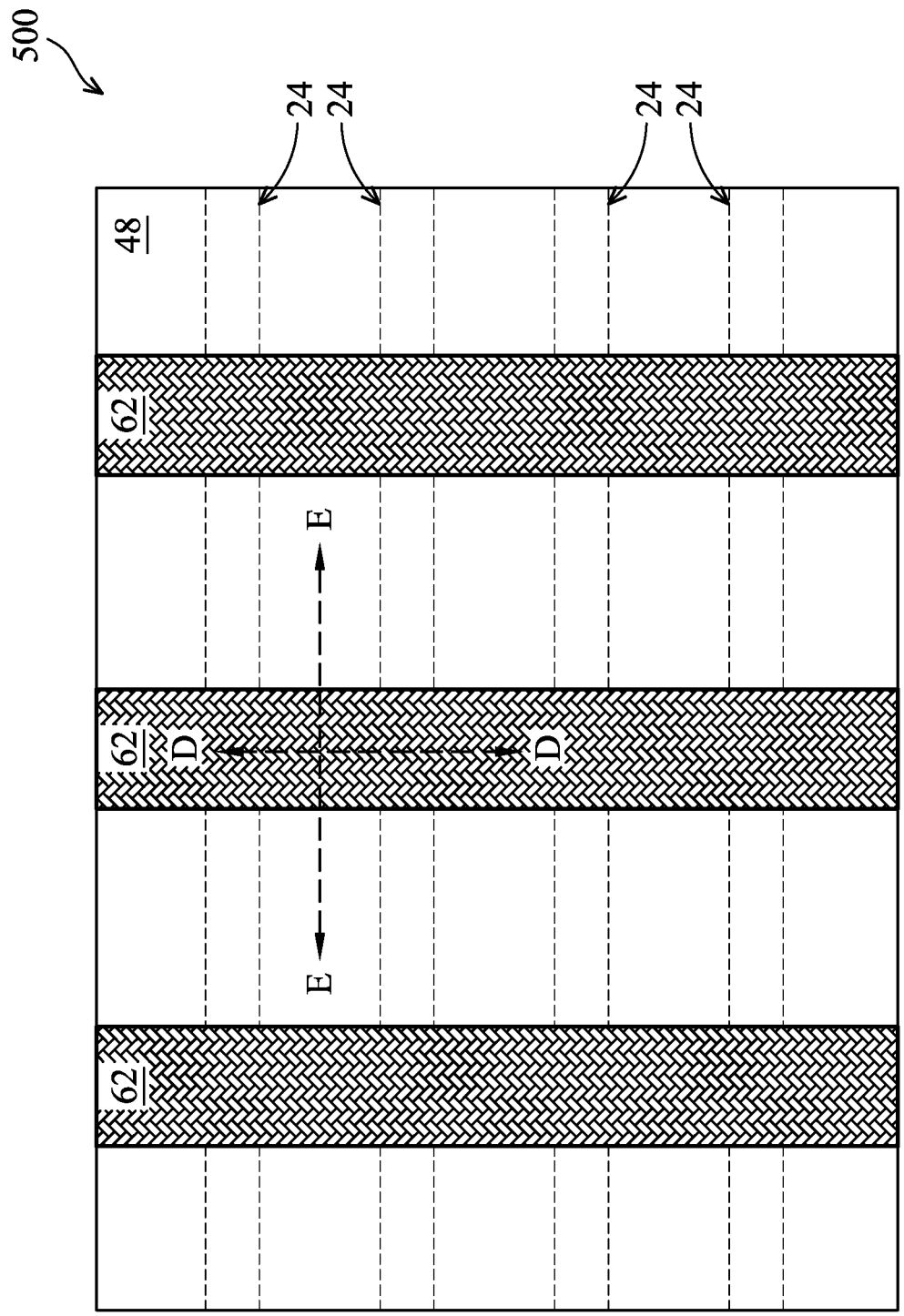
FIGS. 28A, 28B, 28C, 29A, 29B, 29C, 30A, 30B, 30C, 31A, 31B, and 31C illustrate cross-sectional views and plan views of intermediate stages in the formation of cut regions in the gate stacks of a FinFET device, in accordance with some embodiments.
Figure 28C:
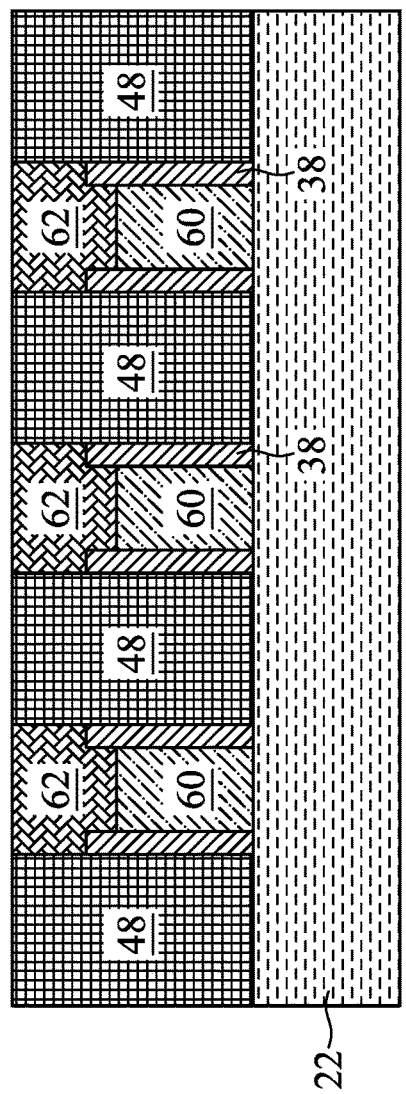
Figure 28B:
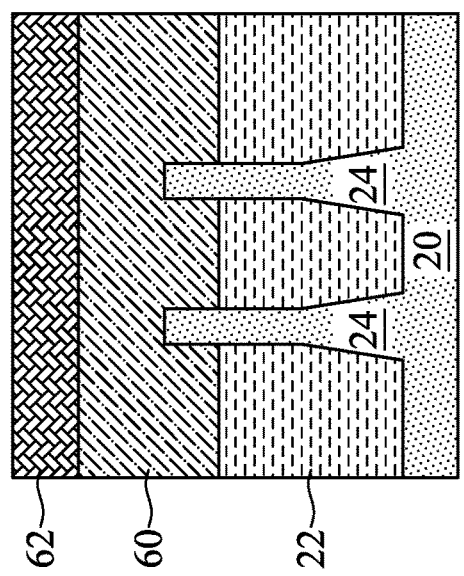

FIGS. 28A-C show the wafer 500 with replacement gate stacks 60 formed over the fins 24 and separated by regions of the first ILD 48. The replacement gate stacks 60 have gate dielectric layers 52 and gate electrodes 56 (not shown separately in the Figures), with gate spacers 38 along sidewalls and covered by hard masks 62. The structure shown in FIGS. 28A-C is similar to the structure described for FIGS. 2A-C, except that the CESL 46 is not depicted in FIGS. 28A-C for clarity reasons. The structure shown in FIGS. 28A-C may be formed in a manner similar to that described for FIGS. 2A-C.

Figure 29A:
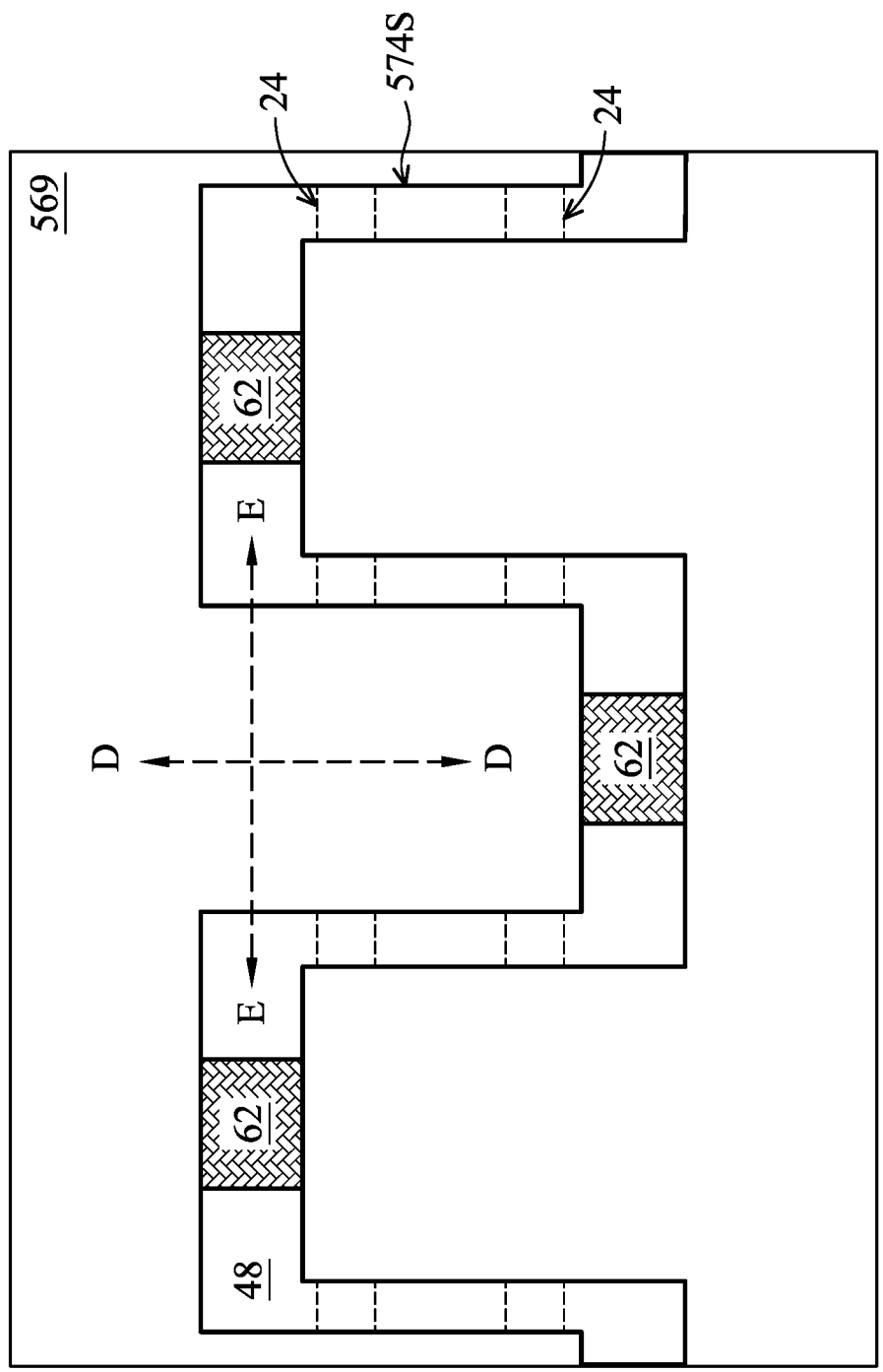
Figure 29C:
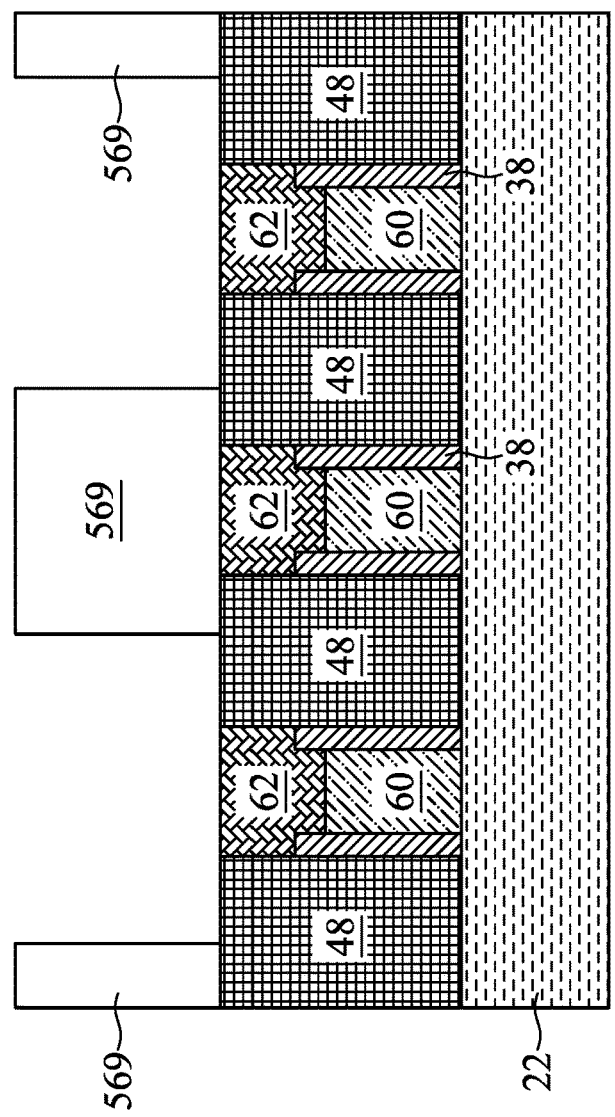
Figure 29B:
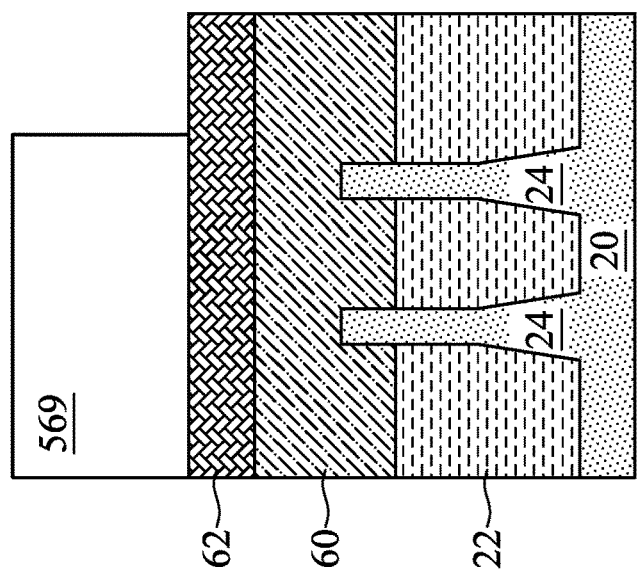

In FIGS. 29A-C, a photoresist structure 569 is formed and patterned to have an opening in a serpentine pattern 574S. The photoresist structure 469 may be similar to the photoresist structure 69 shown in FIGS. 4A-C, and may be formed in a similar manner. As shown in FIG. 29A, the serpentine pattern 574S includes sections that may be approximately orthogonal to each other, similar to the serpentine portion 74S shown in FIGS. 4A-C and the serpentine pattern 274S shown in FIG. 16A. The serpentine pattern 574S exposes regions of the hard masks 62 where cut regions 511 (see FIGS. 30A-C) are to be formed. The serpentine pattern 574S may be formed in the photoresist structure 569 using suitable photolithographic techniques.

Figure 30A:
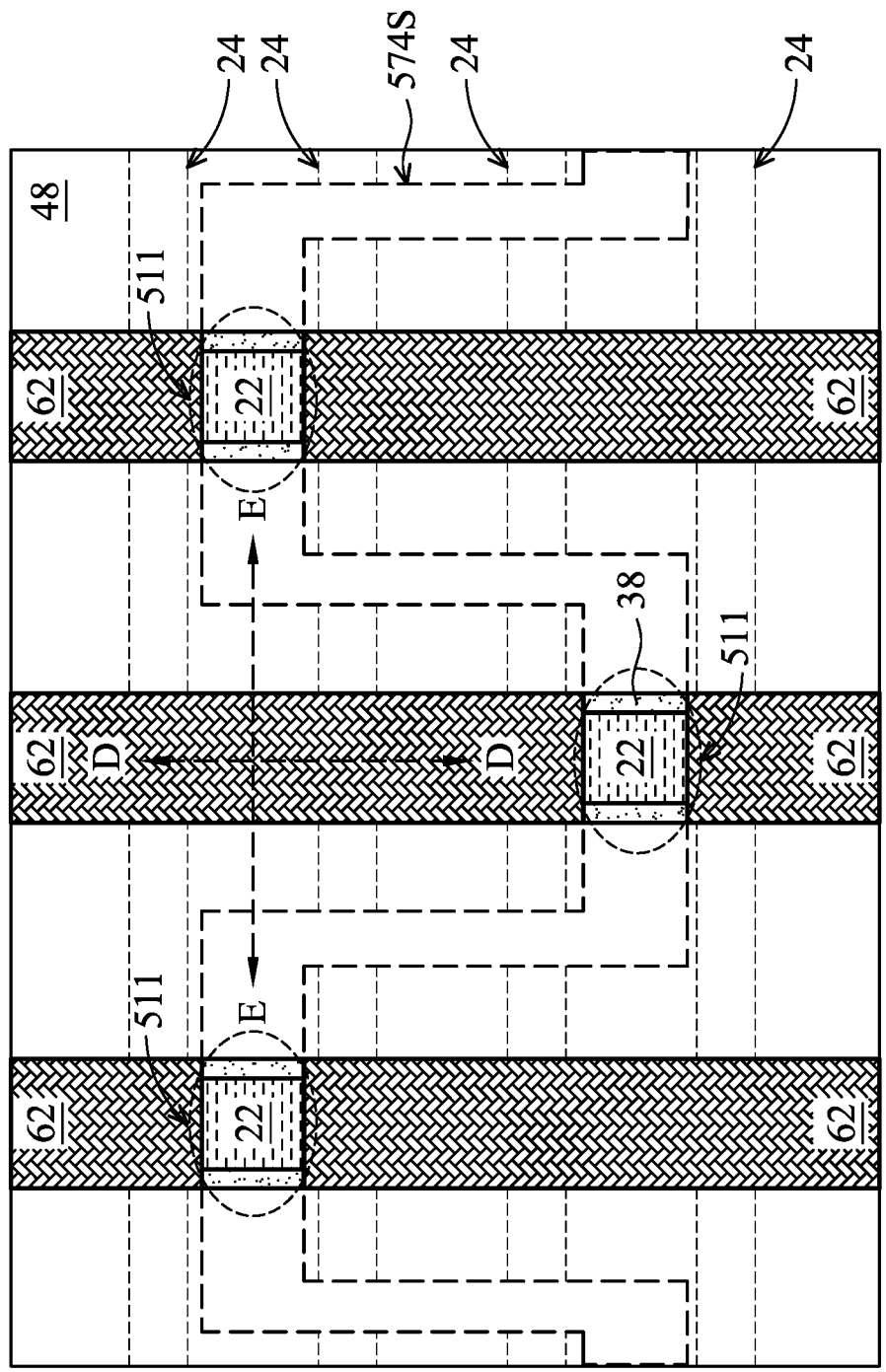
Figures 30B, 30C:
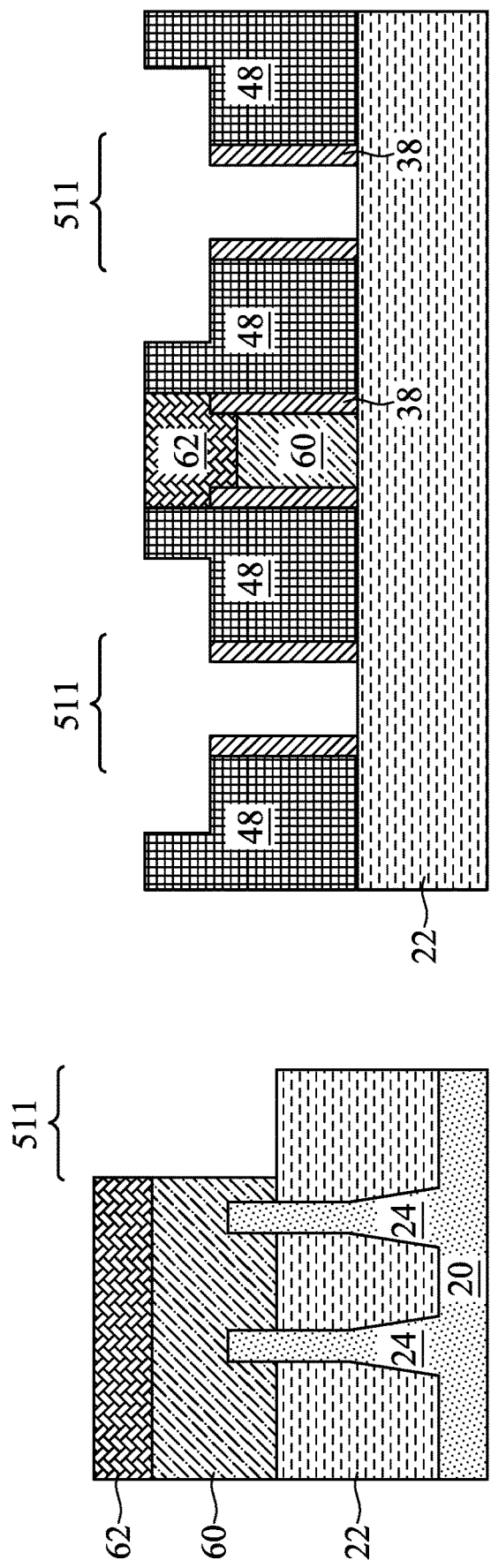

In FIGS. 30A-C, an etching process is performed using the patterned photoresist structure 569 as an etching mask to etch the hard masks 62 and the replacement gate stacks 60, forming cut regions 511. As shown in FIG. 30C, the first ILD 48 and/or the gate spacers 38 may also be partially etched in some embodiments. In some embodiments, the etching process may selectively etch the hard masks 62 and the replacement gate stacks 60 over etching the first ILD 48 and/or the gate spacers 38. The etching process may include one or more suitable etching processes, such as dry etching process and/or wet etching processes. The cut regions 511 are regions where the replacement gate stacks 60 have been removed, and are defined by the serpentine pattern 574S.

Figure 31A:
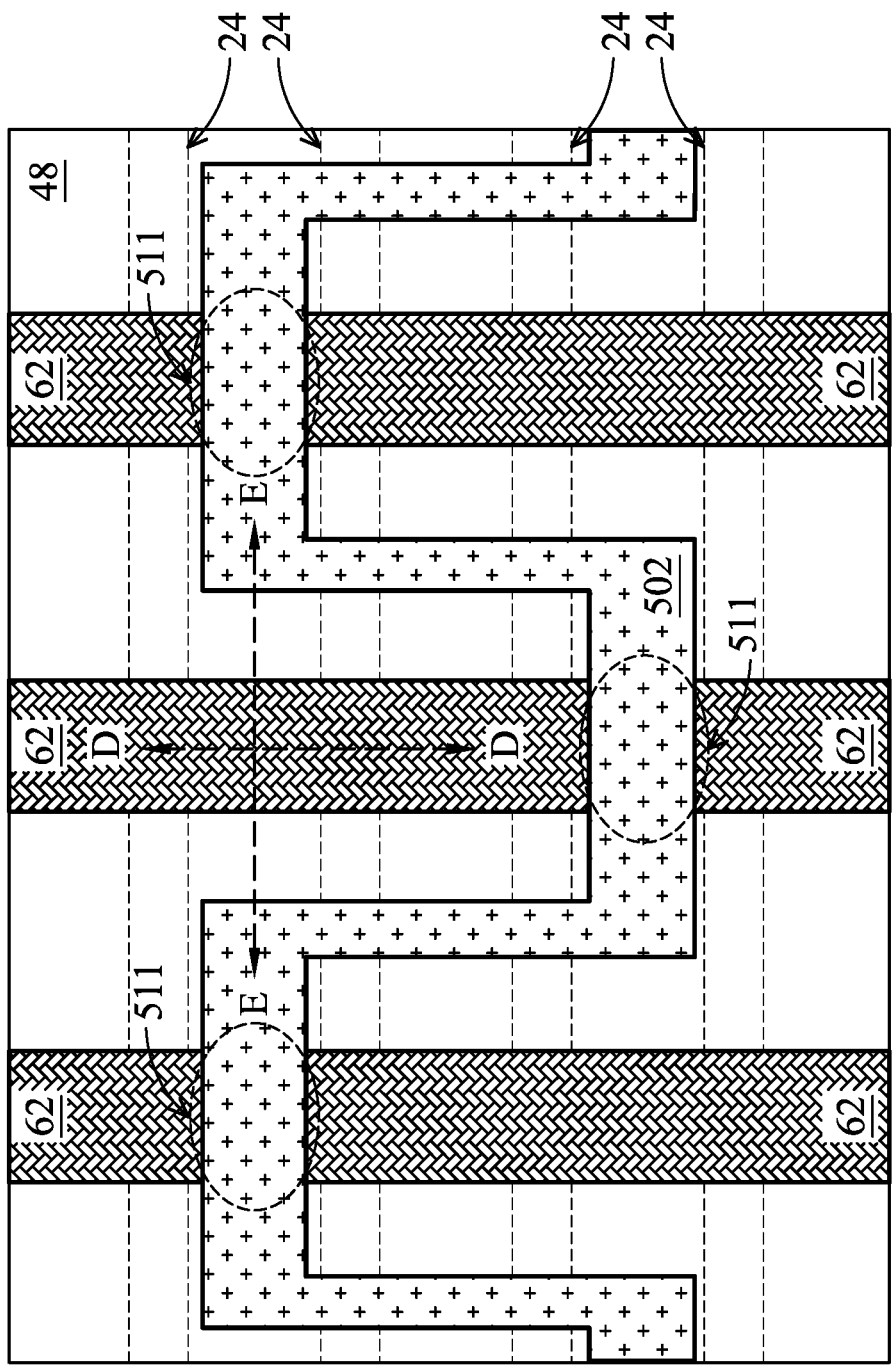
Figure 31C:
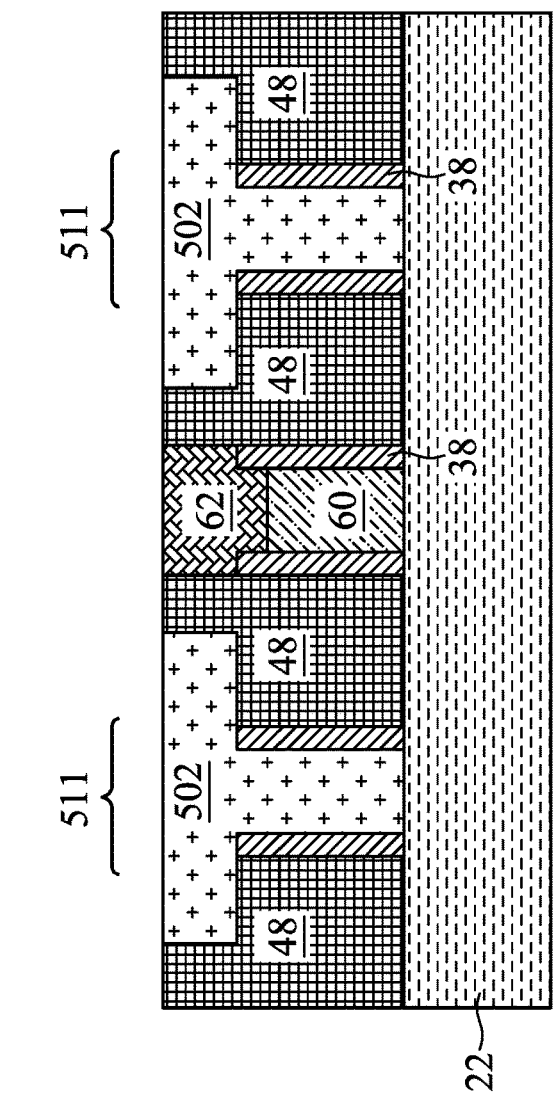
Figure 31B:
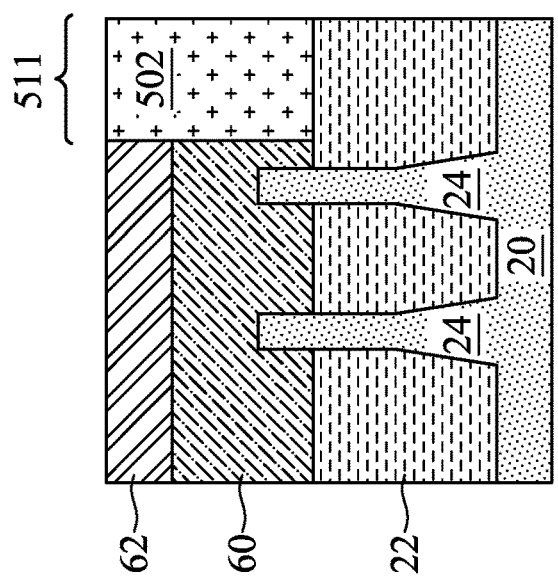
Figure 32A:
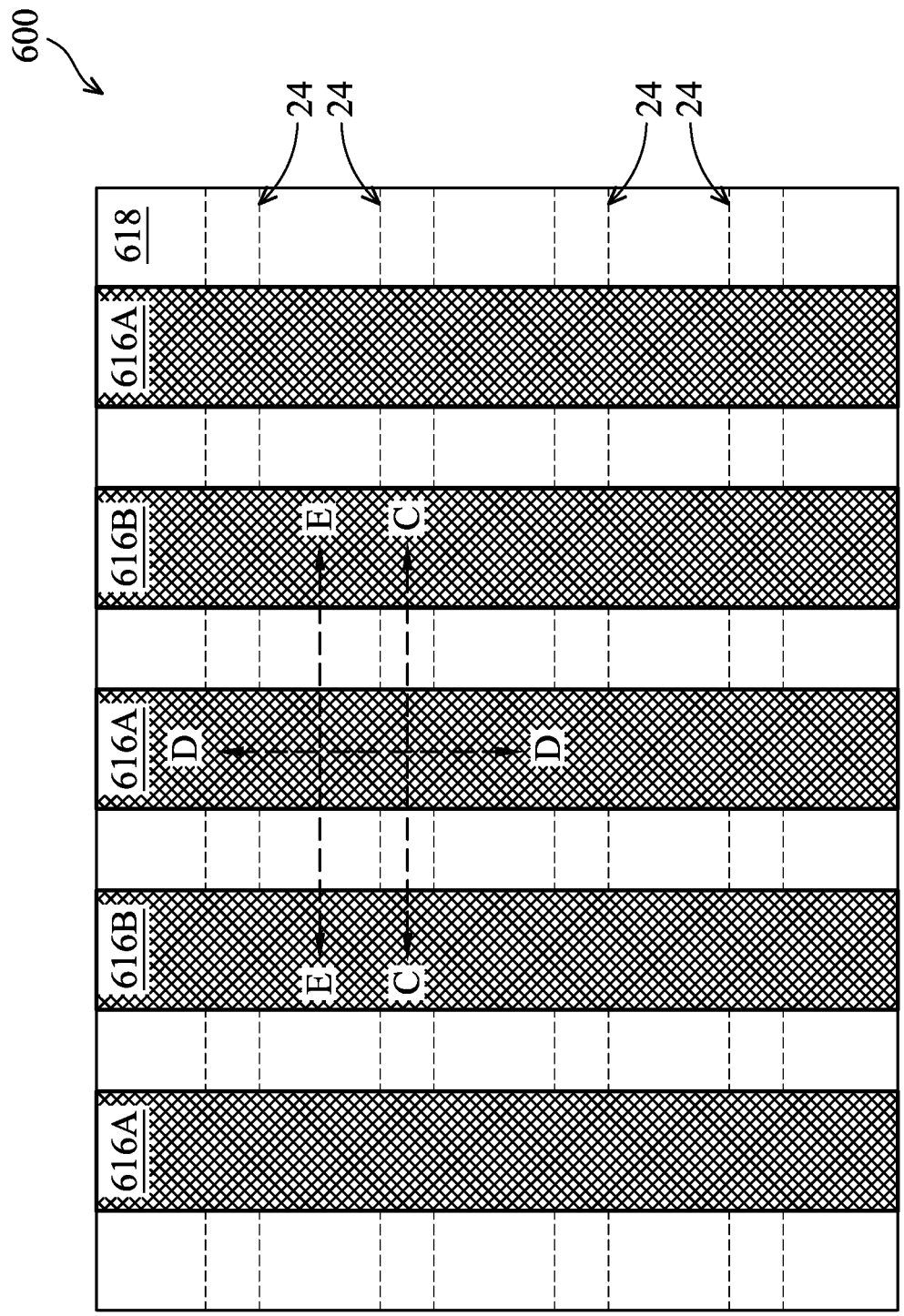
FIGS. 32A, 32B, 32C, 32D, 33A, 33B, 33C, 34A, 34B, 34C, 35A, 35B, and 35C illustrate cross-sectional views and plan views of intermediate stages in the formation of cut regions in the metal lines of a FinFET device, in accordance with some embodiments.
Figure 32C:
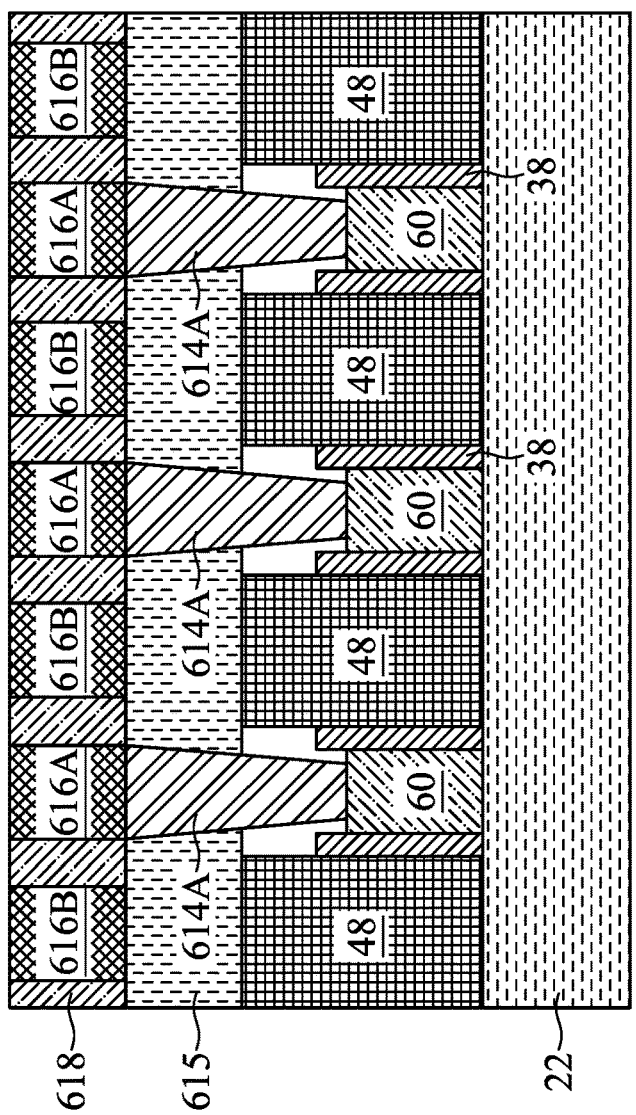
Figure 32B:
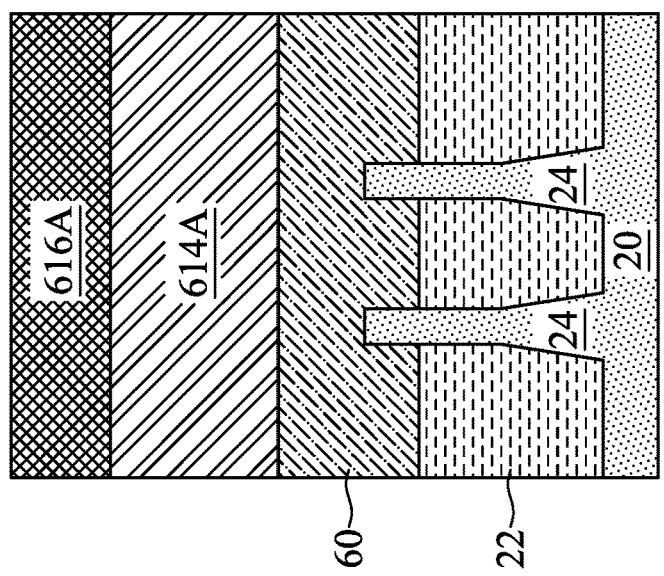
Figure 32D:
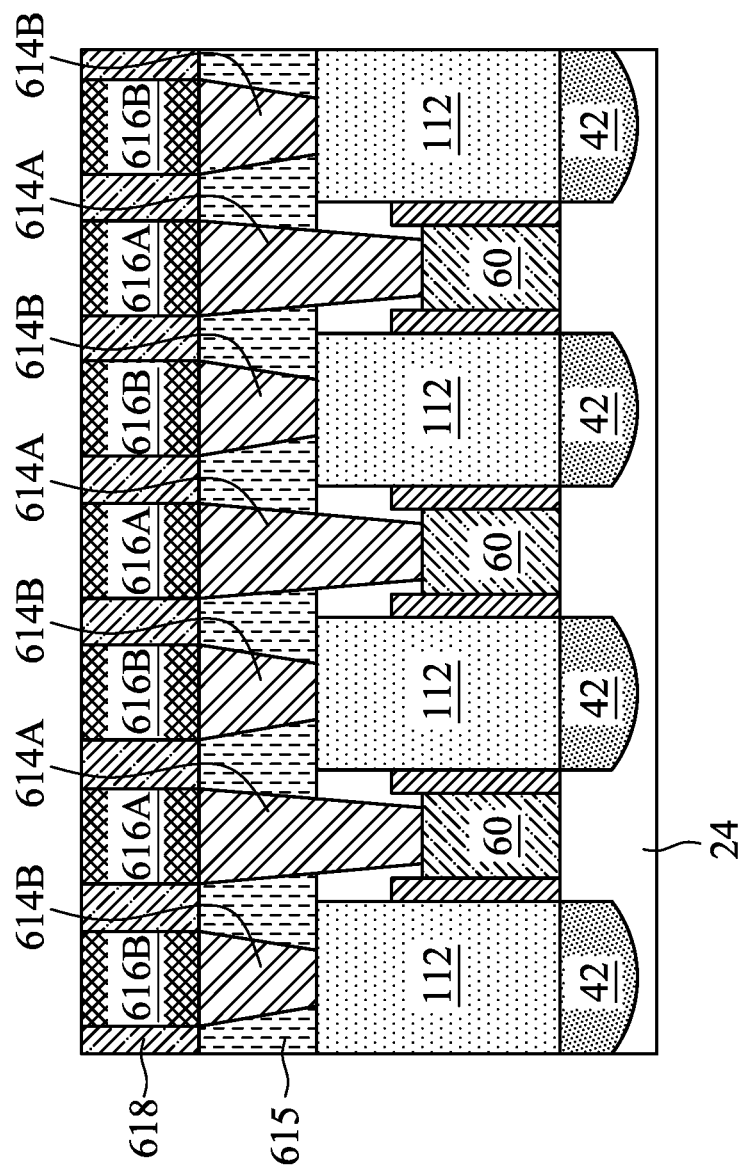

In FIGS. 31A-C, a fill material 502 is deposited over the wafer 500 and within the cut regions 511. The fill material 502 may include one or more suitable dielectric materials, such as an oxide, a nitride, the like, or a combination thereof. The fill material 502 may be deposited using suitable processes. In some embodiments, an etch back process and/or a planarization process (e.g., a CMP or grinding process) is performed after deposition of the fill material 502, as shown in FIGS. 31A-C. By forming cut regions 511 between replacement gate stacks 60 using a serpentine pattern 574S with approximately orthogonal sections, rounding can be reduced, which can decrease the separation distance between cut regions 511 without increasing the risk of process defects.

FIGS. 32A through 35C illustrate the formation of cut regions 611 in metal lines 616, in accordance with some embodiments. FIGS. 32A, 33A, 34A, and 35A show a plan view of a wafer 600. FIGS. 32B, 33B, 34B, and 35B illustrate a cross-sectional view along the reference cross-section D-D indicated in FIG. 32A, which also corresponds to the reference cross-section D-D indicated in FIG. 1A. FIGS. 32C, 33C, 34C, and 35C illustrate a cross-sectional view along the reference cross-section E-E indicated in FIG. 32A, which also corresponds to the reference cross-section E-E indicated in FIG. 1A. Reference cross-section E-E is parallel to the longitudinal direction of the fins 24 (indicated in FIG. 32A by dashed outlines) but is located between the fins 24. FIG. 32D illustrates a cross-sectional view along the reference cross-section C-C indicated in FIG. 32A, which also corresponds to the reference cross-section C-C indicated in FIG. 1A.

FIGS. 32A-D show the wafer 600 with vias 614A-B and metal lines 616A-B formed over the gate stacks 60 and the source/drain contacts 112. The vias 614A contact the gate stacks 60, and the vias 614B contact the source/drain contacts 112. The metal lines 616A contact the vias 614A, and the metal lines 616B contact the vias 614B. In some embodiments, the vias 614A-B are formed by depositing a second ILD 615 over the structure shown in FIGS. 11A-C and then forming the vias 614A-B through openings in the second ILD 615. The second ILD 615 may be formed of a suitable dielectric material and may be deposited using a suitable process. The second ILD 615 may be similar to the first ILD 108. Openings for the vias 614A are formed through the second ILD 615 and the hard masks 62, and openings for the vias 614B are formed through the second ILD 615. The openings may be formed using one or more suitable photolithography and etching processes. A conductive material may be deposited in the openings to form the vias 614A-B. The conductive material may include a liner, which is not separately shown in the Figures. Although shown as being formed in the same cross-sections, it should be appreciated that each of the vias 614A and vias 614B may be formed in different cross-sections.

An Inter-Metal Dielectric (IMD) 618 may then be deposited over the second ILD 615 and the vias 614A-B. The IMD 618 may be a suitable dielectric layer formed using a suitable deposition process. Openings may then be patterned in the IMD 618 that expose the vias 614A-B, and conductive material deposited in the openings to form the metal lines 616A-B. The conductive material may include a liner, which is not separately shown in the Figures. The process described above for forming the vias 614A-B and metal lines 616A-B is an example, and other processes are possible.

Figure 33A:
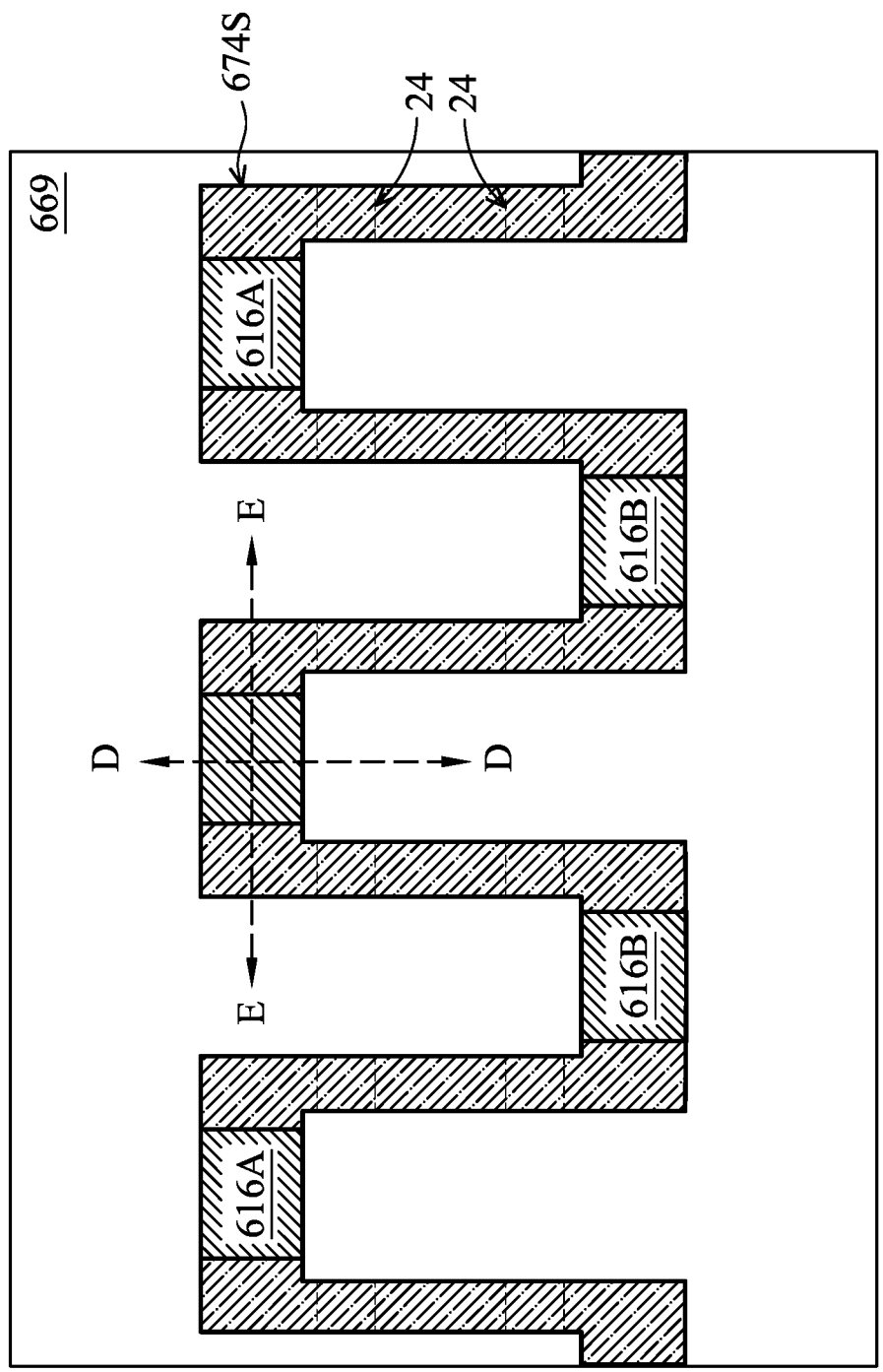
Figure 33C:
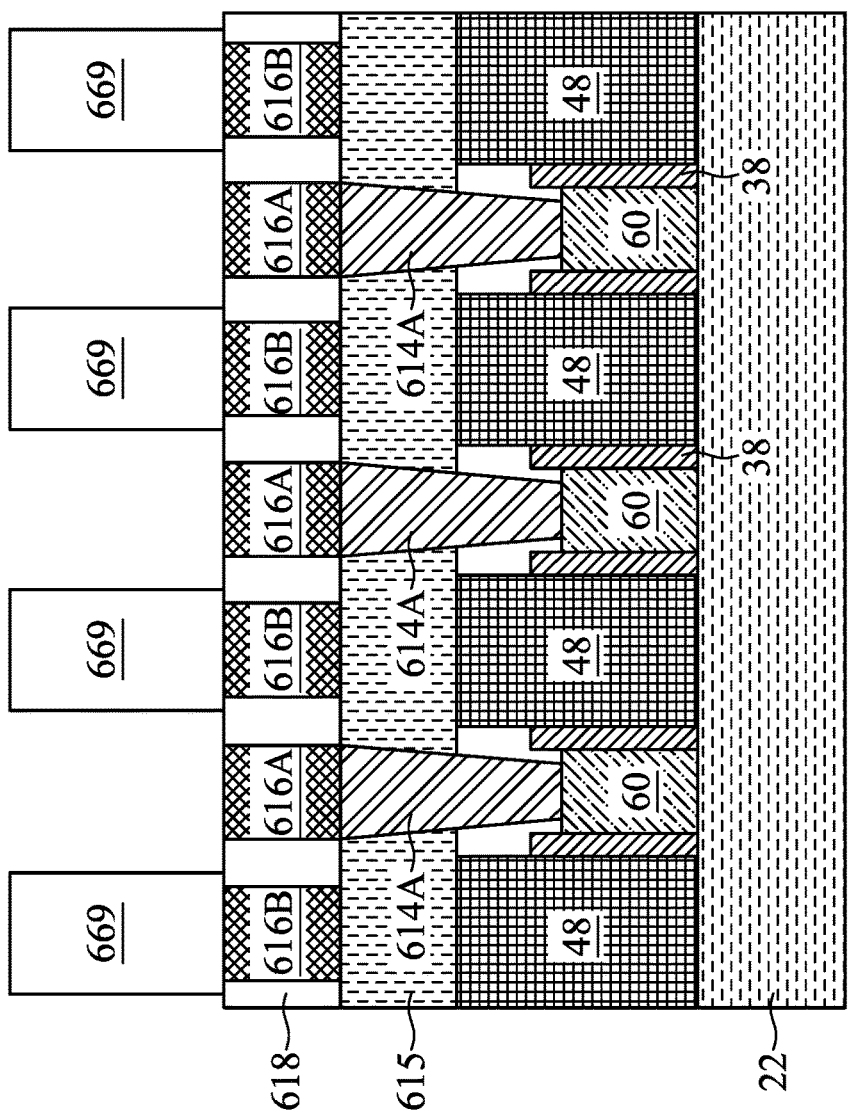
Figure 33B:
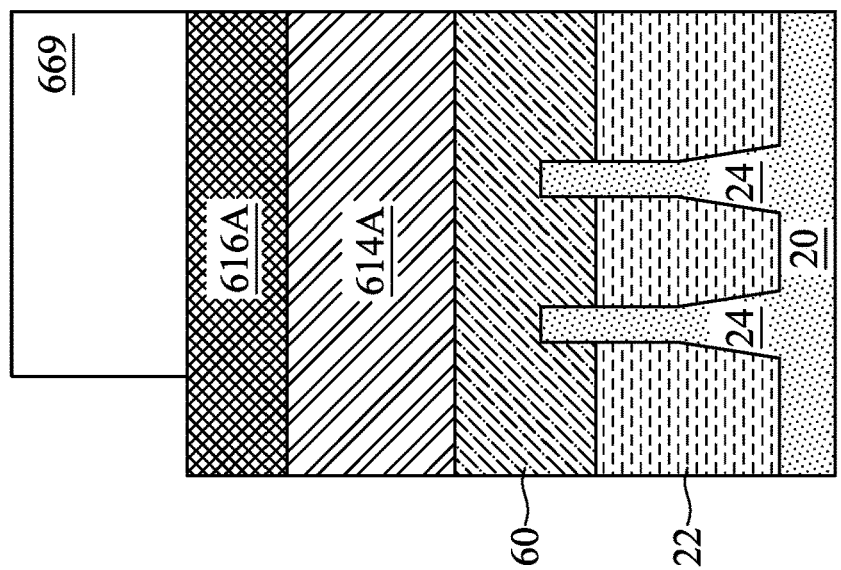

In FIGS. 33A-C, a photoresist structure 669 is formed and patterned to have an opening in a serpentine pattern 674S. The photoresist structure 669 may be similar to the photoresist structure 69 shown in FIGS. 4A-C, and may be formed in a similar manner. As shown in FIG. 33A, the serpentine pattern 674S includes sections that may be approximately orthogonal to each other, similar to the serpentine portion 74S shown in FIGS. 4A-C and the serpentine pattern 274S shown in FIG. 16A. The serpentine pattern 674S exposes regions of the metal lines 616B where cut regions 611 (see FIGS. 34A-C) are to be formed. The serpentine pattern 674S may be formed in the photoresist structure 669 using suitable photolithographic techniques.

Figure 34A:
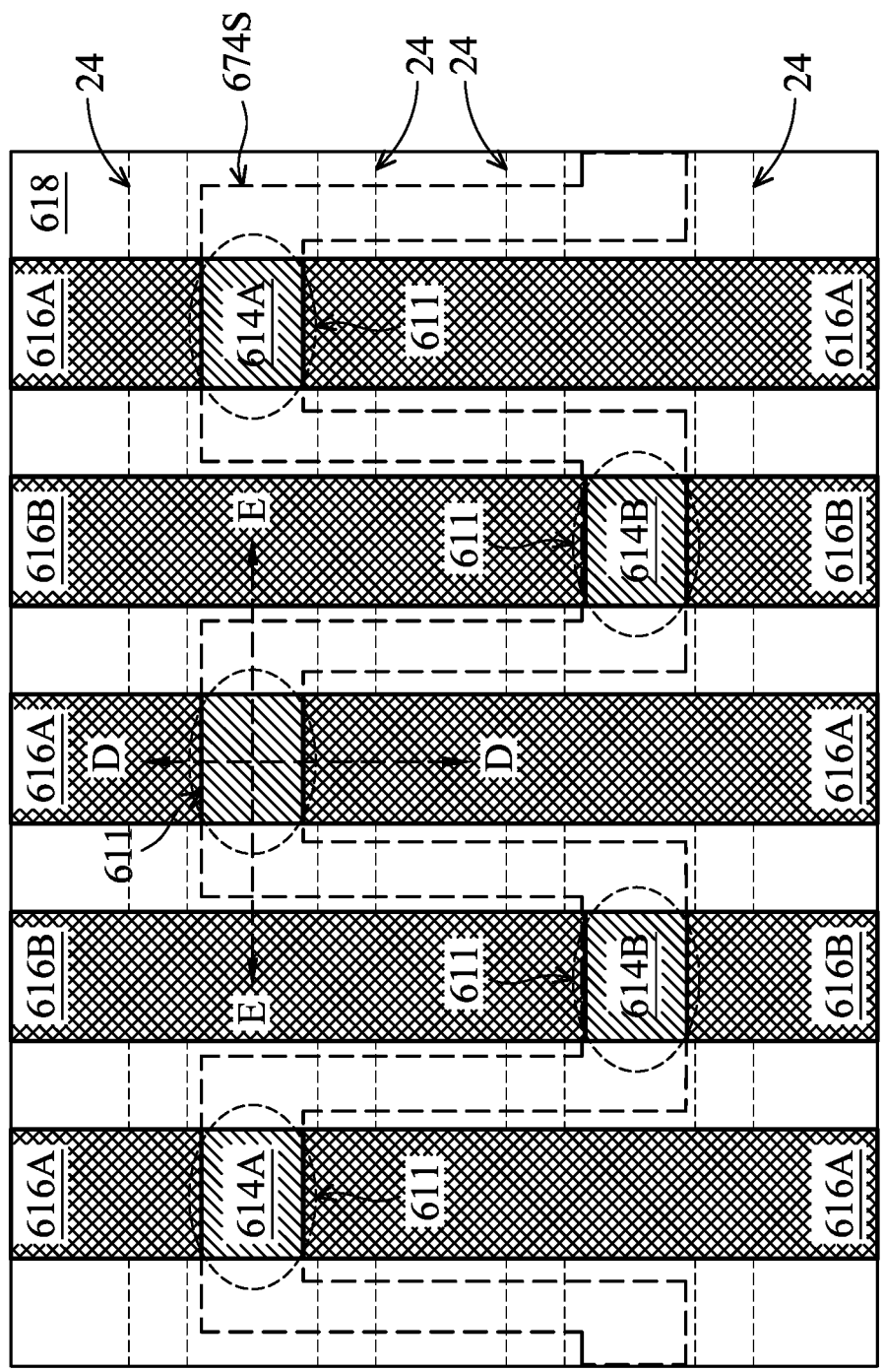
Figure 34C:
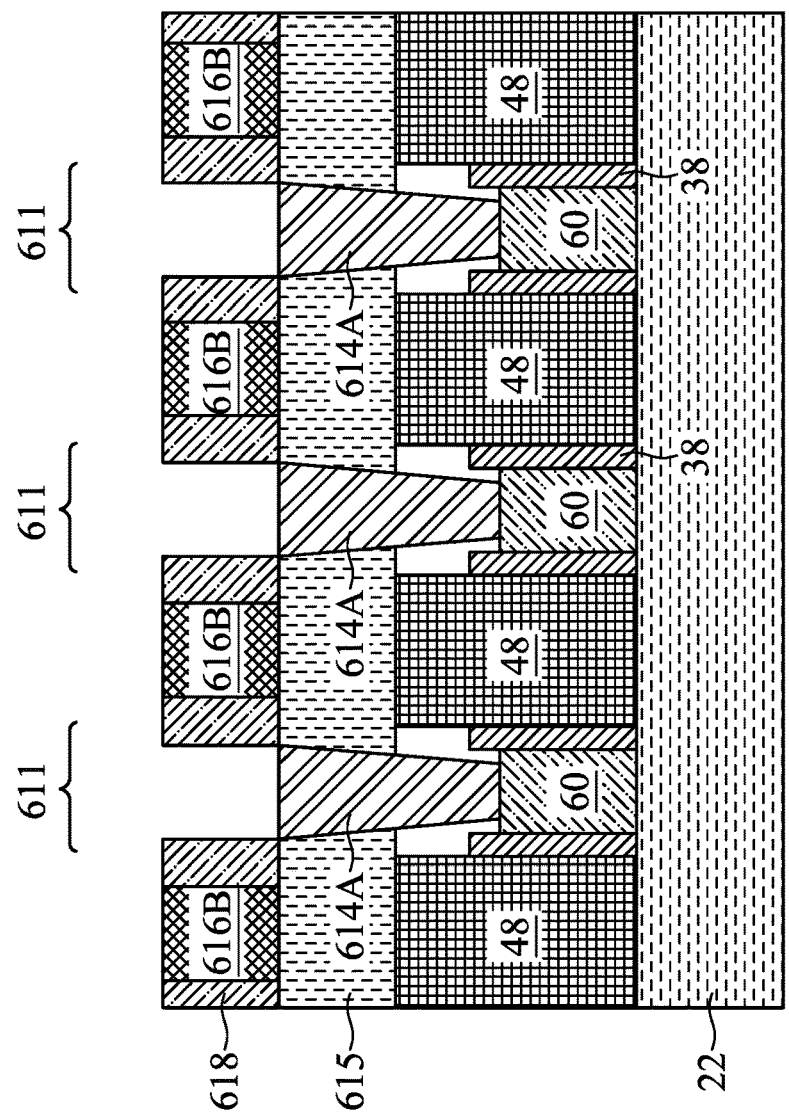
Figure 34B:
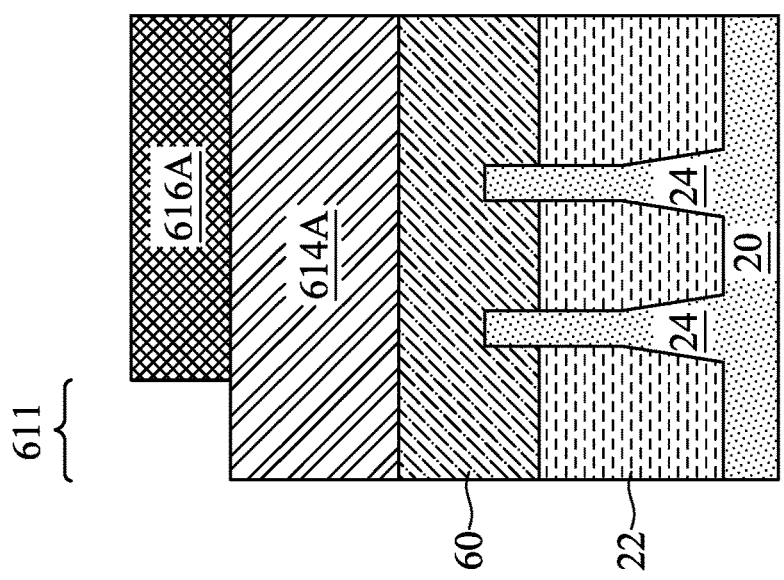

In FIGS. 34A-C, an etching process is performed using the patterned photoresist structure 669 as an etching mask to etch the metal lines 616A-B, forming cut regions 611. In some embodiments, the etching process may selectively etch the metal lines 616A-B over etching the IMD 618 and/or the second ILD 615. The etching process may include one or more suitable etching processes, such as dry etching process and/or wet etching processes. The cut regions 611 are regions where the metal lines 616A-B have been removed, and are defined by the serpentine pattern 674S.

Figure 35A:
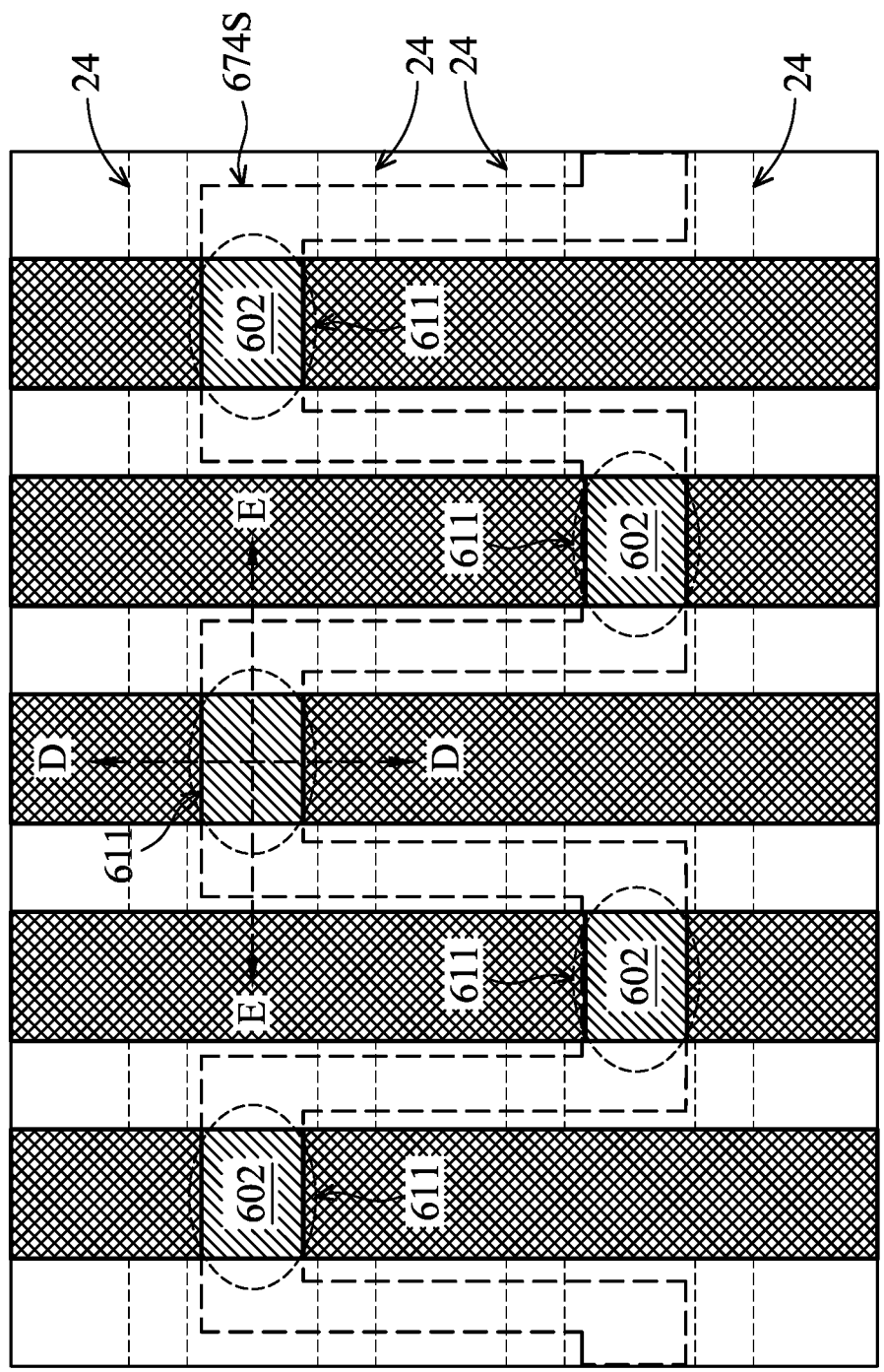
Figure 35C:
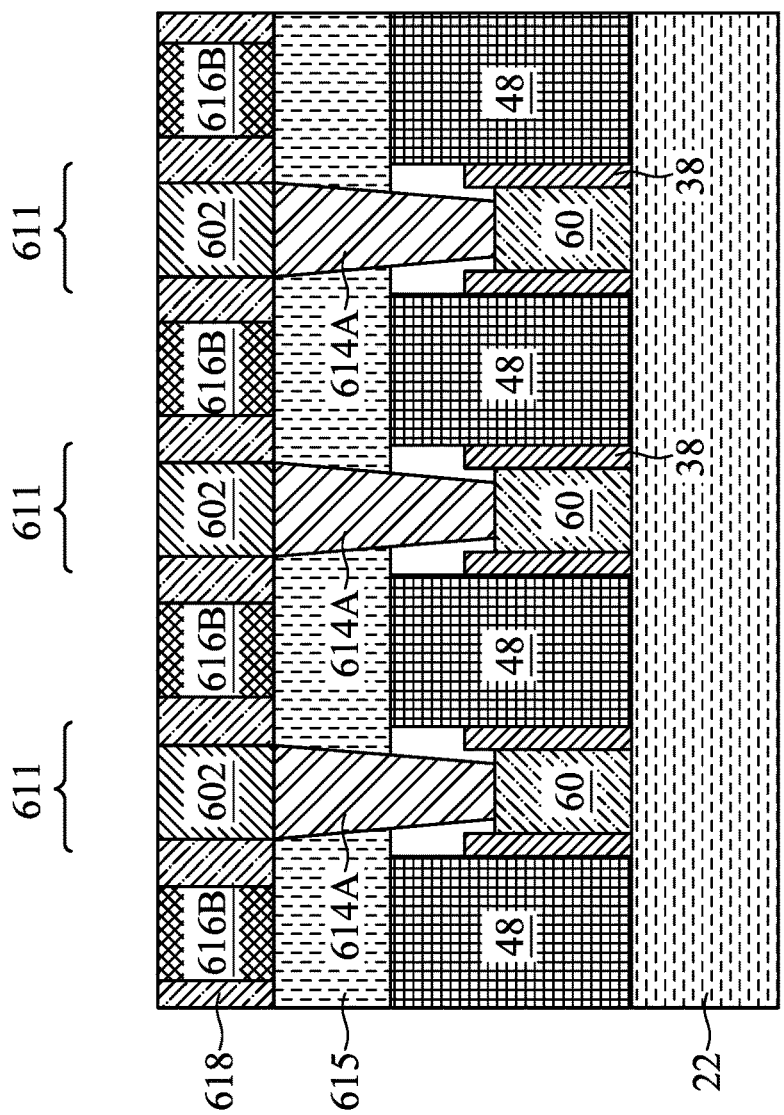
Figure 35B:
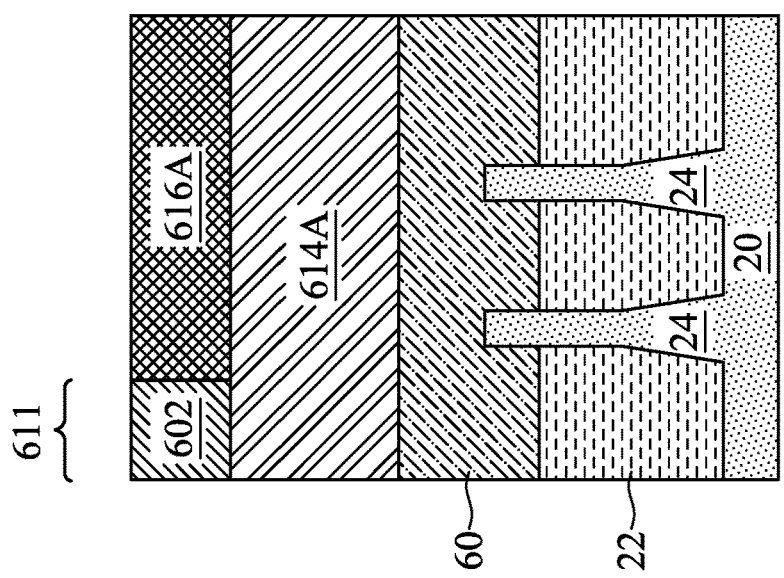

In FIGS. 35A-C, a fill material 602 is deposited over the wafer 600 and within the cut regions 611. The fill material 602 may include one or more suitable dielectric materials, such as an oxide, a nitride, the like, or a combination thereof. The fill material 602 may be deposited using suitable processes. In some embodiments, an etch back process and/or a planarization process (e.g., a CMP or grinding process) is performed after deposition of the fill material 602, as shown in FIGS. 35A-C. By forming cut regions 611 between replacement gate stacks 60 using a serpentine pattern 674S with approximately orthogonal sections, rounding can be reduced, which can decrease the separation distance between cut regions 611 without increasing the risk of process defects.

Embodiments may achieve advantages. The techniques described can allow the formation of source/drain contacts having smaller cuts and more closely spaced cuts without an increased risk of bridging or shorting. In particular, a cut mask having a serpentine pattern comprising approximately orthogonal sections may be used. For example, the serpentine pattern may have straight sections that have an angle between them greater than about 60°. In particular, using a serpentine cut mask as described herein to form the cuts can reduce rounding during photolithographic steps, and can thus allow for smaller cuts. By forming smaller cuts, the size of the source/drain contacts may be increased, which can improve conductivity and reduce contact resistance. The techniques described herein can also allow for the closer spacing of cuts without increased risk of bridging or other process defects. Additionally, the window for process overlap during formation of the cuts may be increased, which improves process reliability and yield.

In some embodiments, a method includes forming fins extending over a semiconductor substrate; forming a photoresist structure over the fins; patterning a serpentine cut pattern in the photoresist structure to form a cut mask, wherein the serpentine cut pattern extends over the fins, wherein the serpentine cut pattern includes alternating bridge regions and cut regions, wherein each cut region extends in a first direction, wherein each bridge region extends between adjacent cut regions in a second direction, wherein the second direction is within 30° of being orthogonal to the first direction; and performing an etching process using the cut mask as an etching mask. In an embodiment, the etching process removes the fins in cut regions, and the cut regions are defined by an opening in the cut mask corresponding to the serpentine cut pattern. In an embodiment, the method includes forming an isolation region surrounding the fins, wherein the photoresist structure is formed over the isolation region. In an embodiment, the method includes forming gate stacks extending over the fins; forming source/drain regions in the fins, wherein the source/drain regions are adjacent the gate stacks; and forming an insulating layer over the fins and surrounding the gate stacks, wherein the photoresist structure is formed over the insulating layer and over the gate stacks. In an embodiment, the etching process etches the insulating layer to expose the source/drain regions. In an embodiment, the etching process removes the gate stacks in cut regions, wherein the cut regions are defined by an opening in the cut mask corresponding to the serpentine cut pattern. In an embodiment, the method includes, after performing the etching process, replacing the gate stacks with replacement gate stacks. In an embodiment, the method includes forming a patterned photoresist layer over the cut mask, wherein the etching process also uses the patterned photoresist layer as an etching mask. In an embodiment, the method includes forming metal lines over the fins, wherein the photoresist structure is formed over the metal lines, wherein the etching process removes the metal lines in cut regions, wherein the cut regions are defined by an opening in the cut mask corresponding to the serpentine cut pattern; and depositing a fill material in the cut regions.

In some embodiments, a method includes forming fins protruding from a substrate; forming source/drain regions on the fins; forming an inter-layer dielectric (ILD) over the source/drain regions; and forming source/drain contacts, including forming a mask layer over the ILD; patterning a cut pattern in the mask layer, wherein the cut pattern includes first straight portions and second straight portions, wherein the first straight portions are connected by the second straight portions, wherein the angle between each first straight portion and an adjacent second straight portion connected to that first straight portion is in the range from 90° to 120°; etching openings in the ILD to expose the source/drain regions, wherein the etching uses the patterned mask layer as an etching mask; and depositing conductive material within the openings. In an embodiment, a distance between two first straight portions connected by one second straight portion is less than 16 nm. In an embodiment, each second straight portion extends over at least one fin. In an embodiment, the first straight portions are located between adjacent fins. In an embodiment, each first straight portion includes a straight sidewall that is parallel to a sidewall of a first fin of the fins. In embodiment, a first straight portion includes a concave sidewall opposite the straight sidewall. In an embodiment, the cut pattern includes third straight portions, wherein the third straight portions are separated from the first straight portions and the second straight portions. In an embodiment, the method includes forming a patterned photoresist over the patterned mask layer, wherein the patterned photoresist covers the second straight portions, wherein etching openings in the ILD uses the patterned mask layer and the patterned photoresist as a combined etching mask.

In some embodiments, a device includes fins protruding from a semiconductor substrate, wherein the fins extend in a first direction; a first isolation structure surrounding the fins; and a second isolation structure over the semiconductor substrate and at least partially within the first isolation structure, wherein the second isolation structure includes a contiguous series of first sections and second sections, wherein the first sections extend in a second direction that is orthogonal to the first direction, wherein the second sections extend in third directions that are a first angle with respect to the second direction, wherein the first angle is between 0° and 30°, and wherein adjacent fins are isolated from each other by the first sections. In an embodiment, a distance between two first sections is less than 16 nm. In an embodiment, the second sections are located between adjacent fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a plurality of fins extending over a semiconductor substrate;
   forming a photoresist structure over the plurality of fins;
   patterning a serpentine cut pattern in the photoresist structure to form a cut mask, wherein the serpentine cut pattern extends over the plurality of fins, wherein the serpentine cut pattern comprises alternating bridge regions and cut regions, wherein each cut region extends in a first direction, wherein each bridge region extends between adjacent cut regions in a second direction, wherein the second direction is within 30° of being orthogonal to the first direction, wherein each bridge region has parallel sidewalls; and
   performing an etching process using the cut mask as an etching mask.

2. The method of claim 1, further comprising:
   forming a plurality of gate stacks extending over the plurality of fins;
   forming a plurality of source/drain regions in the plurality of fins, wherein the source/drain regions are adjacent the gate stacks of the plurality of gate stacks; and
   forming an insulating layer over the plurality of fins and surrounding the gate stacks of the plurality of gate stacks, wherein the photoresist structure is formed over the insulating layer and over the plurality of gate stacks.

3. The method of claim 2, wherein the etching process etches the insulating layer to expose surfaces of the plurality of source/drain regions.

4. The method of claim 3 further comprising depositing a conductive material on the exposed surfaces of the plurality of source/drain regions.

5. The method of claim 2, wherein a width of the bridge regions is less than a width of the gate stacks of the plurality of gate stacks.

6. The method of claim 2, wherein at least one cut region extends across a respective source/drain region of the plurality of source/drain regions.

7. The method of claim 1 further comprising forming a patterned photoresist layer over the cut mask, wherein the etching process also uses the patterned photoresist layer as an etching mask.

8. The method of claim 1, wherein at least one bridge region extends across a respective fin of the plurality of fins.

9. The method of claim 1, wherein the plurality of fins extend in the first direction.

10. A method comprising:
    forming a plurality of fins protruding from a substrate;
    forming source/drain regions on the plurality of fins;
    forming an inter-layer dielectric (ILD) over the source/drain regions; and
    forming source/drain contacts, comprising:
        forming a mask layer over the ILD;
        patterning a cut pattern in the mask layer, wherein the cut pattern has a serpentine shape comprising first straight portions and second straight portions, wherein the first straight portions are connected by the second straight portions, wherein each second straight portion has a constant width between its neighboring first straight portions, wherein the angle between each first straight portion and an adjacent second straight portion connected to that first straight portion is in the range from 90° to 120°;
        etching openings in the ILD to expose the source/drain regions, wherein the etching uses the patterned mask layer as an etching mask; and
        depositing conductive material within the openings.

11. The method of claim 10, wherein a distance between two first straight portions connected by one second straight portion is less than 16 nm.

12. The method of claim 10, wherein each second straight portion extends over at least one fin of the plurality of fins.

13. The method of claim 10, wherein the first straight portions are located between adjacent fins of the plurality of fins.

14. The method of claim 10, wherein each first straight portion comprises a straight sidewall that is parallel to a sidewall of a first fin of the plurality of fins.

15. The method of claim 14, wherein a first straight portion comprises a concave sidewall opposite the straight sidewall.

16. The method of claim 10, wherein the cut pattern further comprises third straight portions, wherein the third straight portions are separated from the first straight portions and the second straight portions.

17. The method of claim 10 further comprising forming a patterned photoresist over the patterned mask layer, wherein the patterned photoresist covers the second straight portions, wherein etching openings in the ILD uses the patterned mask layer and the patterned photoresist as a combined etching mask.

18. A method comprising:
    forming a plurality of fins protruding from a semiconductor substrate, wherein the fins extend in a first direction;
    forming a plurality of source/drain regions in the fins of the plurality of fins;
    forming a plurality of gate structures over the plurality of fins, wherein the plurality of gate structures extend in a second direction that is orthogonal to the first direction;
    forming an isolation structure over the plurality of source/drain regions;
    forming a patterned mask over the plurality of gate structures and over the isolation structure, wherein the patterned mask comprises a contiguous series of first sections and second sections, wherein the first sections extend in the first direction, wherein the second sections extend in third directions that are at a first angle with respect to the second direction, wherein the first angle is between 0° and 30°, wherein each first section protrudes in the first direction beyond its neighboring second sections; and
    etching the isolation structure using the patterned mask.

19. The method of claim 18, wherein a distance between two first sections is less than 16 nm.

20. The method of claim 18, wherein the second sections are between respective adjacent source/drain regions of the plurality of source/drain regions.

* * * * *